(12) United States Patent
Koyama

(10) Patent No.: US 8,531,870 B2
(45) Date of Patent: Sep. 10, 2013

(54) SEMICONDUCTOR DEVICE AND DRIVING METHOD OF SEMICONDUCTOR DEVICE

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 81 days.

(21) Appl. No.: 13/192,819

(22) Filed: Jul. 28, 2011

(65) Prior Publication Data

US 2012/0033483 A1    Feb. 9, 2012

(30) Foreign Application Priority Data

Aug. 6, 2010  (JP) .................................. 2010-177056
May 13, 2011  (JP) .................................. 2011-108574

(51) Int. Cl.
*G11C 11/24*       (2006.01)
(52) U.S. Cl.
USPC ............ 365/149; 365/104; 365/150; 365/208
(58) Field of Classification Search
USPC .................. 365/149, 150, 104, 208
See application file for complete search history.

(56) References Cited

U.S. PATENT DOCUMENTS

| | | | | |
|---|---|---|---|---|
| 4,910,709 A | * | 3/1990 | Dhong et al. ................. | 365/149 |
| 5,731,856 A | | 3/1998 | Kim et al. | |
| 5,744,864 A | | 4/1998 | Cillessen et al. | |
| 6,111,778 A | * | 8/2000 | MacDonald et al. ......... | 365/149 |
| 6,127,702 A | | 10/2000 | Yamazaki et al. | |
| 6,294,274 B1 | | 9/2001 | Kawazoe et al. | |
| 6,563,174 B2 | | 5/2003 | Kawasaki et al. | |
| 6,727,522 B1 | | 4/2004 | Kawasaki et al. | |
| 6,804,142 B2 | * | 10/2004 | Forbes .......................... | 365/149 |
| 7,049,190 B2 | | 5/2006 | Takeda et al. | |
| 7,061,014 B2 | | 6/2006 | Hosono et al. | |
| 7,064,346 B2 | | 6/2006 | Kawasaki et al. | |
| 7,105,868 B2 | | 9/2006 | Nause et al. | |
| 7,211,825 B2 | | 5/2007 | Shih et al | |
| 7,230,846 B2 | * | 6/2007 | Keshavarzi et al. ........... | 365/177 |
| 7,282,782 B2 | | 10/2007 | Hoffman et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Pho M Luu
(74) *Attorney, Agent, or Firm* — Fish & Richardson P.C.

(57) ABSTRACT

A memory cell includes a capacitor, a first transistor, and a second transistor whose off-state current is smaller than that of the first transistor. The first transistor has higher switching speed than the second transistor. The first transistor, the second transistor, and the capacitor are electrically connected in series. Accumulation of charge in the capacitor and release of charge from the capacitor are performed through the first transistor and the second transistor. In this manner, the power consumption of the semiconductor device can be reduced and data can be written and read at higher speed.

25 Claims, 33 Drawing Sheets

(56) References Cited

U.S. PATENT DOCUMENTS

| | | | |
|---|---|---|---|
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,961,498 B2 * | 6/2011 | Khalil et al. | 365/149 |
| 7,978,277 B2 | 7/2011 | Kimura | |
| 8,315,099 B2 * | 11/2012 | Van Buskirk et al. | 365/185.18 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0155799 A1 | 6/2010 | Yokoyama | |
| 2011/0147737 A1 | 6/2011 | Yamazaki et al. | |
| 2011/0156028 A1 | 6/2011 | Yamazaki et al. | |
| 2011/0157961 A1 | 6/2011 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-147392 A | 7/2010 |
| WO | 2004/114391 A1 | 12/2004 |

OTHER PUBLICATIONS

Kim, W et al., "An Experimental High-Density DRAM Cell with a Built-in Gain Stage," IEEE Journal of Solid State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductiove oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous IN-GA-ZN-OXIDE TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display, " SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display with Driver Circuit Using Amorphous IN-GA-ZN-OXIDE TFTS," IDW '09 : Proceedings of the 16th International Display Workshops, 2009, pp. 689-692.

Son, K et al., "42.4L: Late-News Paper: 4 inch QVGA AMOLED Driven by the Threshold Voltate Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase", Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous IN-GA-ZN-OXIDE TFT," SID Digest '09 : SID International Symposium Digest of Technical Papers, May 31, 2009, pp. 1110-1112.

Godo, H et al., "Temperature Dependence of Characteristics and Electronic Structure for Amorphous IN-GA-ZN-OXIDE TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High.Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; FE, GA, OR AL; B: MG, MN, FE, NI, CU,OR ZN] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem Oleds," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using IN-GA-ZN-OXIDE TFTS With a Novel Passivation Layer," SID Digest '09 : SID International Symposium Digest of Technical Papers, May 31, 2009, pp. 284-287.

* cited by examiner

FIG. 18A
FIG. 18B
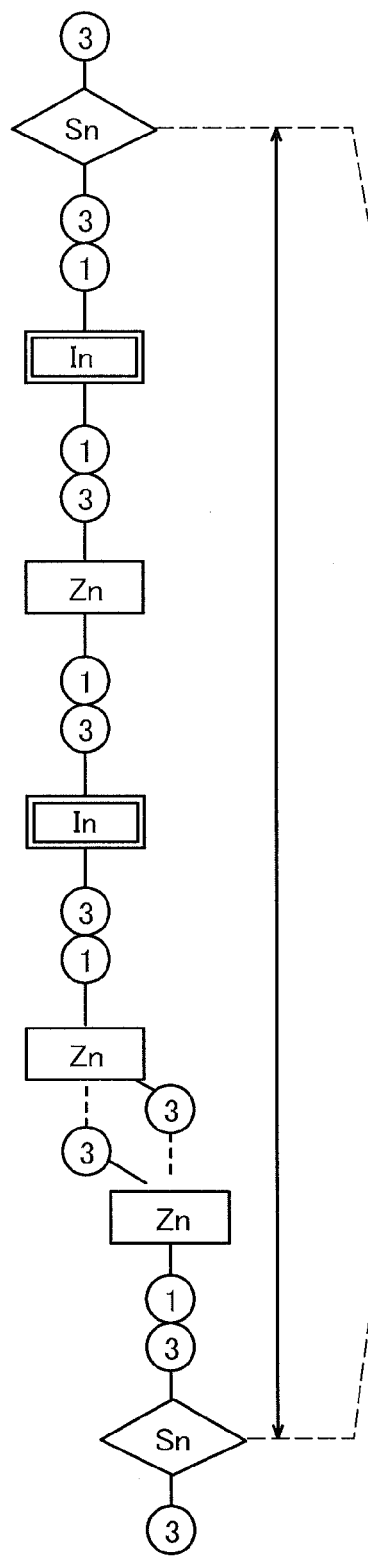
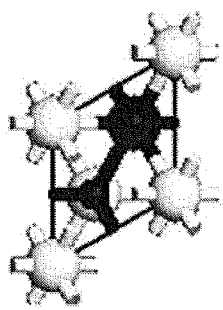
FIG. 18C
● In
☾ Sn
☾ Zn
● O

- In
- Ga
- Zn
- O

SEMICONDUCTOR DEVICE AND DRIVING METHOD OF SEMICONDUCTOR DEVICE

BACKGROUND OF THE INVENTION

1. Field of the Invention

The disclosed invention relates to a semiconductor device using a semiconductor element and a driving method of the semiconductor device.

2. Description of the Related Art

Memory devices using semiconductor elements are broadly classified into two categories: a volatile device that loses stored data when power supply stops, and a non-volatile device that retains stored data even when power is not supplied.

A typical example of a volatile memory device is a static random access memory (SRAM). Since an SRAM holds stored data with a circuit such as a flip flop, the number of elements per memory cell is increased (for example, six transistors per memory cell); therefore, cost per storage capacity is increased.

Another example of a volatile memory device is a dynamic random access memory (DRAM). A DRAM stores data in such a manner that a transistor included in a memory cell is selected and charge is accumulated in a capacitor.

In a DRAM, a transistor included in a memory cell has off-state current (leakage current between a source and a drain when the transistor is off) or the like and charge flows from or into a capacitor even when the transistor is not selected. The invention disclosed in Patent Document 1 proposes that a structure of a transistor in which a channel is formed in a semiconductor substrate including silicon is devised and the off-state current of the transistor is reduced. However, it is difficult to sufficiently reduce the off-state current of the transistor in which the channel is formed in the semiconductor substrate including silicon. Therefore, operation of writing data in a memory element (refresh operation) needs to be performed at predetermined intervals (e.g., several tens of times per second) in a conventional DRAM even in the case where stored data is not rewritten; accordingly, it is difficult to sufficiently reduce power consumption of the DRAM.

REFERENCE

Patent Document

[Patent Document 1] Japanese Published Patent Application No. 2010-147392

SUMMARY OF THE INVENTION

In view of the foregoing problems, it is an object of an embodiment of the present invention to provide a semiconductor device with a novel structure, which enables reduction in power consumption, and a driving method of the semiconductor device.

According to an embodiment of the disclosed invention, each of a plurality of memory cells included in a semiconductor device includes a capacitor, a first transistor, and a second transistor whose off-state current (leakage current between a source and a drain when the transistor is off) is smaller than that of the first transistor. Here, the switching speed of the first transistor is higher than that of the second transistor. In each of the plurality of memory cells, the first transistor, the second transistor, and the capacitor are electrically connected in series. In addition, accumulation of charge in the capacitor and release of charge from the capacitor are performed through both the first transistor and the second transistor.

In a method for driving a semiconductor device, according to an embodiment of the disclosed invention, in the case where data is often written or read (hereinafter, referred to as a first mode), second transistors of all memory cells are turned on and any of first transistors of the plurality of memory cells is turned on. In this manner, in the memory cell in which both the first transistor and the second transistor are on, accumulation of charge in a capacitor and release of charge from the capacitor are performed. In other words, data is written and read.

On the other hand, in the case where data is rarely written or read (hereinafter, referred to as a second mode), the first transistor of any of the plurality of memory cells is turned on and the second transistor of the memory cell is turned on. In this manner, in the memory cell where both the first transistor and the second transistor are turned on, accumulation of charge in the capacitor and release of charge from the capacitor are performed. In other words, data is written and read. When data is not written or read, the second transistors of all the memory cells are turned off. In this manner, release of charge from the capacitor is prevented and data of each memory cell is held, regardless of whether the first transistor is on or off. The second mode can be referred to as a power-saving mode.

A semiconductor device according to an embodiment of the disclosed invention includes a plurality of bit lines, a plurality of first word lines, a plurality of second word lines, a plurality of capacitor lines, and a plurality of memory cells arranged in a matrix. Each of the plurality of memory cells includes a capacitor, a first transistor, and a second transistor whose off-state current is smaller than that of the first transistor. Here, the first transistor has higher switching speed than the second transistor. In each of the plurality of memory cells, one of a source and a drain of the first transistor is electrically connected to one of the plurality of bit lines, the other of the source and the drain of the first transistor is electrically connected to one of a source and a drain of the second transistor, the other of the source and the drain of the second transistor is electrically connected to one of a pair of electrodes of the capacitor, and the other of the pair of electrodes of the capacitor is electrically connected to one of the plurality of capacitor lines. Further, a gate of the first transistor is electrically connected to one of the plurality of first word lines and a gate of the second transistor is electrically connected to one of the plurality of second word lines. Accumulation of charge in the capacitor and release of charge from the capacitor are performed through both the first transistor and the second transistor which are on.

Note that as long as the first transistor and the second transistor are electrically connected in series between the bit line and the capacitor (one of the pair of electrodes of the capacitor), the order of the first transistor and the second transistor may be changed. In other words, the one of the source and the drain of the second transistor is electrically connected to one of the plurality of bit lines, the other of the source and the drain of the second transistor is electrically connected to the one of the source and the drain of the first transistor, the other of the source and the drain of the first transistor is electrically connected to the one of the pair of electrodes of the capacitor, and the other of the pair of electrodes of the capacitor is electrically connected to one of the plurality of capacitor lines. The gate of the first transistor can be electrically connected to one of the plurality of the first word lines and the gate of the second transistor can be electrically connected to one of the plurality of second word lines.

Note that in the plurality of memory cells, the plurality of memory cells in one column can share one bit line, the plurality of memory cells in one row can share one first word line, the plurality of memory cells in one row can share one second word line, and the plurality of memory cells in one row can share one capacitor line. Further, all the memory cells can share one second word line. All the memory cells can share one capacitor line.

In a method for driving a semiconductor device, according to an embodiment of the disclosed invention, in the case where data is often written or read (first mode), a signal for turning on a second transistor is input to all of a plurality of second word lines and a signal for turning on a first transistor is input to any of a plurality of first word lines. In this manner, in a memory cell in which both the first transistor and the second transistor are on, predetermined charge is accumulated in a capacitor or released from the capacitor. Thus, data of each memory cell is written or read.

On the other hand, in the case where data is rarely written or read (second mode), when data is written or read, only in the memory cell of all the memory cells, in which data is written or read, the first transistor and the second transistor are turned on. In other words, a signal for turning on the first transistor and the second transistor is input to only the first word line and the second word line corresponding to the memory cell in which data is written or read. In this manner, data of the memory cell is written or read. When data is not written or read, signals input to a plurality of second word lines are signals for turning off the second transistors of all the memory cells. In this manner, release of charge from the capacitor is prevented and data of each memory cell can be held, regardless of whether the first transistor is on or off.

As the first transistor which has higher switching speed than the second transistor and the second transistor whose off-state current is smaller than that of the first transistor, the following transistors can be used, for example.

As the second transistor, a transistor including an oxide semiconductor material which is a wide bandgap semiconductor can be used, and as the first transistor, a transistor including a semiconductor material other than an oxide semiconductor can be used.

Note that the transistor including an oxide semiconductor material refers to a transistor in which a channel is formed in a layer including an oxide semiconductor material (oxide semiconductor layer). The transistor including a semiconductor material other than an oxide semiconductor refers to a transistor in which a channel is formed in a layer or substrate including a semiconductor material other than an oxide semiconductor material.

The first transistor includes a channel formation region that is provided in a substrate including a semiconductor material other than an oxide semiconductor, a pair of impurity regions between which the channel formation region is provided, a first gate insulating layer that is provided over the channel formation region, and a first gate that overlaps the channel formation region and is provided over the first gate insulating layer.

As another example, the first transistor is provided over an insulating surface and includes a channel formation region that is provided in a semiconductor layer including a semiconductor material other than an oxide semiconductor, a pair of impurity regions between which the channel formation region is provided, a first gate insulating layer that overlaps with the channel formation region, and a first gate that is provided to overlap with the channel formation region with the first gate insulating layer provided therebetween. Here, one of the pair of impurity regions is a source and the other is a drain.

For example, the second transistor includes a second source and a second drain that are electrically connected to an oxide semiconductor layer, a second gate insulating layer, and a second gate that is provided to overlap with the oxide semiconductor layer with the second gate insulating layer provided therebetween.

Note that the substrate including the semiconductor material is preferably a single crystal semiconductor substrate or an SOI substrate. It is also preferable to use silicon as the semiconductor material other than an oxide semiconductor. The oxide semiconductor layer may include an oxide semiconductor material including In, Ga, and Zn. Alternatively, the oxide semiconductor layer may include an oxide semiconductor material including In, Sn, and Zn.

Note that in the above description, a material, which can realize the off-state current characteristics equivalent to those of the oxide semiconductor material such as a wide bandgap material like silicon carbide (specifically, a semiconductor material whose energy gap Eg is larger than 3 eV) may be used, instead of an oxide semiconductor material.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" includes a case in which a plurality of "electrodes" or "wirings" is formed in an integrated manner.

Functions of a "source" and a "drain" are sometimes replaced with each other when a transistor of opposite polarity is used or when the direction of current flowing is changed in accordance with circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on the object having any electric function as long as electric signals can be transmitted and received between the components connected through the object. Examples of an "object having any electric function" are a switching element such as a transistor, a resistor, an inductor, a capacitor, and an element with a variety of functions as well as an electrode and a wiring.

The first transistor has higher switching speed than the second transistor. Therefore, in the first mode in which the first transistor is switched on/off while the second transistor is always on, data of each of memory cells can be written and read at high speed. On the other hand, the second transistor has a smaller off-state current than the first transistor. Therefore, in the second mode in which both the first transistor and the second transistor are switched on/off, charge held in the capacitor can be held for a long period, without refresh operation. That is, the refresh operation of the semiconductor device becomes unnecessary or the frequency of the refresh operation can be drastically reduced. Thus, power consumption of the semiconductor device can be sufficiently reduced.

As described above, a transistor which has a small off-state current (second transistor) and a transistor which has high switching speed (first transistor) are combined and used for each memory cell, whereby a semiconductor device in which power consumption is reduced and data is written and read at higher speed can be obtained.

Here, a transistor in which a channel is formed in an oxide semiconductor layer has an extremely small off-state current. Therefore, when the transistor is used as the second transistor in each memory cell, change in charge held in the capacitor due to the leakage can be reduced. As a result, the semiconductor device can hold stored data for an extremely long period. That is, the refresh operation of the semiconductor device becomes unnecessary or the frequency of the refresh operation can be drastically reduced to, for example, once a month. Thus, power consumption of the semiconductor device can be sufficiently reduced.

The transistor in which the oxide semiconductor layer is used has a small off-state current; however, it has lower switching speed than a transistor in which silicon or the like is used. Therefore, as the first transistor which is electrically connected to the second transistor in series, a transistor including a material other than an oxide semiconductor is used. The transistor including a material other than an oxide semiconductor, for example, a transistor in which a channel is formed in a silicon substrate or a silicon layer, has higher switching speed and can perform at higher speed than the transistor including an oxide semiconductor material. For that reason, when the transistor including a material other than an oxide semiconductor and the transistor including an oxide semiconductor material are combined and used, a semiconductor device can operate at high speed.

A transistor including an oxide semiconductor, which is used as the second transistor, and a transistor including a material other than an oxide semiconductor, which is used as the first transistor, are combined and used in each memory cell, whereby a semiconductor device in which power consumption is reduced and data is written and read at higher speed can be obtained.

BRIEF DESCRIPTION OF THE DRAWINGS

FIGS. 18A to 18C are diagrams illustrating a crystal structure of an oxide material.

DETAILED DESCRIPTION OF THE INVENTION

Figure 1:
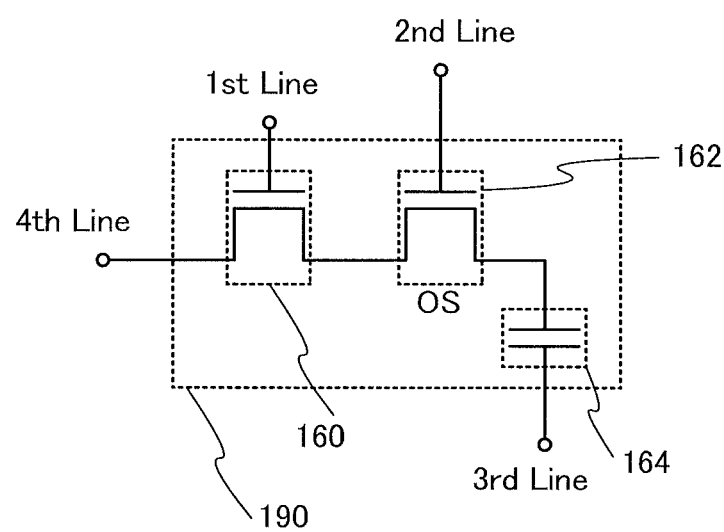
FIG. 1 is a circuit diagram of a semiconductor device.

Examples of embodiments of the disclosed invention will be described below with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components.

Embodiment 1

In this embodiment, a circuit configuration and a driving method of a semiconductor device according to an embodiment of the disclosed invention will be described with reference to FIG. 1, FIG. 2, FIG. 3, and FIG. 4. Note that in a circuit diagram, "OS" may be written beside a transistor in order to indicate that the transistor includes an oxide semiconductor material.

<Basic Circuit>

First, a basic circuit structure and its operation will be described with reference to FIG. 1. FIG. 1 is a circuit diagram illustrating a basic circuit structure of each memory cell in the semiconductor device. In the circuit diagram of FIG. 1, a memory cell 190 includes a transistor 160, a transistor 162, and a capacitor 164.

A gate of the transistor 160 is electrically connected to a first wiring (1st Line), and a gate of the transistor 162 is electrically connected to a second wiring (2nd Line). One of a source and a drain of the transistor 160 is electrically connected to a fourth wiring (4th Line), and the other of the source and the drain of the transistor 160 is electrically connected to one of a source and a drain of the transistor 162. The other of the source and the drain of the transistor 162 is electrically connected to one of a pair of electrodes of the capacitor 164 and the other of the pair of the electrodes of the capacitor 164 is electrically connected to a third wiring (3rd Line).

Note that FIG. 1 illustrates a structure where the transistor 160 and the transistor 162 are electrically connected in series in this order from the fourth wiring side between the fourth wiring (4th Line) and the capacitor 164; however, this embodiment is not limited thereto. The transistor 162 and the transistor 160 may be electrically connected in series in this order from the fourth wiring side between the fourth wiring (4th Line) and the capacitor 164.

Here, as the transistor 160, a transistor including a single crystal semiconductor (a transistor in which a channel is formed in a single crystal semiconductor substrate or a single crystal semiconductor layer), for example, a transistor including single crystal silicon, can be used.

As the transistor 162, a transistor including an oxide semiconductor material (a transistor in which a channel is formed in an oxide semiconductor layer) can be used.

In the semiconductor device illustrated in FIG. 1, writing and reading data can be performed as follows.

In data writing, the potential of the first wiring (1st Line) is set to a potential at which the transistor 160 is turned on and the potential of the second wiring (2nd Line) is set to a potential at which the transistor 162 is turned on, so that the transistor 160 and the transistor 162 are turned on. Thus, the potential of the fourth wiring (4th Line) is supplied to the one of the pair of electrodes of the capacitor 164. Here, the potential of the fourth wiring (4th Line) is selected in accordance with written data to selectively supply predetermined charge to the capacitor 164. The state where predetermined charge is supplied to the capacitor is made to correspond to data "1" and the state where the predetermined charge is not supplied to the capacitor is made to correspond to data "0", whereby data of one bit can be written in the memory cell. Note that when data "1" is written after data "0" is written in the memory cell 190, charge is stored in the capacitor 164 in the data writing. When data "0" is newly written after data "1" is written in the memory cell 190, charge is discharged from the capacitor 164 in the data writing. When data "1" is written after data "1" is written in the memory cell 190 and when data "0" is written after data "0" is written in the memory cell 190, there is no movement of charge from the capacitor 164 in the data writing. After that, one or both of the potentials of the first wiring (1st Line) and the second wiring (2nd Line) is/are changed so that at least one of the transistor 160 and the transistor 162 is turned off, and thus charge supplied to the capacitor 164 can be held. Note that the potential of the third wiring (3rd Line) is kept at a certain potential (e.g., a reference potential VSS) at least during the data writing.

Note that the memory capacity of the semiconductor device may be improved in such a manner that multi level data (data of a plurality of bits) is written to one memory cell by selecting predetermined charge to be supplied to the capacitor 164 among two or more different charges.

In data reading, the potential of the first wiring (1st Line) is set to a potential at which the transistor 160 is turned on and the potential of the second wiring (2nd Line) is set to a potential at which the transistor 162 is turned on, so that the transistor 160 and the transistor 162 are turned on. In the case where predetermined charge is held in the capacitor 164, the charge is released to the fourth wiring (4th Line) through the transistor 160 and the transistor 162 which are on. The charge released from the capacitor 164 to the fourth wiring (4th Line) instantaneously changes the potential of the fourth wiring (4th Line). Here, the fourth wiring (4th Line) is connected to a reading circuit, and the reading circuit detects the change of the potential of the fourth wiring (4th Line). In this manner, whether charge is held in the capacitor 164 or not is detected, so that data stored in the memory cell 190 can be read.

The off-state current of the transistor 162 including an oxide semiconductor material is lower than or equal to 1/100000 of the off-state current of a transistor in which a channel is formed in silicon; thus, loss of the charge due to leakage of the transistor 162 is negligible. That is, with the transistor 162 including an oxide semiconductor material, charge is prevented from leaking from the capacitor 164 during the period in which data is held, and a memory device in which data can be held for a long period can be realized.

For example, when the off-state current of the transistor 162 is 10 zA (1 zA (zeptoampere) is $1 \times 10^{-21}$ A) or smaller at room temperature (25° C.) and the capacitance value of the capacitor 164 is approximately 10 fF, data can be held for $10^4$ seconds or longer. Needless to say, the holding time depends on transistor characteristics and capacitance of the capacitor.

Next, a more specific circuit configuration to which the circuit illustrated in FIG. 1 is applied and its operation will be described with reference to FIG. 2 and FIG. 3.

Figure 2:
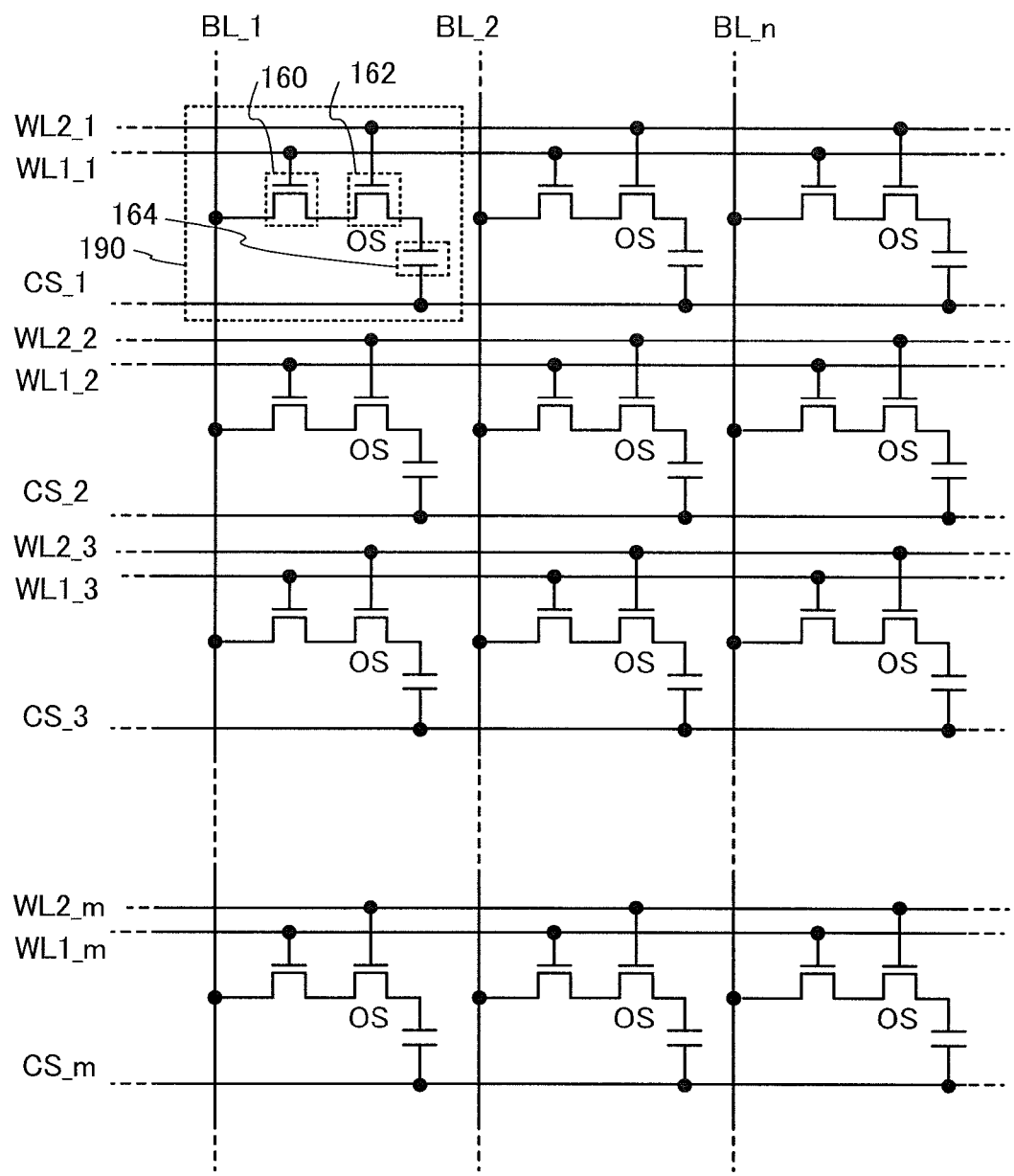
FIG. 2 is a circuit diagram of a semiconductor device.

FIG. 2 illustrates an example of a circuit diagram of a semiconductor device including m rows (in a vertical direction)×n columns (in a horizontal direction) memory cells 190 (m and n are each a natural number). In FIG. 2, lines having a similar function are distinguished by "_1", "_2", and the like added to the end of their names.

The semiconductor device illustrated in FIG. 2 includes m first word lines WL (WL1_1 to WL1_m), m second word lines WL (WL2_1 to WL2_m), m capacitor lines C (CS_1 to CS_m), n bit lines BL (BL_1 to BL_n), and a memory cell array in which memory cells 190 are arranged in a matrix of m rows×n columns.

The first wiring (1st Line) in FIG. 1 corresponds to any of the m first word lines WL (WL1_1 to WL1_m), the second wiring (2nd Line) in FIG. 1 corresponds to any of the m second word lines WL (WL2_1 to WL2_m), the third wiring (3rd Line) in FIG. 1 corresponds to any of the m capacitor lines C (CS_1 to CS_m), and the fourth wiring (4th Line) in FIG. 1 corresponds to any of the n bit lines BL (BL_1 to BL_n).

In FIG. 2, a plurality of memory cells belonging to one row shares one first word line, one second word line, and one capacitor line. Further, in FIG. 2, a plurality of memory cells belonging to one column shares one bit line. Furthermore, the second word line can be shared in all memory cells of the matrix of m rows×n columns. The capacitor line can be shared in all the memory cells of the matrix of m rows×n columns. Note that FIG. 2 illustrates the semiconductor device including the memory cell array in which the memory cells 190 are arranged in the matrix of m rows×n columns; however, the memory cell array may be regarded as one block and a plurality of blocks may be provided in a semiconductor device.

Note that FIG. 2 illustrates a structure in which the transistor 160 and the transistor 162 are electrically connected in series in this order from the bit line BL side between the bit line BL and the capacitor 164; however, an embodiment of the present invention is not limited thereto. The transistor 162 and the transistor 160 may be electrically connected in series in this order from the bit line BL side between the bit line BL and the capacitor 164.

In FIG. 2, a basic method for writing and reading data in the memory cell 190 is similar to the method described in FIG. 1. A method for driving a semiconductor device having the structure described in FIG. 2 will be described with reference to a timing chart of FIG. 3. Reference symbols WL1, WL2, BL, and the like in the timing chart denote the wirings to which the potentials in the timing chart are supplied. The timing chart of FIG. 3 shows the case where "1" is written in the memory cell in the k-th (k is a natural number of greater than or equal to 1 and less than or equal to m) row and the q-th (q is a natural number of greater than or equal to 1 and less than or equal to n) column and data "1" is read from the memory cell in the k-th row and the q-th column. Note that the method for driving the semiconductor device will be described on the following modes: the case where data is rarely written or read (the second mode) and the case where data is often written or read (the first mode).

Note that the case where the transistor 160 and the transistor 162 are all n-channel transistors is here described as an example; however, the transistor 160 and the transistor 162 are not limited thereto.

First, the method for driving the semiconductor device in the case where data is rarely written or read (the second mode) is described. An example of the case where data "1" is written in the memory cell in the k-th row and the q-th column is described.

The potential of the first word line WL1_k is set to V1 and the potential of the second word line WL2_k is set to V2, so that the transistor 160 and the transistor 162 of the memory cell that is a target for writing (the memory cell in the k-th row and the q-th column) are turned on. Here, the potential V3 corresponding to data "1" is supplied to the bit line BL_q. In the memory cell that is a target for writing (the memory cell in the k-th row and the q-th column), the potential V3 of the bit line BL_q is supplied to one of the electrodes of the capacitor 164 through the transistor 160 and the transistor 162. After that, when at least one of the transistor 160 and the transistor 162 is turned off, the memory cell that is a target for writing (the memory cell in the k-th row and the q-th column) holds data "1". Note that at least during the writing period, a certain potential (e.g., potential VSS) is supplied to the capacitor line CS_k. For example, the potential VSS can be a reference potential GND (0V).

Next, an example where data "1" written to the memory cell in the k-th row and the q-th column is read in the case where data is rarely written or read (the second mode) is shown. In the data reading, the bit line BL_q electrically connected to the memory cell 190 which is a target for reading is connected to the reading circuit.

Figure 4:
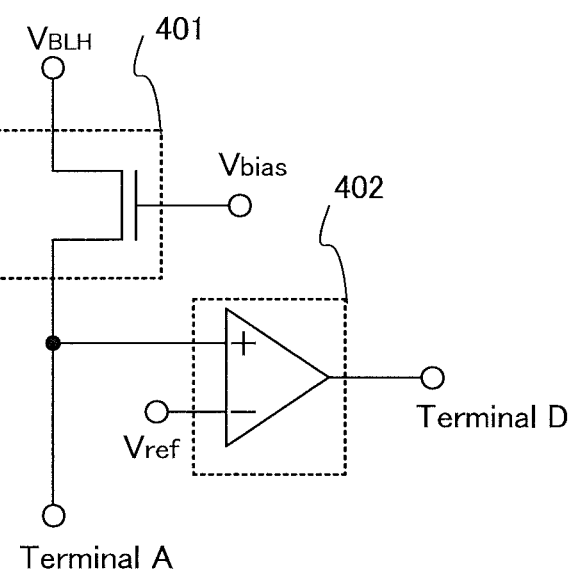
FIG. 4 is a circuit diagram of a semiconductor device.

For example, as the reading circuit, a structure illustrated in FIG. 4 can be used. In FIG. 4, the reading circuit includes a transistor 401 and a sense amplifier 402. In data reading, a terminal A is electrically connected to the bit line BL_q electrically connected to the memory cell 190 which is a target for reading. In addition, a bias potential $V_{bias}$ is applied to a gate electrode of the transistor 401.

The sense amplifier 402 outputs "High" when the potential of the terminal A is higher than a reference potential $V_{ref}$ (e.g., 0 V) and "Low" when the potential of the terminal A is lower than the reference potential $V_{ref}$. In the data reading, the transistor 401 is turned on and the potential of the bit line BL_q electrically connected to the terminal A is set to a predetermined potential (e.g., $V_{BLH}$) (precharge). Next, the potential of the first word line WL1_k is set to V1 and the potential of the second word line WL2_k is set to V2, so that the transistor 160 and the transistor 162 of the memory cell that is a target for reading (the memory cell in the k-th row and the q-th column) are turned on, and the potential of the bit line BL_q electrically connected to the terminal A of the reading circuit is compared with the reference potential $V_{ref}$. As described above, the potential of the bit line BL_q depends on data stored in the memory cell that is a target for reading (the memory cell in the k-th row and the q-th column). Therefore, in accordance with the data stored in the memory cell that is a target for reading, the sense amplifier 402 outputs "High" or "Low". Here, where "High" is data "1" and "Low" is data "0", the sense amplifier 402 outputs data "1" from a terminal D in the case where data "1" is stored in the memory cell 190 and data "0" from the terminal D in the case where data "0" is stored in the memory cell 190. In this manner, the reading circuit can read data stored in the memory cell 190.

Figure 3:
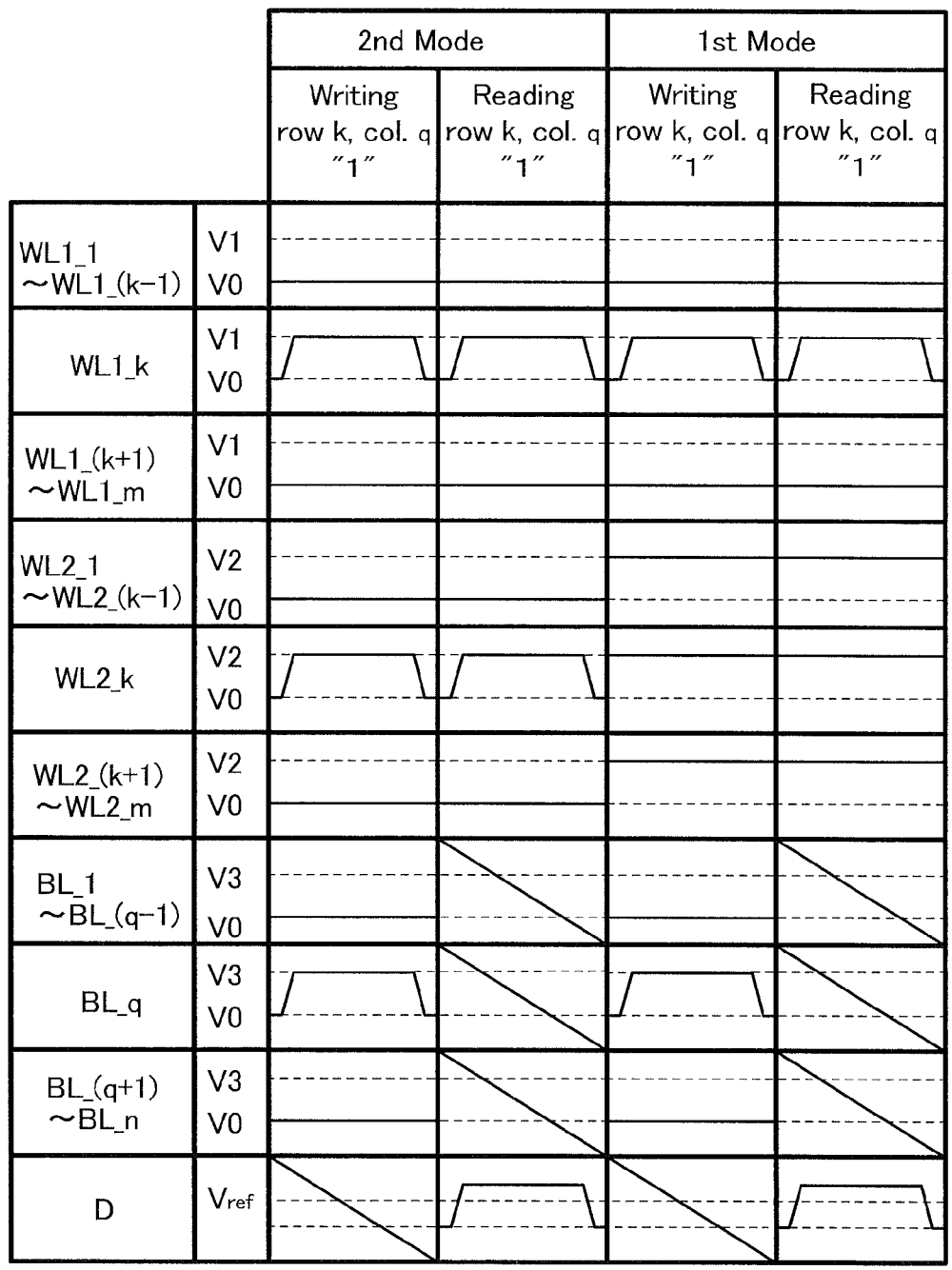
FIG. 3 is a timing chart.

The timing chart of FIG. 3 shows the case where data "1" is stored in the memory cell that is a target for writing (the memory cell in the k-th row and the q-th column) is shown; therefore, "High" (that is, data "1") is output. In FIG. 3, output from the reading circuit is shown in a column "D".

Note that the reading circuit illustrated in FIG. 4 is an example. Alternatively, another known circuit may be used.

Further, in the case where data is rarely written or read (the second mode), when data is not written or read, signals input to the second word lines WL2_1 to WL2_m are each set to a signal (potential V0) at which all the transistors 162 of the memory cells of the matrix of m rows×n columns are turned off. In this manner, charge is prevented from leaking from the capacitor and data of each memory cell can be held, regardless of whether the transistor 160 is on or off.

Next, the method for driving the semiconductor device in the case where data is often written or read (the first mode) is described. First, an example of the case where data "1" is written in the memory cell in the k-th row and the q-th column is shown.

In the first mode, all the transistors 162 of the memory cells of m rows and n columns are always on. Therefore, in the first mode, the potentials of the second word lines WL2_1 to WL2_m are V2. When the potentials V2 are sufficiently high, the on-resistance of the transistor 162 becomes sufficiently low, so that the disadvantage of electrically connecting the transistor 160 to the transistor 162 in series can be reduced. In addition, since the transistor 162 is always on, power consumption for switching the on-state and the off-state of the transistor 162 can be reduced. In this state, the potential of the first word line WL1_k corresponding to the memory cell that is a target for writing (the memory cell in the k-th row and the q-th column) is set to V1, whereby the transistor 160 and the transistor 162 of the memory cell that is a target for writing (the memory cell in the k-th row and the q-th column) are turned on. Here, the potential V3 corresponding to data "1" is supplied to the bit line BL_q. In the memory cell that is a target for writing (the memory cell in the k-th row and the q-th column), the potential V3 of the bit line BL_q is supplied to the one of the electrodes of the capacitor 164 through the transistor 160 and the transistor 162. After that, when the transistor 160 is turned off, the memory cell that is a target for writing (the memory cell in the k-th row and the q-th column) holds data "1". Note that at least during a writing period, a certain potential (e.g., potential VSS) is supplied to the capacitor line CS_k. For example, the potential VSS can be a reference potential GND (0V).

Next, an example where data "1" written to the memory cell in the k-th row and the q-th column is read in the case where data is often written or read (the first mode) is shown. Also in this case, all the transistors 162 of the memory cells of m rows and n columns are always on; therefore, the potentials of the second word lines WL2_1 to WL2_m are V2.

In the data reading, the bit line BL_q electrically connected to the memory cell 190 which performs reading is connected to the reading circuit.

The reading circuit can have a structure similar to the above-described structure. In the data reading, the transistor 401 is turned on and the potential of the bit line BL_q electrically connected to the terminal A is set to a predetermined potential ($V_{BLH}$) (precharge). Next, the potential of the first word line WL1_k is set to V1, so that both the transistor 160 and the transistor 162 of the memory cell that is a target for reading (the memory cell in the k-th row and the q-th column) are turned on, and the potential of the bit line BL_q electrically connected to the terminal A of the reading circuit is compared with the reference potential $V_{ref}$. As described above, the potential of the bit line BL_q depends on data stored in the memory cell that is a target for reading (the memory cell in the k-th row and the q-th column). Therefore, in accordance with the data stored in the memory cell that is a target for reading, the sense amplifier 402 outputs "High" or "Low". Here, when "High" is data "1" and "Low" is data "0", the sense amplifier 402 outputs data "1" from a terminal D in the case where data "1" is stored in the memory cell 190 and data "0" from the terminal D in the case where data "0" is stored in the memory cell 190. In such a manner, the reading circuit can read data stored in the memory cell 190.

The timing chart of FIG. 3 shows the case where data "1" is stored in the memory cell that is a target for reading (the memory cell in the k-th row and the q-th column) is shown; therefore, "High" (that is, data "1") is output. In FIG. 3, output from the reading circuit is shown in the column "D".

In this manner, the semiconductor device is driven in the case where data is often written or read (the first mode) and the case where data is rarely written or read (the second mode).

The transistor 160 has higher switching speed than the transistor 162. Therefore, in the first mode in which the transistor 160 is switched on/off while the transistor 162 is always on, data of each of memory cells can be written and read at high speed. On the other hand, the transistor 162 has a smaller off-state current than the transistor 160. Therefore, in the second mode in which both the transistor 160 and the transistor 162 are switched on/off, charge held in the capacitor 164 can be held for a long period, without refresh operation. That is, the refresh operation of the semiconductor device becomes unnecessary or the frequency of the refresh operation can be drastically reduced. Thus, power consumption of the semiconductor device can be sufficiently reduced.

As described above, a transistor which has a small off-state current (transistor 162) and a transistor which has high switching speed (transistor 160) are combined and used for each memory cell, whereby a semiconductor device in which power consumption is reduced and data is written and read at higher speed can be obtained.

Here, a transistor in which a channel is formed in an oxide semiconductor layer has an extremely small off-state current. Therefore, when the transistor is used as the transistor 162 in each memory cell, change in charge held in the capacitor due to the leakage can be reduced. As a result, the semiconductor device can hold stored data for an extremely long period. That is, the refresh operation of the semiconductor device becomes unnecessary or the frequency of the refresh operation can be drastically reduced. Thus, power consumption of the semiconductor device can be sufficiently reduced.

The transistor in which the oxide semiconductor layer is used has a small off-state current; however, it has lower switching speed than a transistor in which silicon or the like is used. Therefore, as the transistor 160 which is electrically connected to the transistor 162 in series, a transistor including a material other than an oxide semiconductor is used. The transistor including a material other than an oxide semiconductor, for example, a transistor in which a channel is formed in a silicon substrate or a silicon layer, has higher switching speed and can perform at higher speed than the transistor including an oxide semiconductor material. For that reason, when the transistor including a material other than an oxide semiconductor and the transistor including an oxide semiconductor material are combined and used, a semiconductor device can operate at high speed.

A transistor including an oxide semiconductor, which is used as the transistor 162, and a transistor including a material other than an oxide semiconductor, which is used as the transistor 160, are combined and used in each memory cell, whereby a semiconductor device in which power consumption is reduced and data is written and read at higher speed can be obtained.

The structures, methods, and the like described in this embodiment can be combined as appropriate with any of the structures, methods, and the like described in the other embodiments.

Embodiment 2

In this embodiment, a structure of a semiconductor device according to an embodiment of the disclosed invention will be described with reference to FIGS. 5A to 5C, FIGS. 6A to 6C, FIGS. 7A to 7C, FIGS. 8A to 8C, and FIGS. 9A and 9B.

Figure 5A:
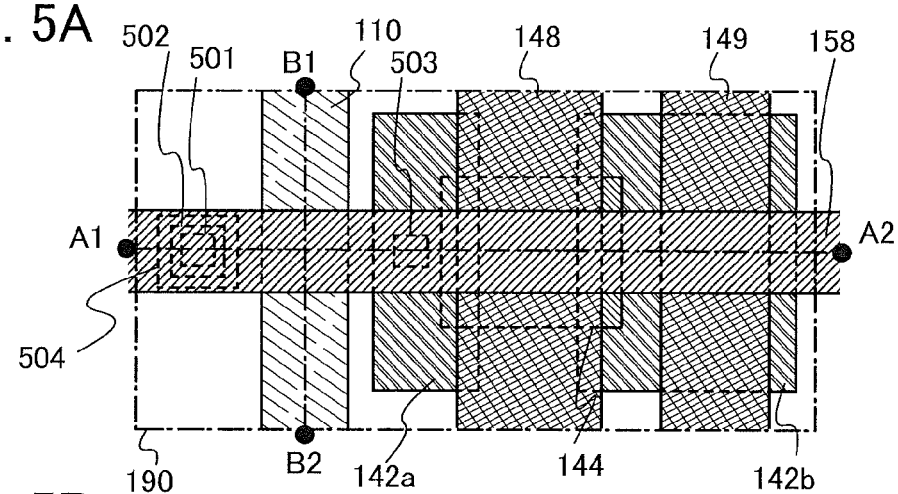
FIGS. 5A to 5C are a plan view and cross-sectional views illustrating a structure of a semiconductor device.
Figure 5B:
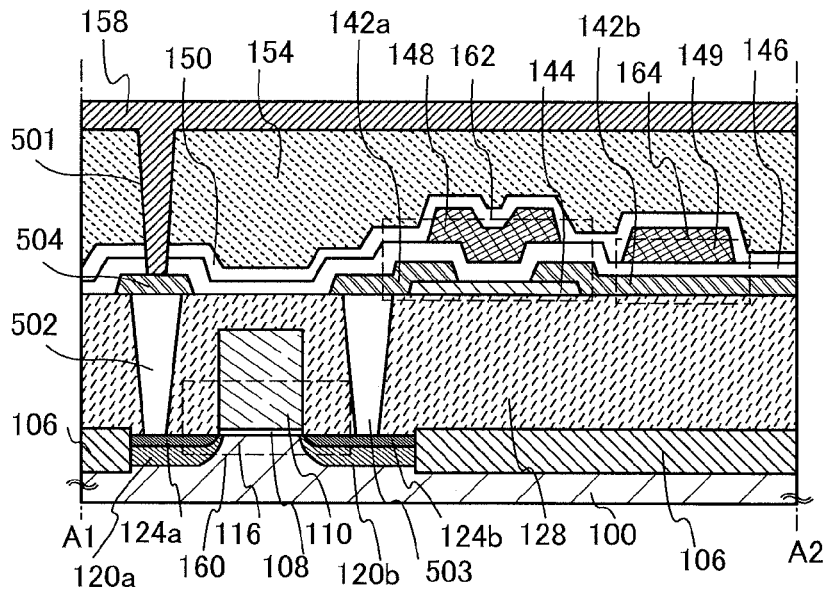
Figure 5C:
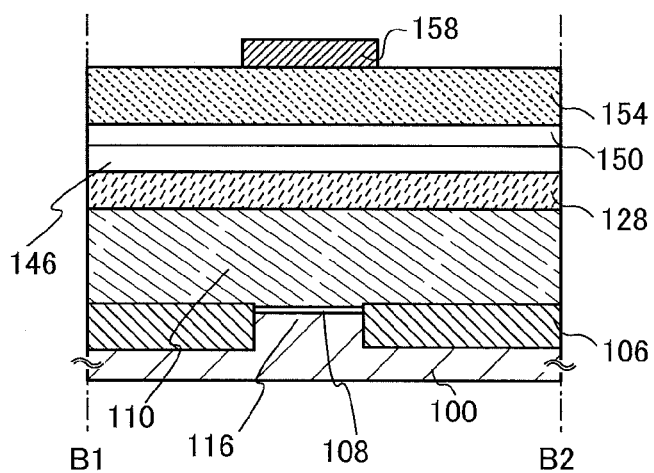

FIGS. 5A to 5C illustrate an example of a structure of the memory cell 190 of the semiconductor device illustrated in the circuit diagram of FIG. 2. FIG. 5A illustrates a plane of the semiconductor device and FIG. 5B and FIG. 5C illustrate cross-sections of the semiconductor device. Here, FIG. 5B illustrates a cross-section taken along line A1-A2 in FIG. 5A. FIG. 5C illustrates a cross-section taken along line B1-B2 in FIG. 5A. In FIG. 5A, a direction parallel to line A1-A2 corresponds to the column direction in the circuit diagram of FIG. 2, and a direction perpendicular to line A1-A2 corresponds to the row direction in the circuit diagram of FIG. 2.

In the semiconductor device illustrated in FIGS. 5A to 5C, the transistor 160 including a semiconductor material (e.g., silicon) other than an oxide semiconductor material is provided in a lower portion, and the transistor 162 including an oxide semiconductor and the capacitor 164 are provided in an upper portion. Note that FIGS. 5A to 5C illustrate a typical structure of one memory cell 190 in FIG. 2.

In practice, the number of memory cells is not one, and the memory cells of the matrix of m rows×n columns are provided as illustrated in the circuit diagram of FIG. 2.

Needless to say, although the transistor 160 and the transistor 162 are n-channel transistors here, p-channel transistors can be used. The technical feature of the disclosed invention is that a semiconductor material with which off-state current can be sufficiently reduced, such as an oxide semiconductor, is used for the transistor 162 in order to hold data. Therefore, it is not necessary to limit specific conditions, such as a material, a structure, or the like of the semiconductor device, to those given here.

The transistor 160 in FIGS. 5A to 5C includes a channel formation region 116 provided in a substrate 100 including a semiconductor material (such as silicon), an impurity region 120a and an impurity region 120b provided such that the channel formation region 116 is provided therebetween, a metal compound region 124a and a metal compound region 124b in contact with the impurity region 120a and the impurity region 120b, a gate insulating layer 108 provided over the channel formation region 116, and a gate electrode 110 provided over the gate insulating layer 108.

Note that the gate electrode 110 also functions as the first word line WL1 in the circuit diagram of FIG. 2.

Note that a transistor whose source electrode and drain electrode are not illustrated in a drawing may be referred to as a transistor for the sake of convenience. Further, in such a case, in description of connection of a transistor, a source region and a source electrode are collectively referred to as a "source electrode," and a drain region and a drain electrode are collectively referred to as a "drain electrode". In other words, in this specification, the term "source electrode" may include a source region and the term "drain electrode" may include a drain region.

Note that in this specification, the impurity region 120a and the impurity region 120b are collectively referred to as impurity regions 120 in some cases. In this specification, the metal compound region 124a and the metal compound region 124b are collectively referred to as metal compound regions 124 in some cases.

Further, as illustrated in FIG. 5C, an element isolation insulating layer 106 is provided over the substrate 100. In this manner, the source region, the channel formation region, and the drain region of the transistor 160 are isolated from the source region, the channel formation region, and the drain region of the transistor 160 included in the adjacent memory cell.

An insulating layer 128 is provided over the transistor 160. Note that in order to realize high integration, it is preferable that, as in FIGS. 5A to 5C, the transistor 160 do not have a sidewall insulating layer. On the other hand, when importance is put on the characteristics of the transistor 160, sidewall insulating layers may be provided on side surfaces of the gate electrode 110, and the impurity regions 120 may include a plurality of different regions in impurity concentration. The insulating layer 128 preferably has a surface with favorable planarity; for example, the surface of the insulating layer 128 preferably has a root-mean-square (RMS) roughness of 1 nm or less. In this manner, the channel formation region (an oxide semiconductor layer 144) of the transistor 162 is provided in an extremely flat region having a root-mean-square (RMS) roughness of 1 nm or less, whereby the transistor 162 which can prevent a defect such as a short-channel effect and has favorable characteristics can be provided even when the transistor 162 is miniaturized.

The transistor 162 illustrated in FIGS. 5A to 5C includes the oxide semiconductor layer 144 formed over the insulating layer 128, an electrode 142a and an electrode 142b which are partly in contact with the oxide semiconductor layer 144, a gate insulating layer 146 covering the oxide semiconductor layer 144, the electrode 142a, and the electrode 142b, and a gate electrode 148 provided over the gate insulating layer 146 so as to overlap with the oxide semiconductor layer 144. The electrode 142a is connected to the metal compound region 124b of the transistor 160 through an electrode 503 formed in an opening in the insulating layer 128.

Note that in this specification, the electrode 142a and the electrode 142b are collectively referred to as the electrodes 142 in some cases.

Here, the oxide semiconductor layer 144 is preferably an oxide semiconductor layer by sufficiently removing impurities such as hydrogen and then sufficiently supplying oxygen. Specifically, the hydrogen concentration of the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration of the oxide semiconductor layer 144 is measured by secondary ion mass spectrometry (SIMS). Thus, in the oxide semiconductor layer 144 in which the hydrogen concentration is sufficiently reduced and defect levels in the energy gap due to oxygen deficiency are reduced by sufficient supply of oxygen, the density of carriers due to a donor such as hydrogen is lower than $1 \times 10^{12}$/cm$^3$, preferably lower than $1 \times 10^{11}$/cm$^3$, further preferably lower than $1.45 \times 10^{10}$/cm$^3$. In addition, for example, the off-state current (per unit channel width (1 μm), here) at room temperature (25° C.) is 100 zA (1 zA (zeptoampere) is $1 \times 10^{-21}$ A) or less or 10 zA or less. In this manner, by using an oxide semiconductor which is made to be an i-type (intrinsic) oxide semiconductor or a substantially i-type oxide semiconductor, the transistor 162 which has excellent off-state current characteristics can be obtained.

Note that the gate electrode 148 also functions as the second word line WL2 in the circuit diagram of FIG. 2.

The capacitor 164 in FIGS. 5A to 5C includes the electrode 142b, the gate insulating layer 146, and the electrode 149 which are provided over the insulating layer 128. Specifically, the electrode 142b is the one of the electrodes of the capacitor 164, the electrode 149 is the other of the electrodes of the capacitor 164, and the gate insulating layer 146 is a dielectric layer of the capacitor 164.

Note that the electrode 149 also functions as the capacitor line CS in the circuit diagram of FIG. 2.

An insulating layer 150 is formed over the transistor 162 and an insulating layer 154 is formed over the insulating layer 150. The wiring 158 is formed over the insulating layer 154. Here, the wiring 158 functions as the bit line BL in the circuit diagram of FIG. 2.

The wiring 158 is connected to an electrode 504 in an opening 501 formed in the insulating layer 154, the insulating layer 150, and the gate insulating layer 146. In addition, the electrode 504 is connected to the metal compound region 124a of the transistor 160 through an electrode 502 formed in an opening in the insulating layer 128. Thus, the wiring 158 functioning as the bit line BL is electrically connected to the one of the source and the drain of the transistor 160.

Note that the structure of a semiconductor device according to an embodiment of the disclosed invention is not limited to the structure illustrated in FIGS. 5A to 5C. In the structure in FIGS. 5A to 5C, the details such as a connection relation of electrodes can be changed as appropriate.

Figure 6A:
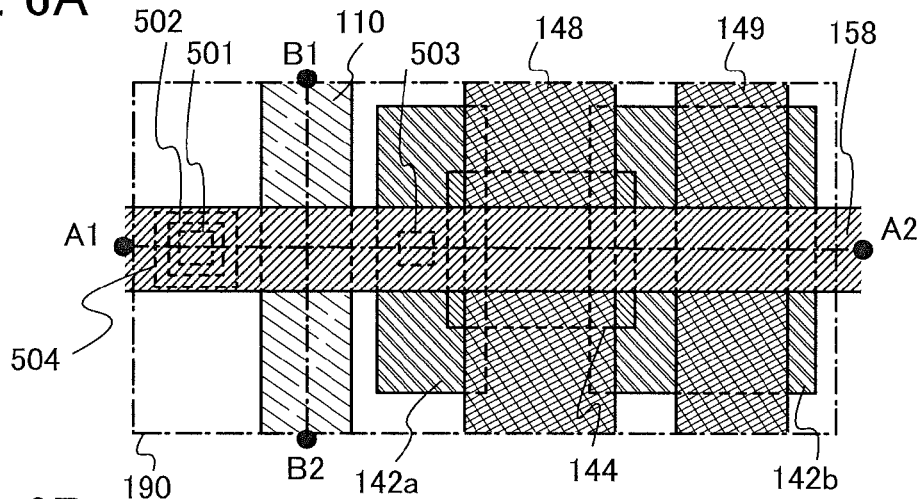
FIGS. 6A to 6C are a plan view and cross-sectional views illustrating a structure of a semiconductor device.
Figure 6B:
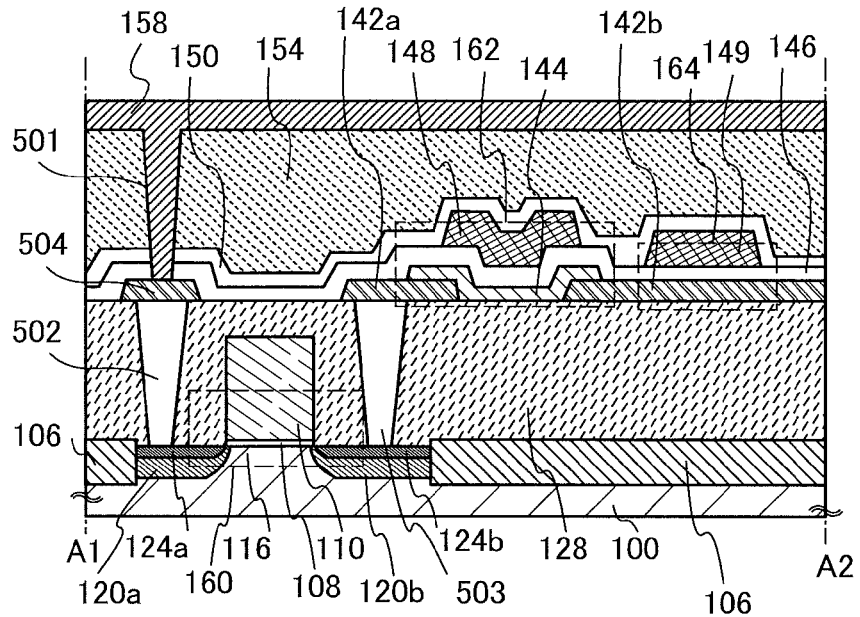
Figure 6C:
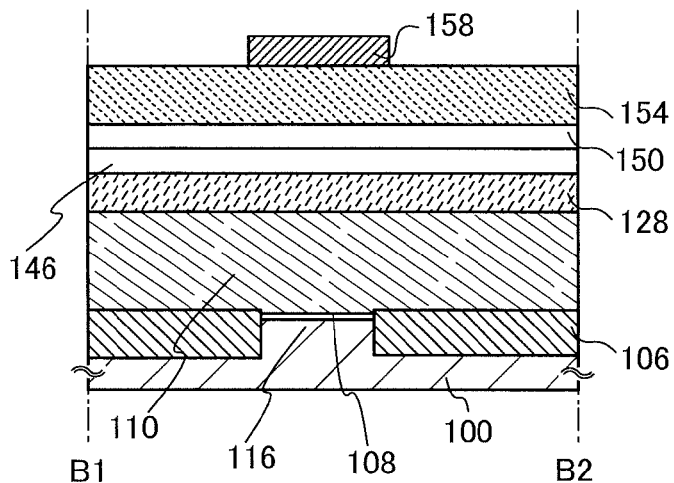

For example, the structure in FIGS. 5A to 5C shows an example in which the oxide semiconductor layer 144 is provided under the electrode 142. However, the structure is not limited thereto. The oxide semiconductor layer 144 may be provided over the electrode 142. FIGS. 6A to 6C illustrate an example in which the oxide semiconductor layer 144 is provided over the electrode 142. Note that in FIGS. 6A to 6C, the same portions as those in FIGS. 5A to 5C are denoted by the same reference numerals as those in FIGS. 5A to 5C.

In the structure illustrated in FIGS. 6A to 6C, the end portions of the electrode 142a and the electrode 142b are preferably tapered. When the end portions of the electrode 142a and the electrode 142b are tapered, the coverage with the oxide semiconductor layer 144 can be improved and a breaking thereof can be prevented. Here, a taper angle is, for example, greater than or equal to 30° and less than or equal to 60°. Note that the taper angle refers to an inclination angle formed by a side surface and a bottom surface of a layer (e.g., the electrode 142a) having a tapered shape when the layer is observed from the direction perpendicular to the cross section of the layer (i.e., the plane perpendicular to the surface of the substrate).

Although not illustrated in FIGS. 5A to 5C and FIGS. 6A to 6C, the whole oxide semiconductor layer 144 is overlapped with the wiring 158 (covered with the wiring 158), whereby light from above can be prevented from entering the oxide semiconductor layer 144. Thus, photodegradation of the oxide semiconductor layer 144 can be suppressed.

Figure 7A:
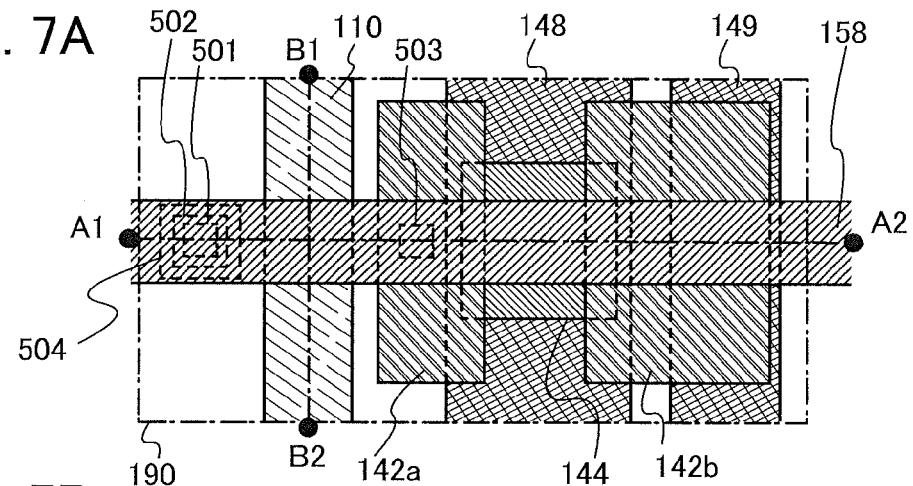
FIGS. 7A to 7C are a plan view and cross-sectional views illustrating a structure of a semiconductor device.
Figure 7B:
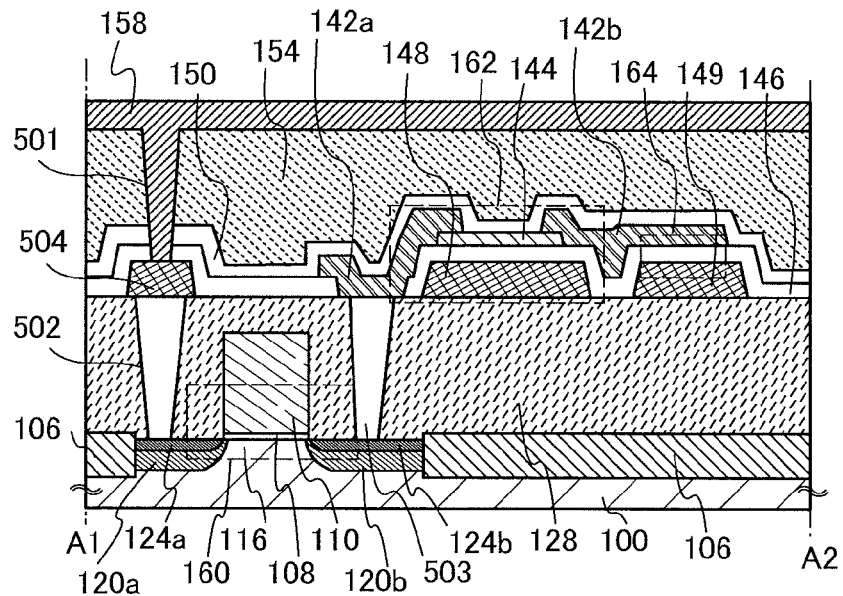
Figure 7C:
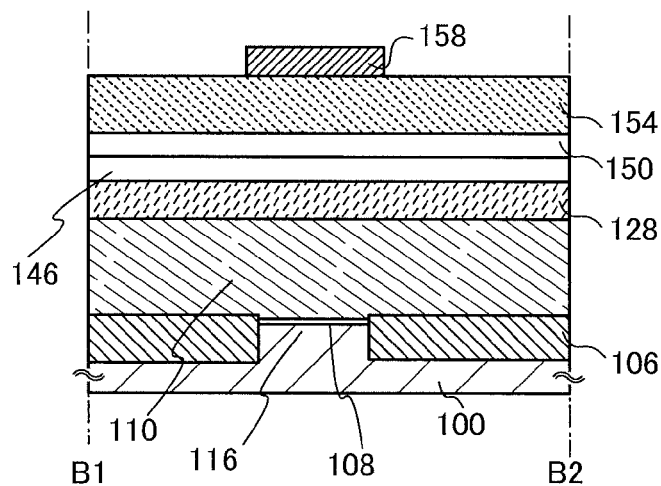

In the structure in FIGS. 5A to 5C and FIGS. 6A to 6C, an example where the gate electrode 148 is provided over the oxide semiconductor layer 144 is shown. However, the structure is not limited thereto, and the gate electrode 148 may be provided under the oxide semiconductor layer 144. FIGS. 7A to 7C show an example where the gate electrode 148 is provided under the oxide semiconductor layer 144. Note that in FIGS. 7A to 7C, the same portions as those in FIGS. 5A to 5C or FIGS. 6A to 6C are denoted by the same reference numerals as those in FIGS. 5A to 5C or FIGS. 6A to 6C.

In FIGS. 7A to 7C, the electrode 142a is connected to the electrode 503 in an opening provided in the gate insulating layer 146.

In the structure in FIGS. 7A to 7C, the end portions of the gate electrode 148 and the electrode 149 are preferably tapered. When the end portions of the gate electrode 148 and the electrode 149 are tapered, the coverage with the gate insulating layer 146 is improved and a short circuit between the electrode 142a and the gate electrode 148, a short circuit between the electrode 142b and the gate electrode 148, a short circuit between the electrode 142b and the electrode 149, and the like can be prevented. Here, the taper angle is, for example, greater than or equal to 30° and less than or equal to 60°.

Figure 8A:
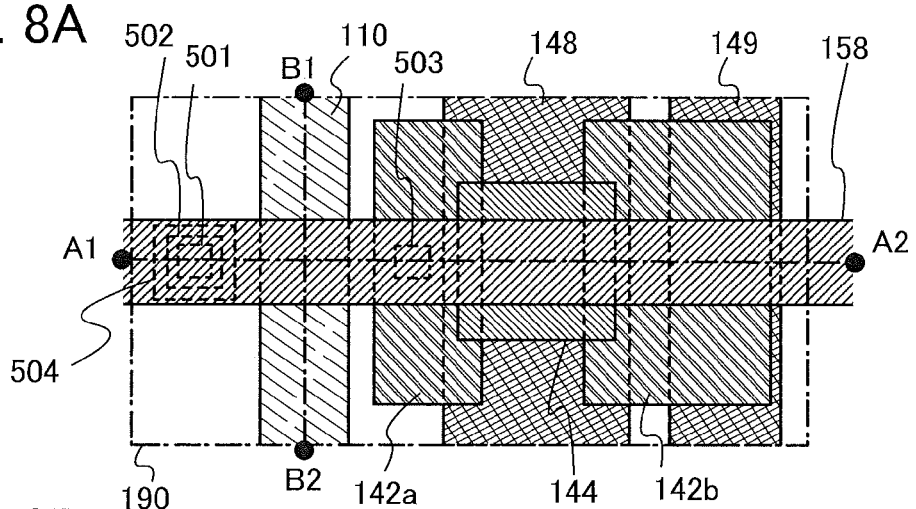
FIGS. 8A to 8C are a plan view and cross-sectional views illustrating a structure of a semiconductor device.
Figure 8B:
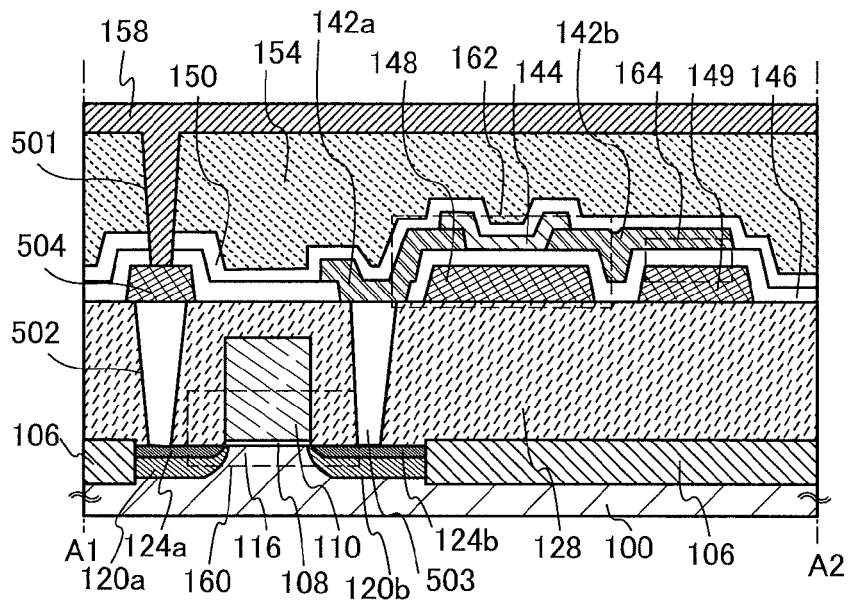
Figure 8C:
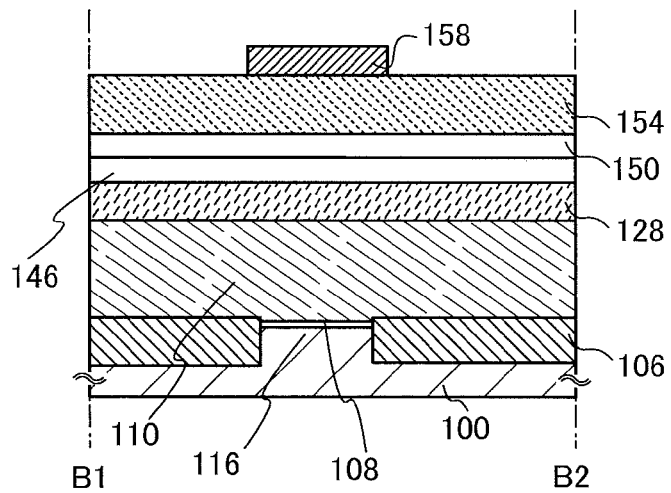

In the structure in FIGS. 7A to 7C, the oxide semiconductor layer 144 may be provided over the electrode 142a and the electrode 142b. FIGS. 8A to 8C show an example where the oxide semiconductor layer 144 is provided over the electrode 142a and the electrode 142b in the structure in FIGS. 7A to 7C. Note that in FIGS. 8A to 8C, the same portions as those in FIGS. 5A to 5C, FIGS. 6A to 6C, and FIGS. 7A to 7C are denoted by the same reference numerals as those in FIGS. 5A to 5C, FIGS. 6A to 6C, and FIGS. 7A to 7C.

FIGS. 7A to 7C and FIGS. 8A to 8C show a structure where the gate electrode 148 is provided below the oxide semiconductor layer 144. In this structure, the whole oxide semiconductor layer 144 is overlapped with the gate electrode 148, whereby light from below can be prevented from entering the oxide semiconductor layer 144. Thus, photodegradation of the oxide semiconductor layer 144 can be suppressed. Although not illustrated in FIGS. 7A to 7C and FIGS. 8A to 8C, the whole oxide semiconductor layer 144 is overlapped with the wiring 158 (covered with the wiring 158), whereby light from above can be prevented from entering the oxide semiconductor layer 144. Thus, photodegradation of the oxide semiconductor layer 144 can be further suppressed.

Further, in the structures in FIGS. 5A to 5C and FIGS. 7A to 7C (the structure where the electrode 142a and the electrode 142b are provided over the oxide semiconductor layer 144), an oxide conductive layer serving as a source region and a drain region can be provided between the oxide semiconductor layer 144 and the electrode 142a and between the oxide semiconductor layer 144 and the electrode 142b.

For example, the following method can be employed to form oxide conductive layers serving as a source region and a drain region, the electrode 142a, and the electrode 142b: an oxide conductive film is formed over the oxide semiconductor layer 144; a conductive layer is formed thereover; and the oxide conductive film and the conductive layer are processed in the same photolithography process.

Alternatively, a stacked layer of an oxide semiconductor film and an oxide conductive film is formed, and the stacked layer of the oxide semiconductor film and the oxide conductive film is processed in the same photolithography process, whereby the island-shaped oxide semiconductor layer 144 and an island-shaped oxide conductive film are formed. After that, the electrode 142a and the electrode 142b are formed over the island-shaped oxide conductive film and the island-shaped oxide conductive film is further etched using the electrode 142a and the electrode 142b as masks, so that oxide conductive layers serving as a source region and a drain region can be formed. Note that in etching process for forming the oxide conductive layers, etching conditions (the kind of the etchant, the concentration, the etching time, and the like) are adjusted as appropriate so that an oxide semiconductor layer is not etched excessively.

A material of the oxide conductive layers preferably contains zinc as a component and preferably does not contain indium. For such a material of the oxide conductive layer, zinc oxide, zinc aluminum oxide, zinc aluminum oxynitride, zinc gallium oxide, or the like can be used.

The contact between a metal electrode (molybdenum, tungsten, or the like) and an oxide conductive layer can reduce the contact resistance as compared to the contact between a metal electrode (molybdenum, tungsten, or the like) and an oxide semiconductor layer. Therefore, by providing the above-described oxide conductive layers between the oxide semiconductor layer 144 and the electrode 142a and between the oxide semiconductor layer 144 and the electrode 142b, the contact resistance between the electrode 142a and the oxide conductive layer and the contact resistance between the electrode 142b and the oxide conductive layer can be reduced. In this manner, the resistance of the source and the drain can be reduced and high-speed operation of the transistor 162 can be realized. Further, the withstand voltage of the transistor 162 can be increased.

Note that in FIGS. 5A to 5C, FIGS. 6A to 6C, FIGS. 7A to 7C, and FIGS. 8A to 8C, the structure in which the transistor 160 and the transistor 162 are electrically connected in series in this order from the wiring 158 side between the wiring 158 functioning as the bit line BL and the capacitor 164 is illustrated; however, the structure is not limited thereto. The transistor 162 and the transistor 160 may be electrically connected in series in this order from the wiring 158 side between the wiring 158 functioning as the bit line BL and the capacitor 164.

In the structures illustrated in FIGS. 5A to 5C, FIGS. 6A to 6C, FIGS. 7A to 7C, and FIGS. 8A to 8C, an example where the gate insulating layer 146 of the transistor 162 is used as a dielectric layer of the capacitor 164 is shown; however, the structure is not limited thereto. An insulating layer different from the gate insulating layer 146 may be used as the dielectric layer of the capacitor 164. Further, in the structures illustrated in FIGS. 5A to 5C, FIGS. 6A to 6C, FIGS. 7A to 7C, and FIGS. 8A to 8C, an example where the electrode 142b serving as the source electrode or the drain electrode of the transistor 162 is used as one of the pair of electrodes of the capacitor 164 is shown; however, the structure is not limited thereto. As the one of the pair of electrodes of the capacitor 164, an electrode different from the electrode 142b, for example, an electrode formed in a layer different from the layer in which the electrode 142b is formed, may be used. Furthermore, in the structures illustrated in FIGS. 5A to 5C, FIGS. 6A to 6C, FIGS. 7A to 7C, and FIGS. 8A to 8C, an example where the electrode 149 formed in the same layer as the gate electrode 148 of the transistor 162 is used as the other of the pair of electrodes of the capacitor 164 is shown; however, the structure is not limited thereto. As the other of the pair of electrodes of the capacitor 164, an electrode formed in a layer different from the layer in which the gate electrode 148 is formed may be used.

For example, as the capacitor 164, a capacitor having such a structure which is used in a conventional DRAM can be used. As the capacitor, for example, a trench capacitor or a stacked capacitor can be used.

Figure 9A:
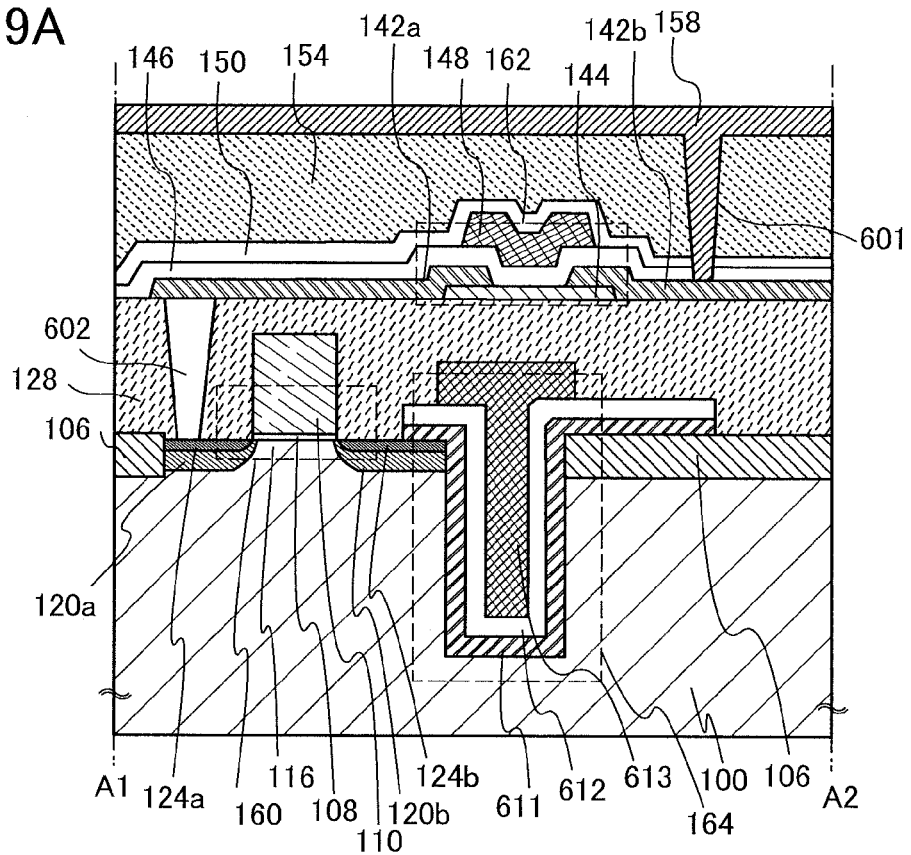
FIGS. 9A and 9B are cross-sectional views each illustrating a structure of a semiconductor device.

FIG. 9A shows an example where a trench capacitor is used as the capacitor 164. Note that in FIGS. 9A and 9B, the transistor 162 and the transistor 160 are electrically connected in series in this order from the wiring 158 side between the wiring 158 serving as the bit line BL and the capacitor 164.

In FIG. 9A, the same portions as those in FIGS. 5A to 5C are denoted by the same reference numerals as those in FIGS. 5A to 5C and description thereof is omitted. The capacitor 164 in FIG. 9A includes an electrode 611, a dielectric layer 612, and an electrode 613. The capacitor 164 in FIG. 9A is formed in a trench provided in the substrate 100. The electrode 611 and the dielectric layer 612 which are formed in the trench have a surface based on an uneven shape of the trench. Thus, the practical surface area of the capacitor 164 is increased, which can increase the capacitance value of the capacitor 164. The electrode 611 is connected to the metal compound region 124b serving as the source or the drain of the transistor 160. The electrode 613 is overlapped with the electrode 611 with the dielectric layer 612 provided therebetween. The electrode 613 functions as the capacitor line CS. In addition, the metal compound region 124a of the transistor 160 and the electrode 142a are connected to each other through the electrode 602 in an opening formed in the insulating layer 128. The wiring 158 is connected to the electrode 142b in an opening 601 formed in the insulating layer 154, the insulating layer 150, and the gate insulating layer 146.

Figure 9B:
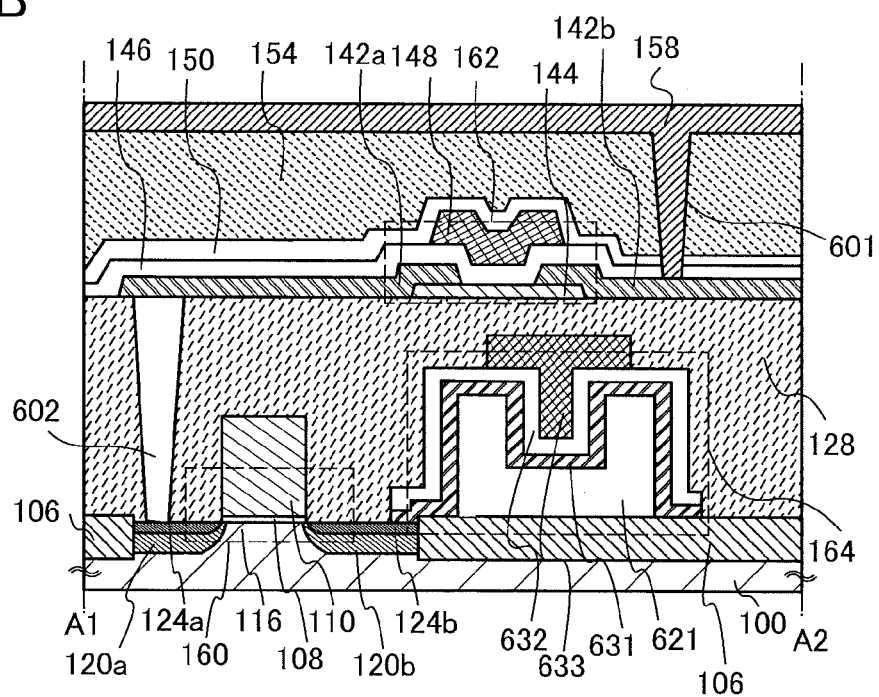

FIG. 9B shows an example where a stacked capacitor is used as the capacitor 164.

In FIG. 9B, the same portions as those in FIG. 9A are denoted by the same reference numerals as those in FIG. 9A and description thereof is omitted. The capacitor 164 in FIG. 9B is formed over an insulator 621 having an uneven shape. An electrode 631 and a dielectric layer 632 formed over the insulator 621 have a surface based on an uneven shape of the insulator 621. Thus, the practical surface area of the capacitor 164 is increased and the capacitance value of the capacitor 164 can be increased. The electrode 631 is connected to the metal compound region 124b serving as the source or the drain of the transistor 160. An electrode 633 is overlapped with the electrode 631 with the dielectric layer 632 provided therebetween. The electrode 633 functions as the capacitor line CS.

As the structures illustrated in FIGS. 5A to 5C, FIGS. 6A to 6C, FIGS. 7A to 7C, and FIGS. 8A to 8C, in the case where the gate insulating layer 146 of the transistor 162 is used as the dielectric layer of the capacitor 164, a structure where the transistor 160 and the transistor 162 are electrically connected in series in this order from the wiring 158 side between the wiring 158 serving as the bit line BL and the capacitor 164 is preferable. In the case where a trench capacitor or a stacked capacitor having such a structure illustrated in FIGS. 9A and 9B is used, the transistor 162 and the transistor 160 are preferably electrically connected in series in this order from the wiring 158 side between the wiring 158 serving as the bit line BL and the capacitor 164. In other words, a structure where the one of the source and the drain of the transistor 160 is electrically connected to the capacitor 164 without interposing the transistor 162 therebetween is preferable.

As an example, in the structures illustrated in FIGS. 5A to 5C, FIGS. 6A to 6C, FIGS. 7A to 7C, FIGS. 8A to 8C, and FIGS. 9A and 9B, the transistor 160 is formed over a semiconductor substrate. However, the transistor 160 is not limited thereto. The transistor 160 may be formed over an SOI substrate. Note that the term "SOI substrate" generally means a substrate where a silicon semiconductor layer is provided over an insulating surface. In this specification and the like, the term "SOI substrate" also means a substrate where a semiconductor layer including a material other than silicon is provided over an insulating surface. That is to say, a semiconductor layer included in the "SOI substrate" is not limited to a silicon semiconductor layer. In addition, the transistor 160 may be formed using a semiconductor layer such as silicon formed over a substrate with an insulating surface. The semiconductor layer may be formed by crystallization of a thin amorphous semiconductor layer which is provided over an insulating surface.

The structures, methods, and the like described in this embodiment can be combined as appropriate with any of the structures, methods, and the like described in the other embodiments.

Embodiment 3

In this embodiment, a method for manufacturing a semiconductor device according to an embodiment of the disclosed invention will be described with reference to FIGS. 10A to 10E, FIGS. 11A to 11C, FIGS. 12A to 12D, FIGS. 13A to 13D, FIGS. 14A to 14D, and FIGS. 15A to 15D.

An example of a method for manufacturing the semiconductor device illustrated in FIGS. 5A to 5C will be described. First, a method for manufacturing the transistor 160 in the lower portion will be described below with reference to FIGS. 10A to 10E and FIGS. 11A to 11C; then, a method for manufacturing the transistor 162 in the upper portion and the capacitor 164 will be described with reference to FIGS. 12A to 12D, FIGS. 13A to 13D, FIGS. 14A to 14D, and FIGS. 15A to 15D.

<Method for Manufacturing Transistor in Lower Portion>

Figure 10A:
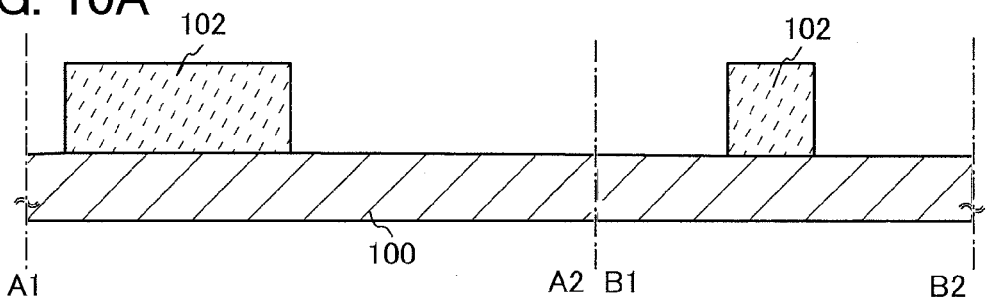
FIGS. 10A to 10E are diagrams illustrating a method for manufacturing a semiconductor device.

First, the substrate 100 including a semiconductor material is prepared (see FIG. 10A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material will be described. In particular, a single crystal semiconductor substrate such as a single crystal silicon substrate is preferably used as the substrate 100 including a semiconductor material because the semiconductor device can operate at higher speed.

Note that an impurity element which imparts a conductivity type may be added to a region which later functions as the channel formation region 116 of the transistor 160, in order to control the threshold voltage of the transistor. Here, an impurity element imparting a conductivity type is added so that the threshold voltage of the transistor 160 is positive. Boron, aluminum, gallium, or the like can be used as the impurity imparting the conductivity type in the case where a semiconductor material is silicon. Note that it is preferable to perform heat treatment after adding an impurity element which imparts a conductivity type, in order to activate the impurity element or reduce defects which may be generated in the substrate 100 during addition of the impurity element.

A protective layer 102 serving as a mask for forming an element isolation insulating layer is formed over the substrate 100 (see FIG. 10A). As the protective layer 102, for example, an insulating layer formed using silicon oxide, silicon nitride, silicon oxynitride or the like can be used.

Figure 10B:
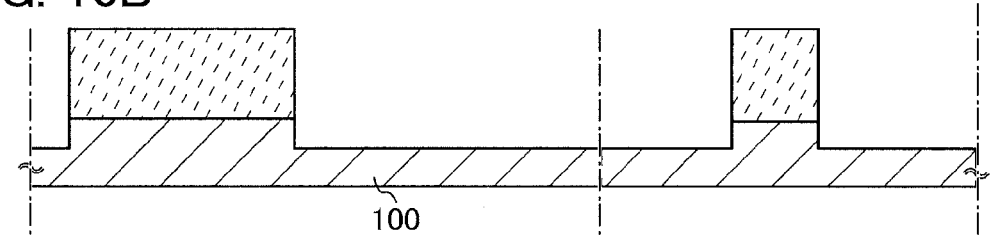

Next, part of the substrate 100 in a region (i.e., in an exposed region) which is not covered with the protective layer 102 is removed by etching of the substrate 100 using the protective layer 102 as a mask (see FIG. 10B). As the etching, dry etching is preferably performed, but wet etching can be performed. An etching gas and an etchant can be selected as appropriate depending on a material of layers to be etched.

Figure 10C:
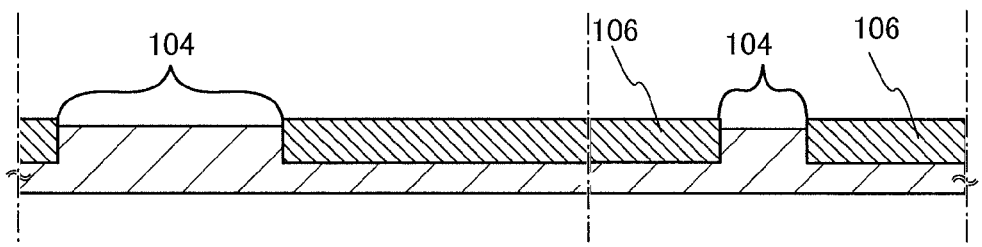

Then, an insulating layer is formed so as to cover the substrate 100, and the insulating layer is selectively removed; thus, the element isolation insulating layer 106 is foamed (see FIG. 10C). The insulating layer is formed using silicon oxide, silicon nitride, silicon oxynitride, or the like. As a method for removing the insulating layer, any of etching treatment, polishing treatment such as chemical mechanical polishing (CMP) treatment, and the like can be employed. Thus, a semiconductor region 104 isolated from the other semiconductor regions is formed. Note that the protective layer 102 is removed after the substrate 100 is etched using the protective layer 102 as a mask or after the element isolation insulating layer 106 is formed.

Next, an insulating layer is formed over a surface of the semiconductor region 104, and a layer including a conductive material is formed over the insulating layer.

The insulating layer is to be a gate insulating layer later and can be formed by performing heat treatment (e.g., thermal oxidation treatment or thermal nitridation treatment) on the surface of the semiconductor region 104, for example. Instead of heat treatment, high-density plasma treatment may be employed. The high-density plasma treatment can be performed using, for example, a mixed gas of a rare gas such as He, Ar, Kr, or Xe and a gas such as oxygen, nitrogen oxide, ammonia, nitrogen, or hydrogen. Needless to say, the insulating layer may be formed using CVD, sputtering, or the like. The insulating layer preferably has a single-layer structure or a stacked-layer structure of a film including silicon oxide, silicon oxynitride, silicon nitride, hafnium oxide, aluminum oxide, tantalum oxide, yttrium oxide, hafnium silicate (Hf-$Si_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering, method or a spin coating method can be employed. Note that in this embodiment, the case where the layer including a conductive material is formed using a metal material will be described.

Figure 10D:
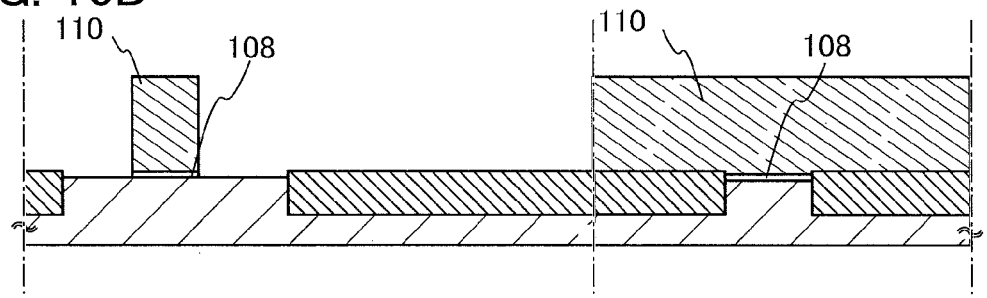

After that, the insulating layer and the layer including a conductive material are selectively etched to form the gate insulating layer 108 and the gate electrode 110 (see FIG. 10D).

Figure 10E:
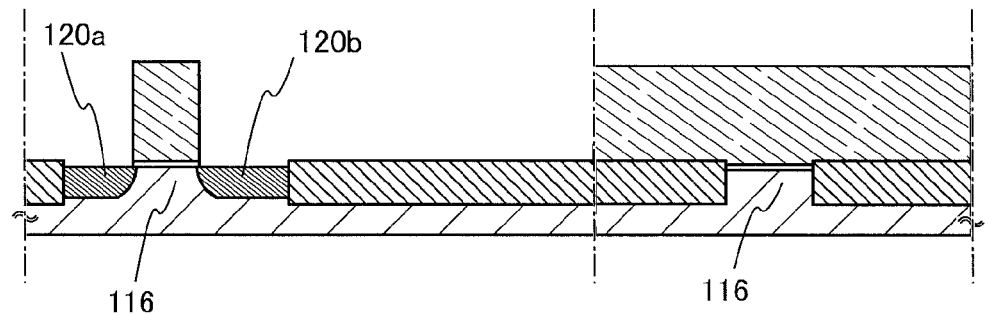

Phosphorus (P), arsenic (As), or the like is added to the semiconductor region 104 to form the channel formation region 116, the impurity region 120a, and the impurity region 120b (see FIG. 10E). Note that the transistor 160 is an n-channel transistor here, and an impurity element which imparts a conductivity type, such as phosphorus or arsenic, is added to the semiconductor region 104 in order to form an n-channel transistor. On the other hand, in the case where the transistor 160 is a p-channel transistor, an impurity element which imparts a conductivity type, such as boron (B) or aluminum (Al), is added to the semiconductor region 104; thus, the channel formation region 116, the impurity region 120a, and the impurity region 120b may be formed. Here, the concentration of added impurity elements which impart a conductivity type can be set as appropriate, but the concentration is preferably high in the case where the transistor 160 is drastically miniaturized.

Note that a side wall insulating layer is formed around the gate electrode 110, and a plurality of impurity regions (e.g., a heavily-doped impurity region not overlapped with a side wall insulating layer and a lightly-doped impurity region overlapped with the side wall insulating layer) to which impurity elements which impart a conductivity type are added at a different concentration is formed in the semiconductor region 104.

Figure 11A:
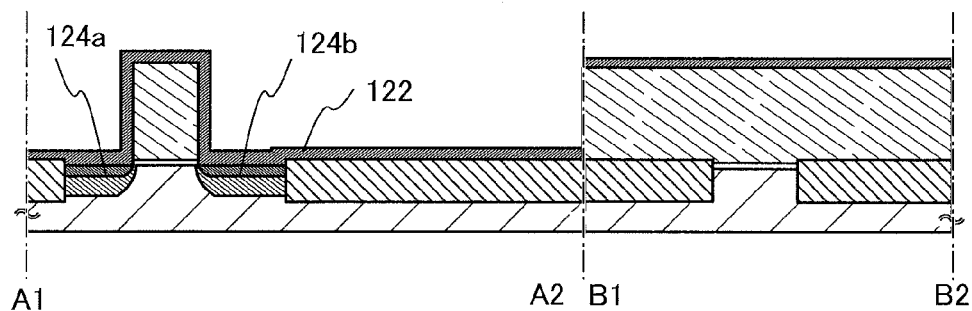
FIGS. 11A to 11C are diagrams illustrating the method for manufacturing the semiconductor device.

Then, a metal layer 122 is formed to cover the gate electrode 110, the impurity region 120a, and the impurity region 120b (see FIG. 11A). The metal layer 122 can be formed by a variety of methods, such as a vacuum deposition method, a sputtering method, and a spin coating method. The metal layer 122 is preferably formed using a metal material that reacts with a semiconductor material included in the semiconductor region 104 to be a low-resistance metal compound. Examples of such metal materials include titanium, tantalum, tungsten, nickel, cobalt, and platinum.

Then, heat treatment is performed so that the metal layer 122 reacts with the semiconductor material of the surface in the semiconductor region 104. Thus, the metal compound region 124a and the metal compound region 124b are formed in contact with the impurity region 120a and the impurity region 120b (see FIG. 11A), respectively. Note that when the gate electrode 110 is formed using polycrystalline silicon or the like, a metal compound region is also formed in a region of the gate electrode 110 in contact with the metal layer 122. The metal compound region is a region having sufficiently increased conductivity. The formation of the metal compound regions can properly reduce electric resistance of the source, the drain, or the like and improve element characteristics of the transistor 160.

As the heat treatment, irradiation with a flash lamp can be employed, for example. Needless to say, another heat treatment method may be used. However, a method by which heat treatment for an extremely short time can be achieved is preferably used in order to improve the controllability of chemical reaction in formation of the metal compound. Note that the metal layer 122 is removed after the pair of metal compound regions 124a and 124b are formed.

Figure 11B:
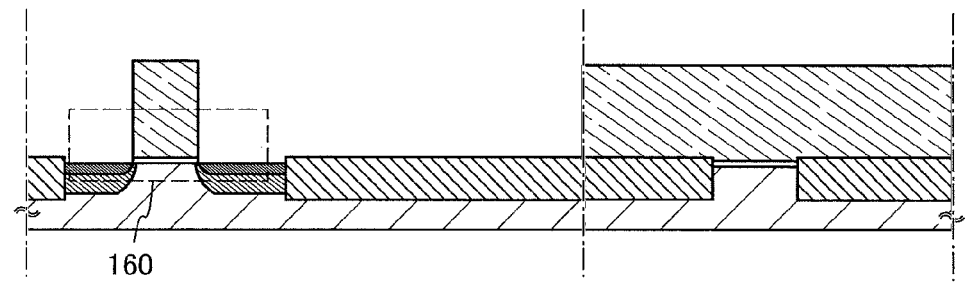

Through the above steps, the transistor 160 using the substrate 100 including a semiconductor material is formed (see FIG. 11B). The transistor 160 has a feature of operating at high speed. Therefore, with the use of transistor 160, data can be read at high speed in the semiconductor device.

Figure 11C:
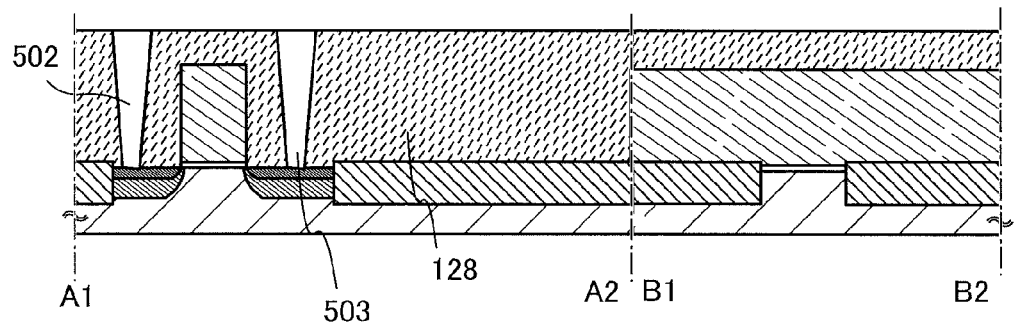

Next, the insulating layer 128 is formed so as to cover the transistor 160 formed in the above process (see FIG. 11C). The insulating layer 128 can be formed using a material including an inorganic insulating material such as silicon oxide, silicon oxynitride, silicon nitride, or aluminum oxide. In particular, a material with a low dielectric constant (a low-k material) is preferably used for the insulating layer 128, because capacitance caused by overlap of electrodes or wirings can be sufficiently reduced. Note that the insulating layer 128 may be a porous insulating layer formed using any of those materials. A porous insulating layer has a lower dielectric constant than an insulating layer with high density, and thus allows a further reduction in capacitance generated by electrodes or wirings. Further, the insulating layer 128 can be formed using an organic insulating material such as polyimide or acrylic. Note that although the insulating layer 128 has a single-layer structure here, one embodiment of the disclosed invention is not limited to this. The insulating layer 128 may have a stacked structure of two or more layers; for example, a stacked structure of a layer including an organic insulating material and a layer including an inorganic insulating material may be used.

Openings which reach the metal compound region 124a and the metal compound region 124b are formed in the insulating layer 128, and the electrode 502 and the electrode 503 are formed using a conductive layer. The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy containing any of these elements as a component; or the like can be used. Any of manganese, magnesium, zirconium, beryllium, neodymium, and scandium, or a material including any of these in combination may be used. The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order.

After that, as treatment performed before the transistor 162 and the capacitor 164 are formed, CMP treatment is performed on a surface of the insulating layer 128 (see FIG. 11C). Etching treatment or the like can be employed instead of the CMP treatment. Note that it is preferable to planarize the surface of the insulating layer 128, the surface of the electrode 502, and the surface of the electrode 503 as much as possible in order to improve the characteristics of the transistor 162. For example, the surface of the insulating layer 128 preferably has a root-mean-square (RMS) roughness of 1 nm or less.

Note that before or after the steps described with reference to FIGS. 10A to 10E and FIGS. 11A to 11C, a step of forming an additional electrode, wiring, semiconductor layer, insulating layer, or the like may be performed. For example, a multilayer wiring structure in which an insulating layer and a conductive layer are stacked is employed as a wiring structure, whereby a highly integrated semiconductor device can be provided.

<Method for Manufacturing in Upper Portion>

Next, methods for manufacturing the upper transistor 162 and the capacitor 164 will be described. A manufacturing method corresponding to the structure illustrated in FIGS. 5A to 5C is described with reference to FIGS. 12A to 12D. A manufacturing method corresponding to the structure illustrated in FIGS. 6A to 6C is described with reference to FIGS. 13A to 13D. A manufacturing method corresponding to the structure illustrated in FIGS. 7A to 7C is described with reference to FIGS. 14A to 14D. A manufacturing method corresponding to the structure illustrated in FIGS. 8A to 8C is described with reference to FIGS. 15A to 15D.

At first, a method for manufacturing the structure in FIGS. 5A to 5C will be described with reference to FIGS. 12A to 12D.

Figure 12A:
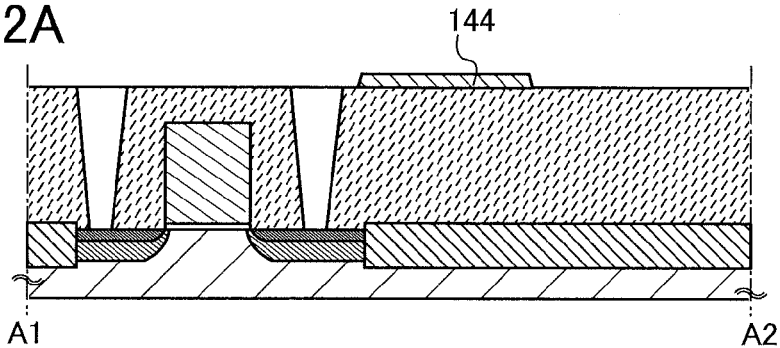
FIGS. 12A to 12D are diagrams illustrating the method for manufacturing the semiconductor device.

An oxide semiconductor layer is formed over the insulating layer 128, the electrode 502, and the electrode 503, and is selectively etched to form the oxide semiconductor layer 144 (see FIG. 12A).

The oxide semiconductor layer 144 preferably contains at least indium (In) or zinc (Zn). In particular, In and Zn are preferably contained. As a stabilizer for reducing variation in electric characteristics of a transistor including the oxide semiconductor layer, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor included in the oxide semiconductor layer 144, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that in this specification and the like, an In—Ga—Zn-based oxide means, for example, an oxide including In, Ga, and Zn, and there is no limitation on the ratio of In:Ga:Zn. Further, the In—Ga—Zn-based oxide may contain a metal element other than In, Ga, and Zn. Note that an In—Ga—Zn-based oxide has sufficiently high resistance when there is no electric field and thus off-state current can be sufficiently reduced. In addition, also having high field-effect mobility, the In—Ga—Zn-based oxide is suitable for a semiconductor material used in a semiconductor device.

Alternatively, a material represented by $InMO_3(ZnO)_m$ (m>0 is satisfied, and m is not an integer) may be used as an oxide semiconductor. Here, M represents one or more metal elements selected from Ga, Fe, Mn, and Co. For example, M may be Ga, Ga and Al, Ga and Fe, Ga and Ni, Ga and Mn, Ga and Co, or the like. Still alternatively, a material represented by $In_3SnO_5(ZnO)_n$ (n>0 is satisfied, and n is an integer) may be used as an oxide semiconductor. Note that the above-described compositions are derived from the crystal structures that the oxide semiconductor material can have and are only examples.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to be appropriate.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

Further, the oxide semiconductor layer 144 may be either amorphous or crystalline. In the latter case, the oxide semiconductor layer 144 may be either single crystalline or polycrystalline, may have a structure in which part of the oxide semiconductor layer 144 is crystalline, may have an amorphous structure including a crystalline portion, or may have a non-amorphous structure. As an example of a structure in which part of the oxide semiconductor layer 144 is crystalline, an oxide including a crystal with c-axis alignment (also referred to as C-Axis Aligned Crystal (CAAC)), which has a triangular or hexagonal atomic arrangement when seen from the direction of an a-b plane, a surface, or an interface may be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced as compared to in an oxide semiconductor in an amorphous state and when a surface flatness is improved, mobility higher than that of the oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that the Ra refers to a centerline average roughness obtained by three-dimensionally expanding a centerline average roughness defined by JIS B0601 so as to be applied to a plane to be measured. The Ra can be expressed as an "average value of absolute values of deviations from a reference surface to a designated surface", and is defined with the following formula.

$$Ra = \frac{1}{S_0} \int_{x_2}^{x_1} \int_{y_2}^{y_1} |f(x,y) - Z_0| dx dy \qquad \text{[FORMULA 1]}$$

In Formula 1, $S_0$ represents an area of a plane to be measured (a rectangular region which is defined by four points represented by coordinates $(x_1, y_1)$, $(x_2, y_2)$, $(x_2, y_1)$, and $(x_2, y_2)$), and $Z_0$ represents an average height of the plane to be measured. Ra can be measured using an atomic force microscope (AFM).

The oxide semiconductor layer 144 can be formed using an oxide semiconductor film. The oxide semiconductor film can be formed by a sputtering method. In the case where an In—Zn-based oxide semiconductor film is formed by a sputtering method, a target has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target which has an atomic ratio of In:Zn:O=X:Y:Z, an inequality of Z>1.5X+Y is satisfied.

In the case where an In—Sn—Zn-based oxide semiconductor film is formed by a sputtering method, a target which has a composition ratio of In:Sn:Zn=1:2:2, 2:1:3, 1:1:1, 20:45:35, or the like in an atomic ratio is used. In the case where an In—Ga—Zn-based oxide semiconductor film is formed by a sputtering method, a target which has a composition ratio of In:Ga:Zn=1:1:0.5, 1:1:1, or 1:1:2 in an atomic ratio can be used.

The atmosphere in which the oxide semiconductor layer 144 is formed is preferably a rare gas (typically argon) atmosphere, an oxygen atmosphere, or a mixed atmosphere containing a rare gas (typically argon) and oxygen. Specifically, it is preferable to use a high-purity gas atmosphere, for example, from which an impurity such as hydrogen, water, a hydroxyl group, or hydride is removed to a concentration of 1 ppm or less (preferably, 10 ppb or less).

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film. Alkali metal is not an element included in an oxide semiconductor, and therefore, is an impurity. Also, alkaline earth metal is an impurity in the case where alkaline earth metal is not included in an oxide semiconductor. Alkali metal, in particular, Na becomes $Na^+$ when an insulating film in contact with the oxide semiconductor layer is an oxide and Na diffuses into the insulating film. In addition, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Therefore, when the hydrogen concentration in the oxide semiconductor layer is less than or equal to $1\times10^{18}/cm^3$, preferably less than or equal to $1\times10^{17}/cm^3$, the concentration of the above impurity is preferably reduced. Specifically, a measurement value of a Na concentration by secondary ion mass spectrometry is preferably less than or equal to $5\times10^{16}/cm^3$, more preferably less than or equal to $1\times10^{16}/cm^3$, still more preferably less than or equal to $1\times10^{15}/cm^3$. In a similar manner, a measurement value of a Li concentration is preferably less than or equal to $5\times10^{15}/cm^3$, more preferably less than or equal to $1\times10^{15}/cm^3$. In a similar manner, a measurement value of a K concentration is preferably less than or equal to $5\times10^{15}/cm^3$, more preferably less than or equal to $1\times10^{15}/cm^3$.

In forming the oxide semiconductor layer 144, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of the object in the formation of the oxide semiconductor layer 144 may be room temperature (25° C.±10° C.). Then, a sputtering gas from which hydrogen, water, and the like are removed is introduced into the treatment chamber while moisture in the treatment chamber is removed, whereby the oxide semiconductor layer 144 is formed using the above target. By forming the oxide semiconductor layer 144 while heating the object, impurities in the oxide semiconductor layer 144 can be reduced. In addition, damage on the oxide semiconductor layer 144 due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By performing evacuation with the use of a cryopump or the like, hydrogen, water, and the like can be removed from the treatment chamber; thus, the impurity concentration in the oxide semiconductor layer 144 can be reduced.

The oxide semiconductor layer 144 can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere of oxygen and argon. Note that a pulsed direct current (DC) power source is preferably used because dust (such as powder substances generated in film formation) can be reduced and the film thickness of the oxide semiconductor layer 144 can be made uniform.

Note that before the oxide semiconductor layer 144 is formed by sputtering, reverse sputtering in which plasma is generated with an argon gas introduced may be performed so that a material attached to a formation surface (e.g., a surface of the insulating layer 128) is removed. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

In this embodiment, the oxide semiconductor layer 144 is formed by sputtering using an In—Ga—Zn—O-based metal oxide target. The thickness of the oxide semiconductor layer 144 ranges from 1 nm to 50 nm, preferably from 2 nm to 20 nm, more preferably from 3 nm to 15 nm. Since the appropriate thickness differs depending on an oxide semiconductor material or the like, the thickness of the oxide semiconductor layer 144 can be selected in accordance with a material to be used. Note that when the surface of the insulating layer 128 is uniformed as much as possible as described above, even in the case of the oxide semiconductor layer 144 with a small thickness, the cross section of the portion corresponding to the channel formation region in the oxide semiconductor layer 144 can be flat. When the portion corresponding to the channel formation region in the oxide semiconductor layer 144 has a planar cross-sectional shape, the leakage current of the transistor 162 can be lower than that in the case where the oxide semiconductor layer 144 does not have a planar cross-sectional shape.

After the oxide semiconductor layer 144 is formed, heat treatment (first heat treatment) is preferably performed on the oxide semiconductor layer 144. Through the first heat treatment, hydrogen (including water or a hydroxyl group) in the oxide semiconductor layer 144 can be removed. The temperature of the first heat treatment is, for example, higher than or equal to 300° C. and lower than 550° C., preferably higher than or equal to 400° C. and lower than or equal to 500° C.

The first heat treatment can be performed in such a manner that, for example, an object to be processed is introduced into an electric furnace in which a resistance heating element or the like is used and heated at 450° C. in a nitrogen atmosphere for an hour. During the first heat treatment, the oxide semiconductor layer is not exposed to the atmosphere to prevent the entry of water or hydrogen.

The heat treatment apparatus is not limited to the electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect level in energy gap due to oxygen deficiency can be reduced by performing the first heat treatment in an atmosphere including oxygen. Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

Impurities are reduced through the first heat treatment.

The above heat treatment (first heat treatment) can be referred to as dehydration treatment, dehydrogenation treatment, or the like because of its effect of removing hydrogen, water, and the like. Such heat treatment may be performed at the following timing: after the formation of the oxide semiconductor layer, after the formation of the gate insulating layer 146 formed later, after the formation of the gate electrode 148 formed later, or the like. Such heat treatment may be performed once or plural times.

The oxide semiconductor layer may be etched either before or after the heat treatment. In view of miniaturization of elements, dry etching is preferably used; however, wet etching may be used. An etching gas and an etchant can be selected as appropriate depending on a material to be etched.

Figure 12B:
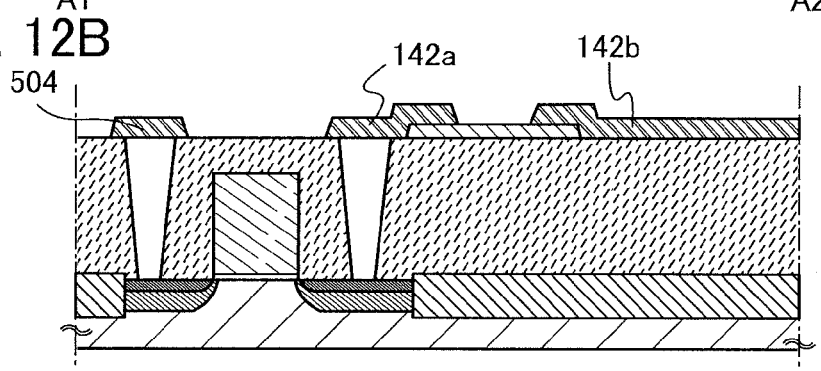

Next, a conductive layer is formed over the oxide semiconductor layer 144 and is selectively etched to form the electrode 142a, the electrode 142b, and the electrode 504 (see FIG. 12B). Note that the electrode 142a is provided in contact with the electrode 503. The electrode 504 is provided in contact with the electrode 502.

The conductive layer can be formed by PVD such as a sputtering method, or a CVD method such as a plasma CVD method. As a material for the conductive layer, an element selected from aluminum, chromium, copper, tantalum, titanium, molybdenum, or tungsten; an alloy containing any of these elements as a component; or the like can be used. Further, one or more materials selected from manganese, magnesium, zirconium, beryllium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the electrodes 142a and 142b having a tapered shape edge.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials including silicon or silicon oxide can be used.

Although either dry etching or wet etching may be performed as the etching of the conductive layer, dry etching with high controllability is preferably used for miniaturization. The etching may be performed so that the electrode 142a and the electrode 142b to be formed have a tapered shape edge. The taper angle can be, for example, greater than or equal to 30° and less than or equal to 60°.

The channel length (L) of the upper transistor 162 is determined by a distance between a lower edge portion of the electrode 142a and a lower edge portion of the electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor 162 can be set to less than 2 μm, preferably in the range of 10 nm to 350 nm (0.35 μm), in which case the circuit can operate at higher speed.

The electrode 142b is one of the pair of electrodes of the capacitor 164.

Note that an insulating layer serving as a base of the transistor 162 may be provided over the insulating layer 128. The insulating layer can be formed by a PVD method, a CVD method, or the like.

Figure 12C:
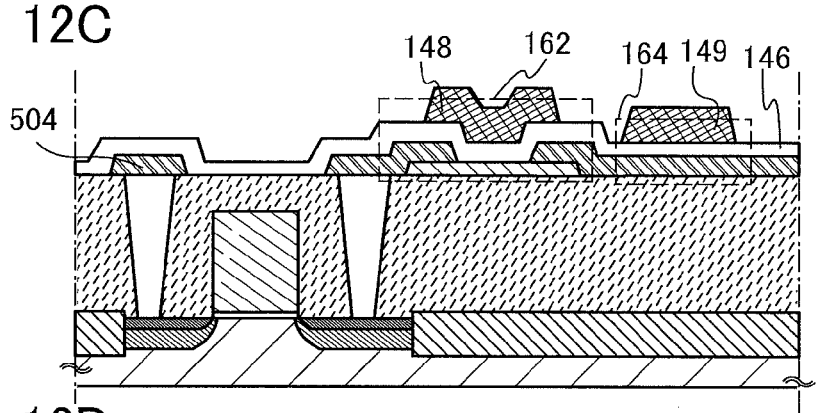

Next, the gate insulating layer 146 is formed so as to cover the electrode 142a, the electrode 142b, the electrode 504, and the oxide semiconductor layer 144 (see FIG. 12C).

The gate insulating layer 146 can be formed by a CVD method, a sputtering method, or the like. The gate insulating layer 146 is preferably formed by a method in which hydrogen is sufficiently reduced because the gate insulating layer 146 is in contact with the oxide semiconductor layer 144. The gate insulating layer 146 is preferably formed so as to contain silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a stacked structure. The thickness of the gate insulating layer 146 is not particularly limited, but the gate insulating layer 146 is preferably thin in the case where the semiconductor device is miniaturized. For example, in the case where silicon oxide is used as the gate insulating layer 146, the thickness of the gate insulating layer 146 can be set to greater than or, equal to 1 nm and less than or equal to 100 nm, preferably greater than or equal to 10 nm and less than or equal to 50 mm.

As described above, when the gate insulating layer 146 is thin, there is a problem of gate leakage of the transistor 162 due to a tunneling effect or the like. In order to solve the problem of gate leakage, a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added is preferably used for the gate insulating layer 146. By using a high-k material for the gate insulating layer 146, electric characteristics can be ensured and the thickness can be large to prevent gate leakage. For example, the relative permittivity of hafnium oxide is approximately 15, which is much higher than that of silicon oxide which is 3 to 4. With the use of such a high dielectric constant material, the gate insulating layer 146 having an equivalent oxide thickness of less than 15 nm, preferably greater than or equal to 2 nm and less than or equal to 10 nm, can be easily realized. Note that a layered structure of a film containing a high-k material and a film containing any one of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The temperature of the heat treatment is set in the range of 200° C. to 450° C., preferably 250° C. to 350° C. For example, the heat treatment may be performed at 250° C. for 1 hour in a nitrogen atmosphere. The second heat treatment can reduce variation in electric characteristics of the transistor 162. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate electrode 148 is formed. Alternatively, the second heat treatment may be performed following the first heat treatment, the first heat treatment may double as the second heat treatment, or the second heat treatment may double as the first heat treatment.

Note that this embodiment is not limited to the above process. After dehydration treatment or dehydrogenation treatment is performed, a step of adding oxygen to the oxide semiconductor layer 144 may be performed. In this manner, oxygen defects in the oxide semiconductor layer 144 and the like can be reduced and thus the oxide semiconductor layer 144 can be an i-type or substantially i-type oxide semiconductor layer. The addition of oxygen can be performed in such a manner, for example, that an insulating film including a region where the amount of oxygen greater than that in the stoichiometric composition ratio is formed in contact with the oxide semiconductor layer 144, and then heating is performed. In this manner, excessive oxygen in the insulating film can be supplied to the oxide semiconductor layer 144. Thus, oxygen is excessively contained in the oxide semiconductor layer 144 (so that the amount of oxygen is greater than or equal to that in the stoichiometric composition ratio). Oxygen contained excessively exists, for example, between lattices of a crystal included in the oxide semiconductor film (oxide semiconductor layer).

Note that the insulating film including a region where the amount of oxygen is greater than that in the stoichiometric composition ratio may be applied to either the insulating film located on the upper side of the oxide semiconductor layer 144 or the insulating film located on the lower side of the oxide semiconductor layer 144 of the insulating films in contact with the oxide semiconductor layer 144; however, it is preferable to apply such an insulating film to both of the insulating films in contact with the oxide semiconductor layer 144. The above-described effect can be enhanced with a structure where the insulating films which each include a region where the amount of oxygen is greater than that in the stoichiometric composition ratio are used as the insulating films in contact with the oxide semiconductor layer 144 and located on the upper side and the lower side of the oxide semiconductor layer 144, in order that the oxide semiconductor layer 144 is sandwiched between the insulating films.

Here, the insulating film including a region where the amount of oxygen is greater than that in the stoichiometric composition ratio may be a single-layer insulating film or a plurality of insulating films stacked. Note that it is preferable that the insulating film include impurities such as moisture and hydrogen as little as possible. When hydrogen is contained in the insulating film, entry of the hydrogen to the oxide semiconductor layer 144 or extraction of oxygen from the oxide semiconductor layer 144 by the hydrogen occurs, whereby the oxide semiconductor layer 144 has lower resistance (has n-type conductivity); thus, a parasitic channel might be formed. Therefore, it is important that a film formation method in which hydrogen is not used be employed in order to form the insulating film containing as little hydrogen as possible. In addition, a material having a high barrier property is preferably used for the insulating film. For example, as the insulating film having a high barrier property, a silicon nitride film, a silicon nitride oxide film, an aluminum nitride film, an aluminum oxide film, an aluminum nitride oxide film, or the like can be used. When a plurality of insulating films stacked is used, an insulating film having a low proportion of nitrogen, such as a silicon oxide film or a silicon oxynitride film, is formed so that the oxide semiconductor layer 144 is closer to the insulating film having a low proportion of nitrogen than the insulating film having a high barrier property. Then, the insulating film having a high barrier property is formed so as to overlap with the oxide semiconductor layer 144 with the insulating film having a low proportion of nitrogen between the insulating film having a high barrier property and the oxide semiconductor layer 144. When the insulating film having a high barrier property is used, impurities such as moisture or hydrogen can be prevented from entering the oxide semiconductor layer 144, or the interface between the oxide semiconductor layer 144 and another insulating film and the vicinity thereof. In addition, the insulating film having a lower proportion of nitrogen, such as a silicon oxide film or a silicon oxynitride film, formed in contact with the oxide semiconductor layer 144 can prevent the insulating film formed using a material having a high barrier property from being in direct contact with the oxide semiconductor layer 144.

Alternatively, the addition of oxygen after moisture or hydrogen in the oxide semiconductor layer 144 is eliminated may be performed by heat treatment on the oxide semiconductor layer 144 in an oxygen atmosphere. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, and the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Further alternatively, the addition of oxygen after moisture or hydrogen in the oxide semiconductor layer 144 is eliminated may be performed by an ion implantation method or an ion doping method. For example, oxygen which is made into a plasma state with a microwave at 2.45 GHz may be added to the oxide semiconductor layer 144.

The gate insulating layer 146 serves as a dielectric layer of the capacitor 164.

Note that an insulating layer in contact with the oxide semiconductor layer 144 (for example, the gate insulating layer 146 and the insulating layer 128 in the structures illustrated in FIGS. 5A to 5C and FIGS. 6A to 6C, and the gate insulating layer 146 and the insulating layer 150 in the structures illustrated in FIGS. 7A to 7C and FIGS. 8A to 8C) is preferably formed using an insulating material containing a Group 13 element and oxygen. Many of oxide semiconductor materials contain Group 13 elements, and an insulating material containing a Group 13 element is compatible with an oxide semiconductor. Thus, when an insulating material containing a Group 13 element is used for an insulating layer in contact with an oxide semiconductor, the state of the interface with the oxide semiconductor can be kept well.

An insulating material containing a Group 13 element refers to an insulating material containing one or more Group 13 elements. As the insulating material containing an element belonging to Group 13, a metal oxide such as gallium oxide, aluminum oxide, aluminum gallium oxide, and gallium aluminum oxide can be given, for example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating layer in contact with the oxide semiconductor layer 144 containing gallium, a material containing gallium oxide may be used for the insulating layer, so that favorable characteristics can be kept at the interface between the oxide semiconductor layer 144 and the insulating layer. When the oxide semiconductor layer 144 and the insulating layer including gallium oxide are provided in contact with each other, hydrogen pileup at the interface between the oxide semiconductor layer 144 and the insulating layer can be reduced, for example. Note that a similar effect can be obtained in the case where an element in the same group as a constituent element of the oxide semiconductor is used in an insulating layer. For example, it is effective to form the insulating layer with the use of a material including aluminum oxide. Note that aluminum oxide has a property of not easily transmitting water. Thus, it is preferable to use a material including aluminum oxide in terms of preventing entry of water to the oxide semiconductor layer 144.

Part of or the whole of the insulating layer in contact with the oxide semiconductor layer 144 preferably includes oxygen in a proportion higher than the insulating material included in an insulating layer in the stoichiometric composition by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating layer in contact with the oxide semiconductor layer 144 is formed of gallium oxide, the composition of gallium oxide can be set to be $Ga_2O_x$ ($x=3+\alpha$, $0<\alpha<1$) by heat treatment in an oxygen atmosphere or oxygen doping.

In the case where the insulating layer in contact with the oxide semiconductor layer 144 is formed of aluminum oxide, the composition of aluminum oxide can be set to be $Al_2O_x$ ($x=3+\alpha$, $0<\alpha<1$) by heat treatment in an oxygen atmosphere or oxygen doping.

In the case where the insulating layer in contact with the oxide semiconductor layer 144 is formed of gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or oxygen doping.

By oxygen doping treatment, an insulating layer which includes a region where the proportion of oxygen is higher than the insulating material included in the insulating layer in the stoichiometric composition can be formed. When such an insulating layer is in contact with the oxide semiconductor layer, oxygen that exists excessively in the insulating layer is supplied to the oxide semiconductor layer, and oxygen deficiency in the oxide semiconductor layer or at an interface between the oxide semiconductor layer and the insulating layer is reduced. Thus, an i-type or substantially i-type oxide semiconductor layer can be formed.

The insulating layer which includes a region where the proportion of oxygen is higher than the insulating material included in the insulating layer in the stoichiometric composition may be applied to either the insulating layer positioned on the upper side of the oxide semiconductor layer or the insulating layer positioned on the lower side of the oxide semiconductor layer of the insulating layers in contact with the oxide semiconductor layer 144. However, it is preferable to apply such an insulating layer to both of the insulating layers in contact with the oxide semiconductor layer 144. The advantageous effect described above can be further enhanced with a structure in which the insulating layers each including a region where the proportion of oxygen is higher than the insulating material included in the insulating layer in the stoichiometric composition are used as the insulating films in contact with and on the upper side and the lower side of the oxide semiconductor layer 144, in order that the oxide semiconductor layer 144 may be interposed between the insulating layers.

The insulating layers on the upper side and the lower side of the oxide semiconductor layer 144 may include the same constituent elements or different constituent elements. For example, the insulating layers on the upper side and the lower side may be both formed using gallium oxide whose composition is $Ga_2O_x$ ($x=3+\alpha$, $0<\alpha<1$). Alternatively, one of the insulating layers on the upper side and the lower side may be formed using $Ga_2O_x$ ($x=3+\alpha$, $0<\alpha<1$) and the other may be formed of aluminum oxide whose composition is $Al_2O_x$ ($x=3+\alpha$, $0<\alpha<1$).

The insulating layer in contact with the oxide semiconductor layer 144 may be formed by stacking insulating layers which include a region where the proportion of oxygen is higher than the insulating material included in the insulating layer in the stoichiometric composition. For example, the insulating layer on the upper side of the oxide semiconductor layer 144 may be formed as follows: gallium oxide whose composition is $Ga_2O_x$ ($x=3+\alpha$, $0<\alpha<1$) is formed and gallium aluminum oxide (aluminum gallium oxide) whose composition is $Ga_xAl_{2-x}O_{3+\alpha}$ ($0<x<2$, $0<\alpha<1$) may be formed thereover. Note that the insulating layer on the lower side of the oxide semiconductor layer 144 may be formed by stacking insulating layers which include a region where the proportion of oxygen is higher than the insulating material included in the insulating layer in the stoichiometric composition. Further, both of the insulating layers on the upper side and the lower side of the oxide semiconductor layer 144 may be formed by stacking insulating layers which include a region where the proportion of oxygen is higher than the insulating material included in the insulating layer in the stoichiometric composition.

Next, the gate electrode 148 and the electrode 149 are formed over the gate insulating layer 146 (see FIG. 12C).

The gate electrode 148 and the electrode 149 can be formed by forming a conductive layer over the gate insulating layer 146 and then selectively etching the conductive layer. The conductive layer to be the gate electrode 148 and the electrode 149 can be formed by a PVD method such as a sputtering method, or a CVD method such as a plasma CVD method. The details of the material and the like are similar to those of the electrode 142a, the electrode 142b, and the like; thus, the description thereof can be referred to.

The electrode 149 is the other of the pair of electrodes of the capacitor 164.

Through the above steps, the transistor 162 including the highly purified oxide semiconductor layer 144 and the capacitor 164 are completed (see FIG. 12C). By the above-described manufacturing method, in the oxide semiconductor layer 144, the hydrogen concentration is sufficiently reduced so that the oxide semiconductor layer 144 is highly purified and in which defect states in an energy gap due to oxygen deficiency are reduced by sufficiently supplying oxygen. The oxide semiconductor layer 144 formed in such a manner is intrinsic (i-type) or substantially intrinsic (i-type). The transistor 162 with excellent off-state current characteristics can be obtained by using such an oxide semiconductor layer 144 is used for the channel formation region.

Figure 12D:
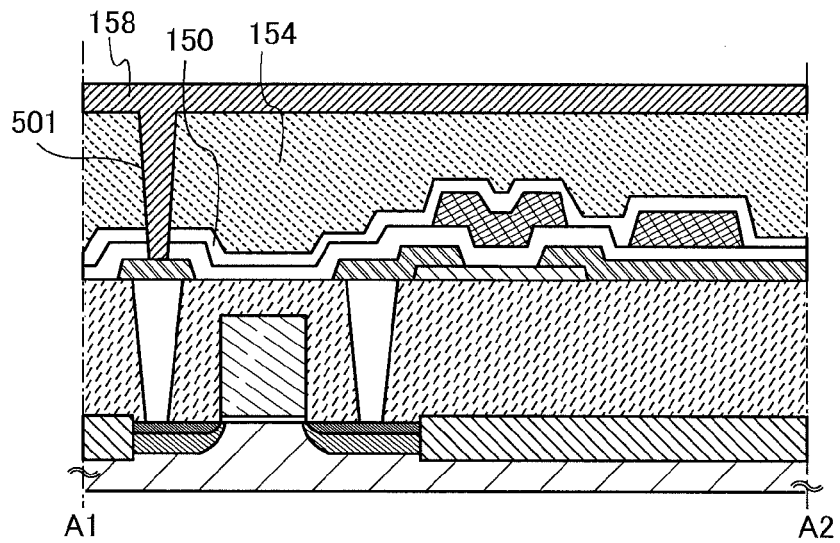

Next, the insulating layer 150 and the insulating layer 154 are formed over the gate insulating layer 146, the gate electrode 148, and the electrode 149 (see FIG. 12D). The insulating layer 150 and the insulating layer 154 can be formed by a PVD method, a CVD method, or the like. The insulating layer 150 and the insulating layer 154 can be formed so as to have a single-layer structure or a stacked-layer structure using a material including an inorganic insulating material such as silicon oxide, silicon oxynitride, silicon nitride, hafnium oxide, or aluminum oxide.

Note that for the insulating layer 154, a material with a low dielectric constant may be preferably used or a structure with a low dielectric constant (e.g., a porous structure) may be preferably employed. This is because by reducing the dielectric constant of the insulating layer 154, capacitance between wirings and electrodes can be reduced, which will increase operation speed.

Note that the insulating layer 154 is preferably formed so as to have a planarized surface. By forming the insulating layer 154 having a planarized surface, an electrode, a wiring, or the like can be favorably formed over the insulating layer 154 even in the case where the semiconductor device is miniaturized, for example. The insulating layer 154 can be planarized by a method such as chemical mechanical polishing (CMP).

Next, the opening 501 reaching the electrode 504 is formed in the insulating layer 150 and the insulating layer 154. After that, the wiring 158 is formed (see FIG. 12D). The wiring 158 is formed by forming a conductive layer by a PVD method typified by a sputtering method or a CVD method such as a plasma CVD method and then patterning the conductive layer. As a material for the conductive layer, an element selected from aluminum, chromium, copper, tantalum, titanium, molybdenum, and tungsten; an alloy containing any of these elements as a component; or the like can be used. Any of manganese, magnesium, zirconium, beryllium, neodymium, and scandium, or a material including any of these in combination may be used. The details are similar to those of the electrode 142a, the electrode 142b, and the like. Note that an electrode may be formed in the opening 501, and the wiring 158 may be formed in contact with the electrode.

Through the above steps, the semiconductor device having the structure illustrated in FIGS. 5A to 5C can be manufactured.

Then, a method for manufacturing the structure in FIGS. 6A to 6C will be described with reference to FIGS. 13A to 13D.

The manufacturing method illustrated in FIGS. 12A to 12D and that in FIGS. 13A to 13D are different in a method for manufacturing the oxide semiconductor layer 144, the electrode 142a, and the electrode 142b. The manufacturing method illustrated in FIGS. 13A to 13D is similar to that in FIGS. 12A to 12D except the method for manufacturing the oxide semiconductor layer 144, the electrode 142a, and the electrode 142b; therefore, the description thereof is omitted.

Figure 13A:
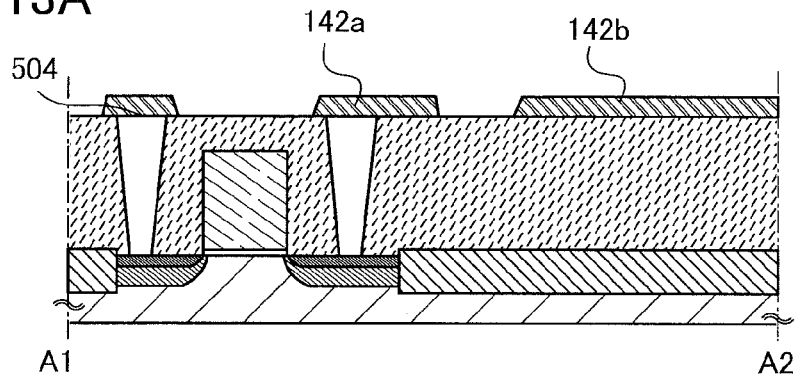
FIGS. 13A to 13D are diagrams illustrating a method for manufacturing a semiconductor device.

A conductive layer is formed over the electrode 502, the electrode 503, and the insulating layer 128 and is selectively etched, whereby the electrode 142a, the electrode 142b, and the electrode 504 are formed (see FIG. 13A). The conductive layer can be formed using a material and a method which are similar to those of the conductive layer which is used to form the electrode 142a, the electrode 142b, and the electrode 504 in the manufacturing method illustrated in FIGS. 12A to 12D, and thus the description thereof is omitted.

Figure 13B:
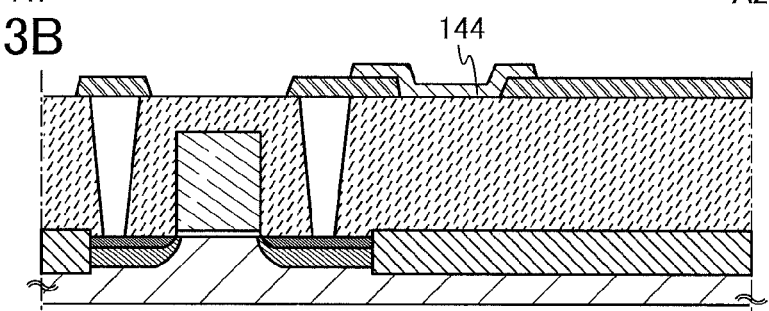

Next, the oxide semiconductor layer 144 is formed over the electrode 142a and the electrode 142b (see FIG. 13B). The oxide semiconductor layer 144 is formed using a material and a method which are similar to the oxide semiconductor layer for forming the oxide semiconductor layer 144 in the manufacturing method illustrated in FIGS. 12A to 12D; therefore, the description thereof is omitted.

Figure 13C:
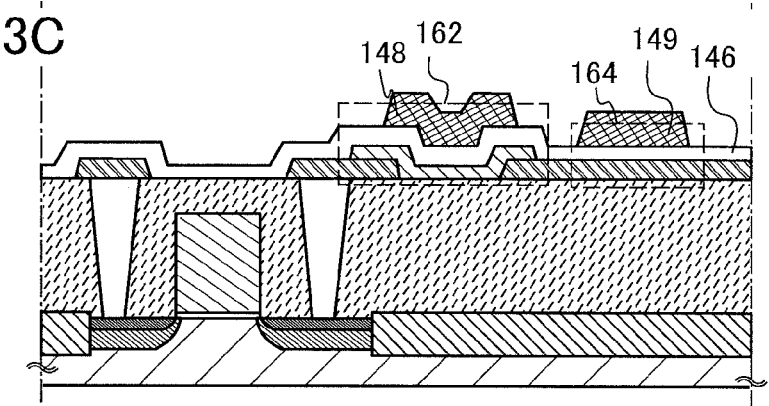
Figure 13D:
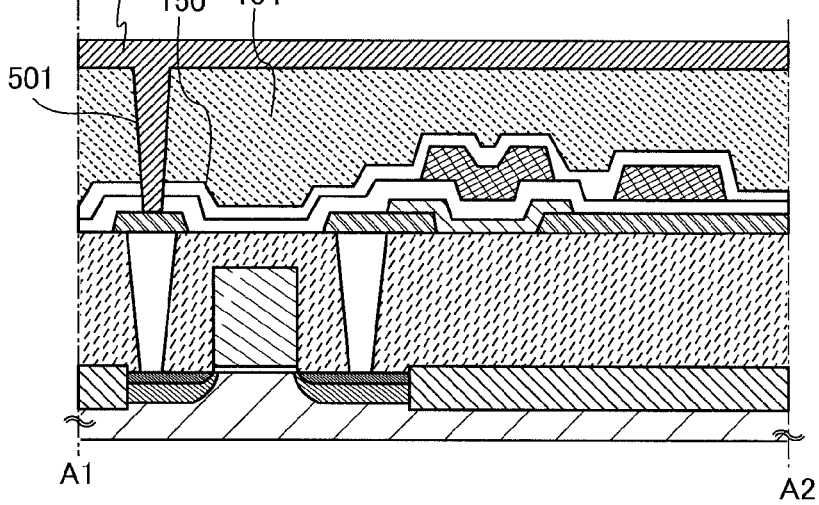

Next, the gate insulating layer 146 is formed to cover the electrode 142a, the electrode 142b, the electrode 504, and the oxide semiconductor layer 144 (see FIG. 13C). The manufacturing steps following the above steps are similar to those illustrated in FIGS. 12A to 12D; therefore, the description thereof is omitted.

Through the above steps, the semiconductor device having the structure illustrated in FIGS. 6A to 6C can be manufactured.

Next, a manufacturing method for the structure illustrated in FIGS. 7A to 7C is described with reference to FIGS. 14A to 14D.

The manufacturing method illustrated in FIGS. 12A to 12D and the manufacturing method illustrated in FIGS. 14A to 14D are different from each other in the manufacturing methods of the gate electrode 148, the electrode 149, the electrode 504, and the gate insulating layer 146. The manufacturing method illustrated in FIGS. 14A to 14D except for the above methods is the same as that in FIGS. 12A to 12D, and thus the description thereof is omitted.

Figure 14A:
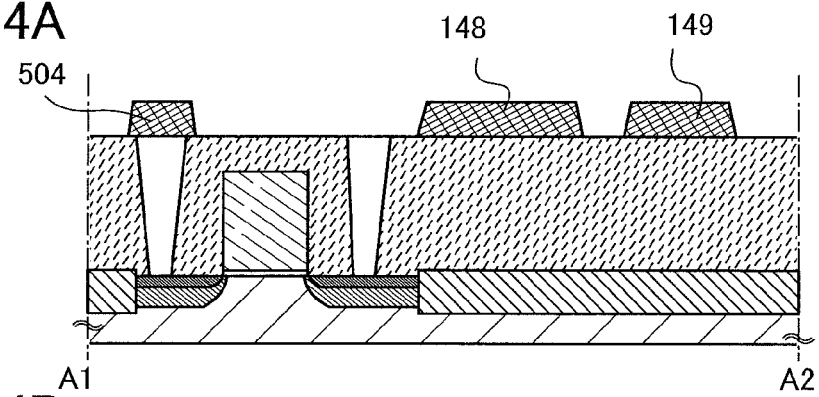
FIGS. 14A to 14D are diagrams illustrating a method for manufacturing a semiconductor device.

A conductive layer is formed over the electrode 502, the electrode 503, and the insulating layer 128 and is selectively etched, whereby the gate electrode 148, the electrode 149, and the electrode 504 are formed (see FIG. 14A). The conductive layer can be formed using a material and a method which are similar to those of the conductive layer for forming the gate electrode 148 and the electrode 149 in the manufacturing method illustrated in FIGS. 12A to 12D, and thus the description thereof is omitted.

Figure 14B:
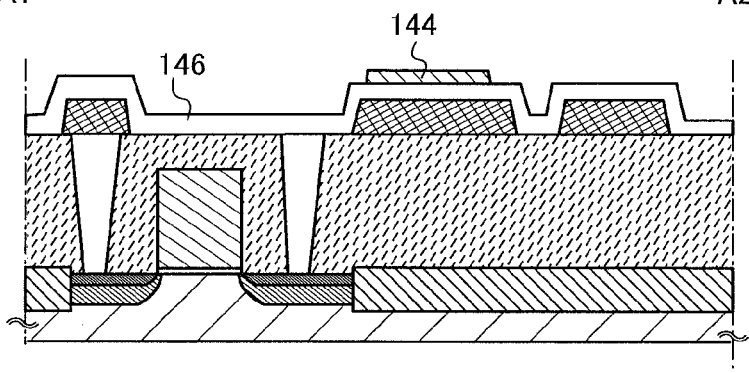

Next, the gate insulating layer 146 is formed so as to cover the gate electrode 148, the electrode 149, and the electrode 504 (see FIG. 14B). The gate insulating layer 146 can be formed using a material and a method which are similar to those used to form the gate insulating layer 146 in the manufacturing method illustrated in FIGS. 12A to 12D, and thus the description thereof is omitted.

Next, the oxide semiconductor layer 144 is formed over the gate insulating layer 146 (see FIG. 14B). The oxide semiconductor layer 144 can be formed using a material and a method which are similar to those of the oxide semiconductor layer for forming the oxide semiconductor layer 144 in the manufacturing method illustrated in FIGS. 12A to 12D, and thus the description thereof is omitted.

Figure 14C:
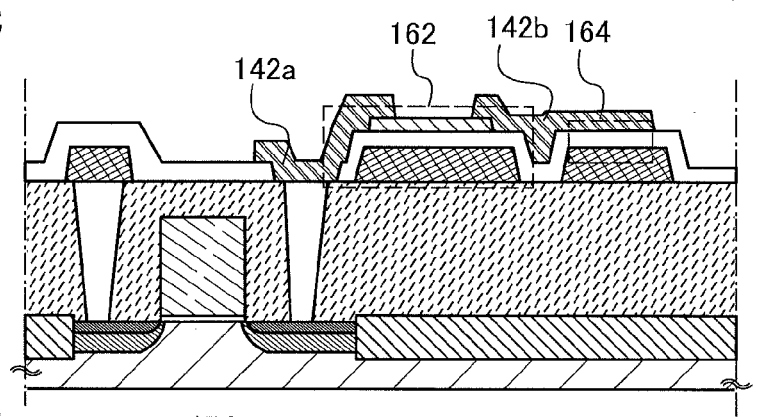
Figure 14D:
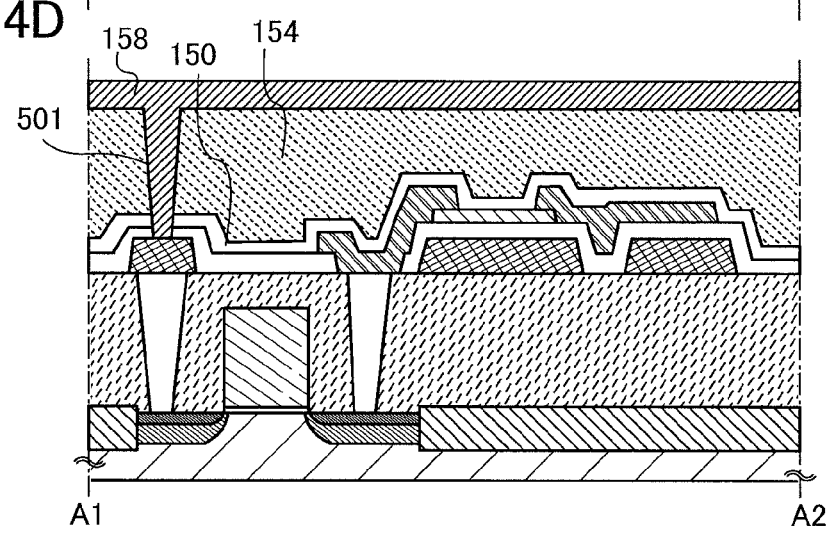

Next, an opening is Ruined in the gate insulating layer 146, a conductive layer is formed over the oxide semiconductor layer 144 and the gate insulating layer 146 and then is selectively etched, so that the electrode 142a and the electrode 142b are formed (see FIG. 14C). The conductive layer can be foamed using a material and a method which are similar to those of the conductive layer for forming the electrode 142a and the electrode 142b in the manufacturing method illustrated in FIGS. 12A to 12D, and thus the description thereof is omitted.

The manufacturing steps following the above steps are similar to those illustrated in FIGS. 12A to 12D; therefore, the description thereof is omitted.

Through the above steps, the semiconductor device with the structure illustrated in FIGS. 7A to 7C can be manufactured.

Next, a manufacturing method for the structure illustrated in FIGS. 8A to 8C is described with reference to FIGS. 15A to 15D.

The manufacturing method illustrated in FIGS. 14A to 14D and the manufacturing method illustrated in FIGS. 15A to 15D are different in the manufacturing methods of the oxide semiconductor layer 144, the electrode 142a, and the electrode 142b. The manufacturing method illustrated in FIGS. 15A to 15D except for the manufacturing methods of the oxide semiconductor layer 144, the electrode 142a, and the electrode 142b is the same as that illustrated in FIGS. 14A to 14D, and thus the description thereof is omitted.

Figure 15A:
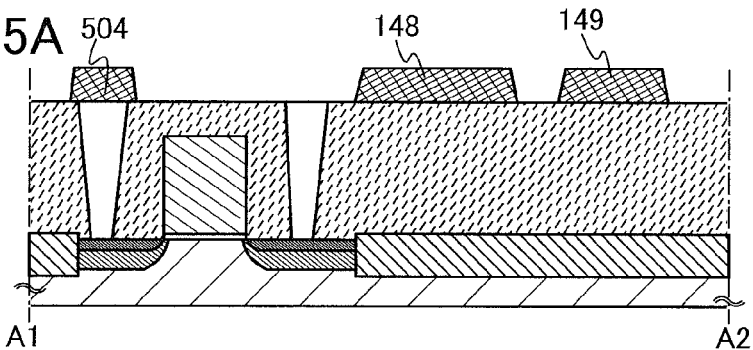
FIGS. 15A to 15D are diagrams illustrating a method for manufacturing a semiconductor device.
Figure 15B:
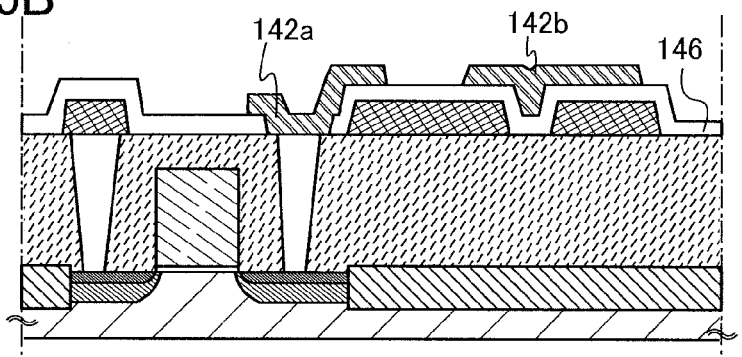

A conductive layer is formed over the gate insulating layer 146 and is selectively etched, so that the electrode 142a and the electrode 142b are formed (see FIG. 15B). The conductive layer can be formed using a material and a method which are similar to those of the conductive layer which is used to form the electrode 142a and the electrode 142b in the manufacturing method illustrated in FIGS. 12A to 12D, and thus the description thereof is omitted.

Figure 15C:
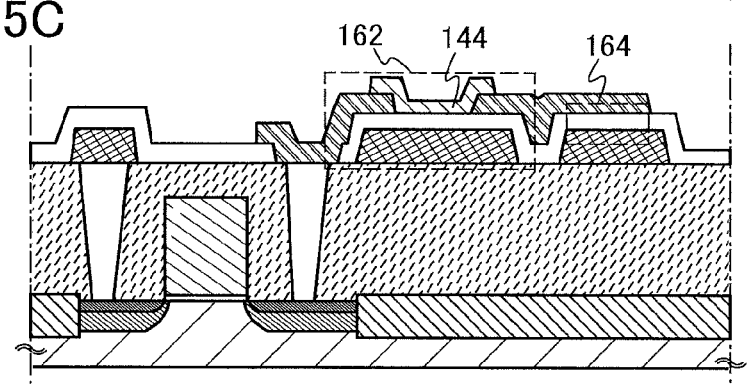
Figure 15D:
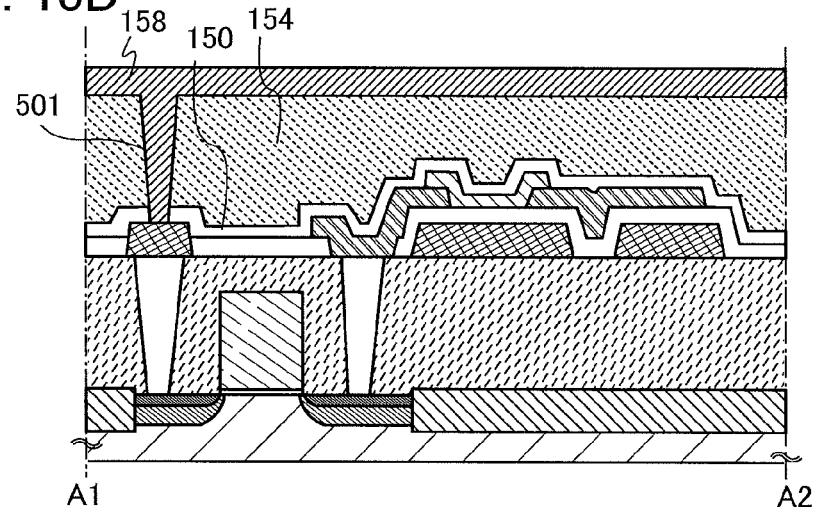

Next, the oxide semiconductor layer 144 is formed over the electrode 142a and the electrode 142b (see FIG. 15C). The oxide semiconductor layer 144 can be formed using a material and a method which are similar to those of the oxide semiconductor layer for forming the oxide semiconductor layer 144 in the manufacturing method illustrated in FIGS. 12A to 12D, and thus the description thereof is omitted.

The manufacturing steps following the above steps are similar to those illustrated in FIGS. 12A to 12D; therefore, the description thereof is omitted.

Through the above steps, the semiconductor device with the structure illustrated in FIGS. 8A to 8C can be manufactured.

Note that before or after the steps described with reference to FIGS. 12A to 12D, FIGS. 13A to 13D, FIGS. 14A to 14D, and FIGS. 15A to 15D, a step of forming an additional electrode, wiring, semiconductor layer, insulating layer, or the like may be performed. For example, a multilayer wiring structure in which an insulating layer and a conductive layer are stacked is employed as a wiring structure, whereby a highly integrated semiconductor device can be provided.

The methods and structures described in this embodiment can be combined as appropriate with any of the methods and structures described in the other embodiments.

Embodiment 4

In this embodiment, an oxide including a crystal with c-axis alignment (C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 17A to 17E, FIGS. 18A to 18C, and FIGS. 19A to 19C. In FIGS. 17A to 17E, FIGS. 18A to 18C, and FIGS. 19A to 19C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 17A:
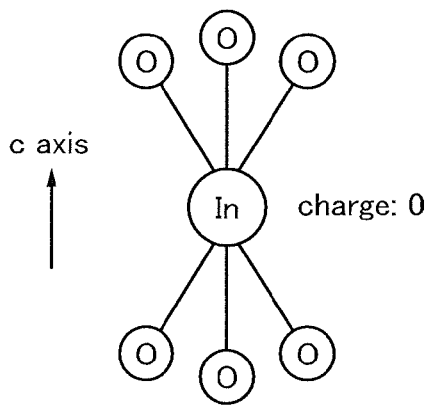
FIGS. 17A to 17E are diagrams illustrating a crystal structure of an oxide material.

FIG. 17A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 17A is an octahedral structure, but is illustrated as a planar structure for simplicity. Note that three tetracoordinate O atoms exist in each of an upper half and a lower half in FIG. 17A. In the small group illustrated in FIG. 17A, electric charge is 0.

Figure 17D:
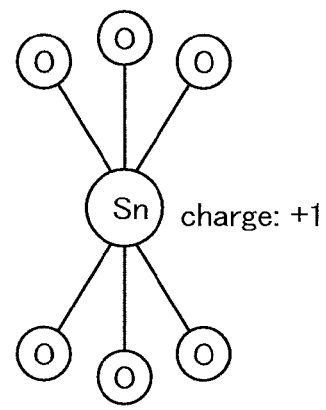
Figure 17B:
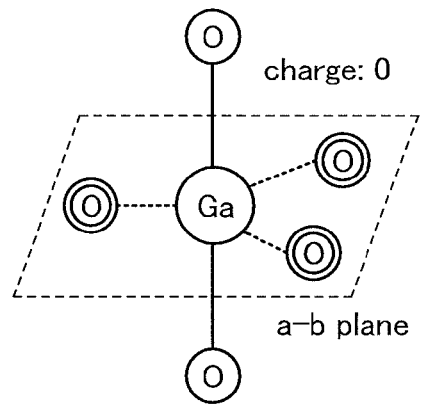

FIG. 17B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 17B. An In atom can also have the structure illustrated in FIG. 17B because an In atom can have five ligands. In the small group illustrated in FIG. 17B, electric charge is 0.

Figure 17E:
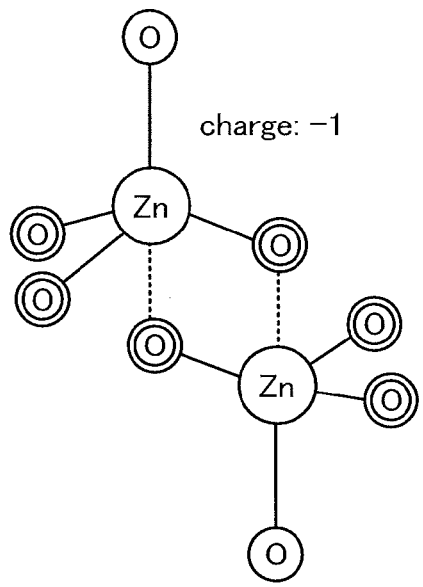
Figure 17C:
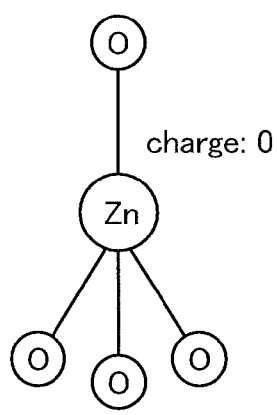

FIG. 17C illustrates a structure including one tetracoordinate Zn atom and four tetracoordinate O atoms proximate to the Zn atom. In FIG. 17C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 17C. In the small group illustrated in FIG. 17C, electric charge is 0.

FIG. 17D illustrates a structure including one hexacoordinate Sn atom and six tetracoordinate O atoms proximate to the Sn atom. In FIG. 17D, three tetracoordinate O atoms exist in each of an upper half and a lower half. In the small group illustrated in FIG. 17D, electric charge is +1.

FIG. 17E illustrates a small group including two Zn atoms. In FIG. 17E, one tetracoordinate O atom exists in each of an upper half and a lower half. In the small group illustrated in FIG. 17E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 17A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. When the coordination number of the tetracoordinate O atom is 4, the sum of the number of the metal atoms proximate to and below the O atom and the number of the metal atoms proximate to and above the 0 atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 18A illustrates a model of a medium group included in a layered structure of an In—Sn—Zn—O-based material. FIG. 18B illustrates a large group including three medium groups. Note that FIG. 18C illustrates an atomic arrangement in the case where the layered structure in FIG. 18B is observed from the c-axis direction.

In FIG. 18A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 18A, one tetracoordinate O atom existing in each of an upper half and a lower half with respect to an In atom is denoted by circled 1. FIG. 18A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 18A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 17E can be given. For example, with one small group including two Zn atoms, electric charge of one small group including a Sn atom can be cancelled, so that the total electric charge of the layered structure can be 0.

When the large group illustrated in FIG. 18B is repeated, an In—Sn—Zn—O-based crystal ($In_2SnZn_3O_8$) can be obtained. Note that a layered structure of the obtained In—Sn—Zn—O-based material can be expressed as a composition formula, $In_2SnZn_2O_7(ZnO)_m$ (m is 0 or a natural number). As larger m is, the crystallinity of the In—Sn—Zn—O-based crystal is improved, which is preferable.

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 19A:
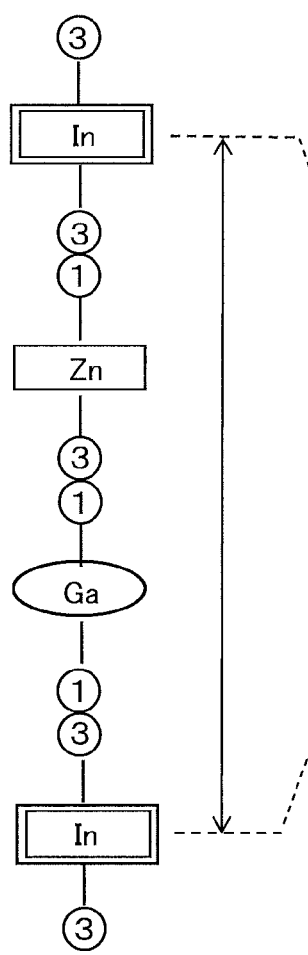
FIGS. 19A to 19C are diagrams illustrating a crystal structure of an oxide material.

As an example, FIG. 19A illustrates a model of a medium group included in a layered structure of an In—Ga—Zn—O-based material.

In the medium group included in the layered structure of the In—Ga—Zn—O-based material in FIG. 19A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 19B:
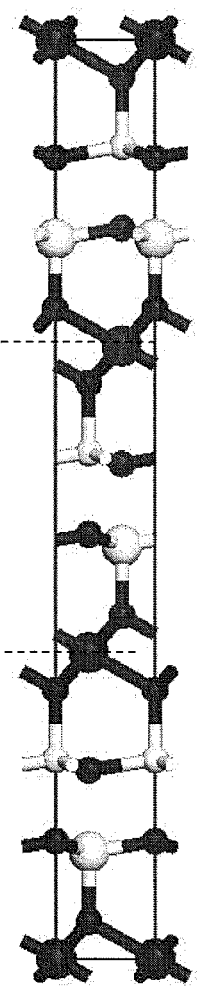
Figure 19C:
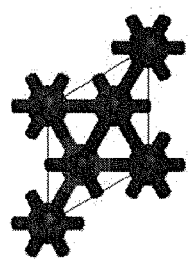

FIG. 19B illustrates a large group including three medium groups. Note that FIG. 19C illustrates an atomic arrangement in the case where the layered structure in FIG. 19B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 19A but also a medium group in which the arrangement of the In atom, the Ga atom, and the Zn atom is different from that in FIG. 19A.

The structures, methods, and the like described in this embodiment can be combined as appropriate with any of the structures, methods, and the like described in the other embodiments.

Embodiment 5

In this embodiment, ideal mobility of the transistor, which is described in the above embodiment, will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[FORMULA 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad \text{[FORMULA 4]}$$

Here, L represents the channel length and W represents the channel width, and L and W are each 10 μm in this case. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \quad \text{[FORMULA 5]}$$

The right side of Formula 5 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$—$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B} \exp\left(-\frac{x}{G}\right) \quad \text{[FORMULA 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 20:
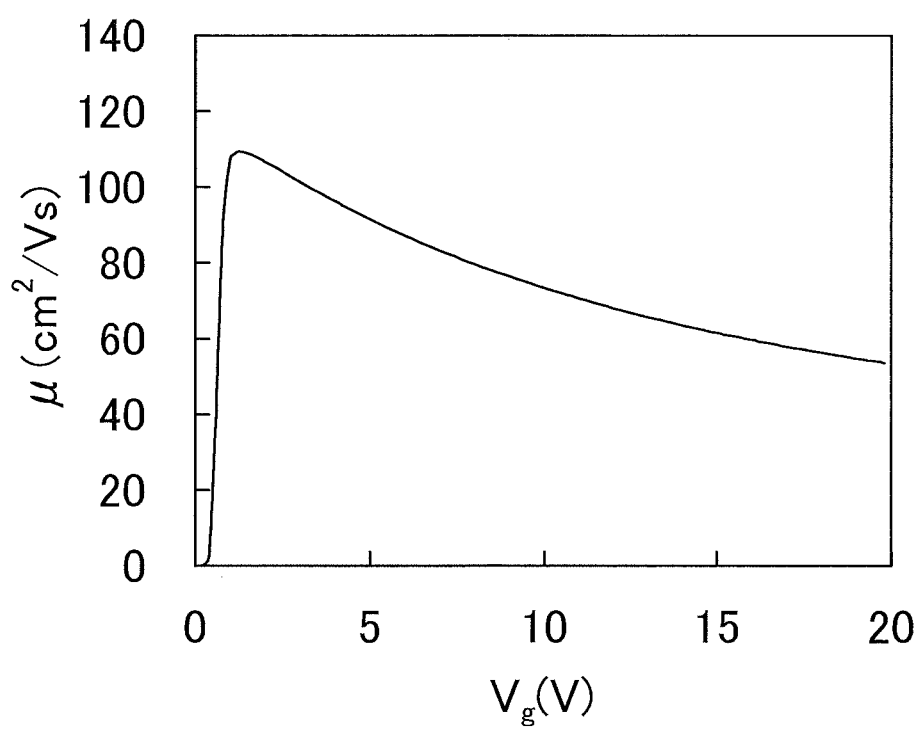
FIG. 20 is a graph showing dependence of mobility on gate voltage obtained by calculation.

Calculation results of the mobility $\mu_2$ of a transistor whose channel includes an ideal oxide semiconductor without a defect inside the semiconductor are shown in FIG. 20. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 20, the mobility has a peak of more than 100 cm²/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 21A to 21C, FIGS. 22A to 22C, and FIGS. 23A to 23C. FIGS. 24A and 24B illustrate cross-sectional structures of the transistors used for the calculation. The transistors illustrated in FIGS. 24A and 24B each include a semiconductor region 1303a and a semiconductor region 1303c which have n⁺-type conductivity in an oxide semiconductor layer. The resistivities of the semiconductor region 1303a and the semiconductor region 1303c are $2 \times 10^{-3}$ Ωcm.

The transistor illustrated in FIG. 24A is formed over a base insulating layer 1301 and an embedded insulator 1302 which is embedded in the base insulating layer 1301 and formed of aluminum oxide. The transistor includes the semiconductor region 1303a, the semiconductor region 1303c, an intrinsic semiconductor region 1303b serving as a channel formation region therebetween, and a gate 1305. The width of the gate 1305 is 33 nm.

A gate insulating layer 1304 is formed between the gate 1305 and the semiconductor region 1303b. In addition, a sidewall insulator 1306a and a sidewall insulator 1306b are formed on both side surfaces of the gate 1305, and an insulator 1307 is formed over the gate 1305 so as to prevent a short circuit between the gate 1305 and another wiring. The sidewall insulating layer has a width of 5 nm. A source 1308a and a drain 1308b are provided in contact with the semiconductor region 1303a and the semiconductor region 1303c, respectively. Note that the channel width of this transistor is 40 nm.

The transistor of FIG. 24B is the same as the transistor of FIG. 24A in that it is formed over the base insulating layer 1301 and the embedded insulator 1302 formed of aluminum oxide and that it includes the semiconductor region 1303a, the semiconductor region 1303c, the intrinsic semiconductor region 1303b provided therebetween, the gate 1305 having a width of 33 nm, the gate insulating layer 1304, the sidewall insulator 1306a, the sidewall insulator 1306b, the insulator 1307, the source 1308a, and the drain 1308b.

The transistor illustrated in FIG. 24A is different from the transistor illustrated in FIG. 24B in the conductivity type of semiconductor regions under the sidewall insulator 1306a and the sidewall insulator 1306b. In the transistor illustrated in FIG. 24A, the semiconductor regions under the sidewall insulator 1306a and the sidewall insulator 1306b are part of the semiconductor region 1303a having n⁺-type conductivity and part of the semiconductor region 1303c having n⁺-type conductivity, whereas in the transistor illustrated in FIG. 24B, the semiconductor regions under the sidewall insulator 1306a and the sidewall insulator 1306b are part of the intrinsic semiconductor region 1303b. In other words, in the semiconductor layer of FIG. 24B, a region having a width of $L_{off}$ which overlaps with neither the semiconductor region 1303a (the semiconductor region 1303c) nor the gate 1305 is provided. This region is called an offset region, and the width $L_{off}$ is called an offset length. As is seen from the drawing, the offset length is equal to the width of the sidewall insulator 1306a (the sidewall insulator 1306b).

Figure 21A:
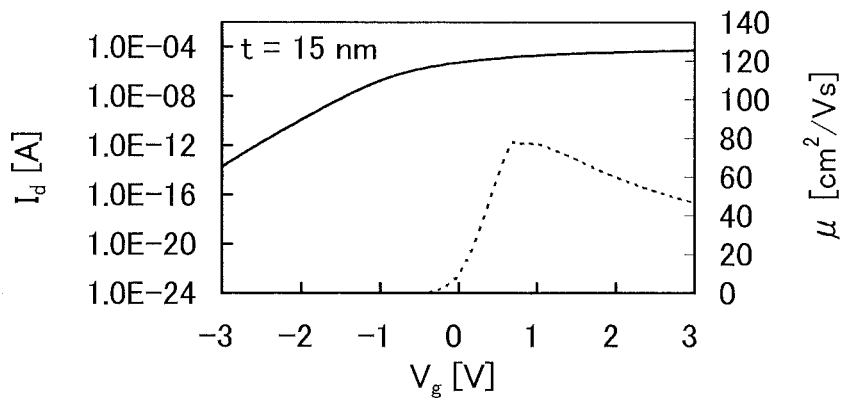
FIGS. 21A to 21C are graphs each showing dependence of drain current and mobility on gate voltage obtained by calculation.
Figure 21B:
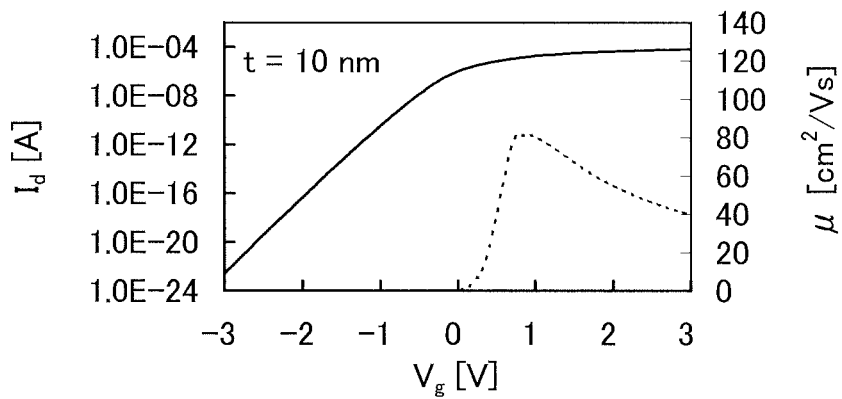
Figure 21C:
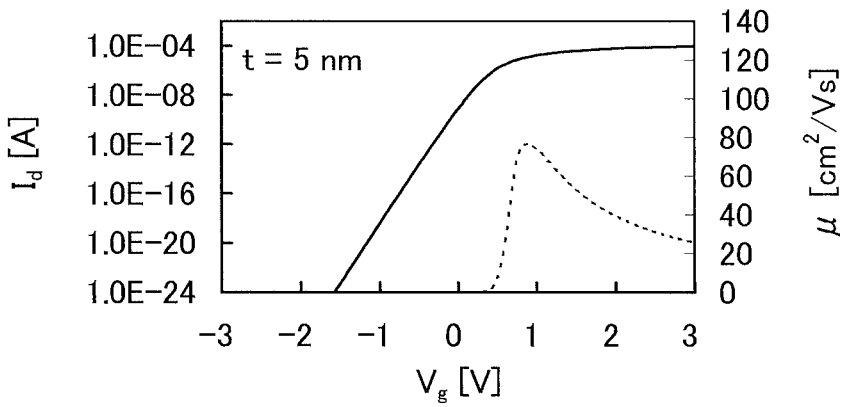

The other parameters used in calculation are as described above. For the calculation, device simulation software Sentaurus Device manufactured by Synopsys, Inc. was used. FIGS. 21A to 21C show the gate voltage ($V_g$: a potential difference between the gate and the source) dependence of the drain current ($I_d$, a solid line) and the mobility (μ, a dotted line) of the transistor having the structure illustrated in FIG. 24A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 21A shows the gate voltage dependence of the transistor in the case where the thickness of the gate insulating layer is 15 nm, FIG. 21B shows that of the transistor in the case where the thickness of the gate insulating layer is 10 nm, and FIG. 21C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a memory element and the like, at a gate voltage of around 1 V.

Figure 22A:
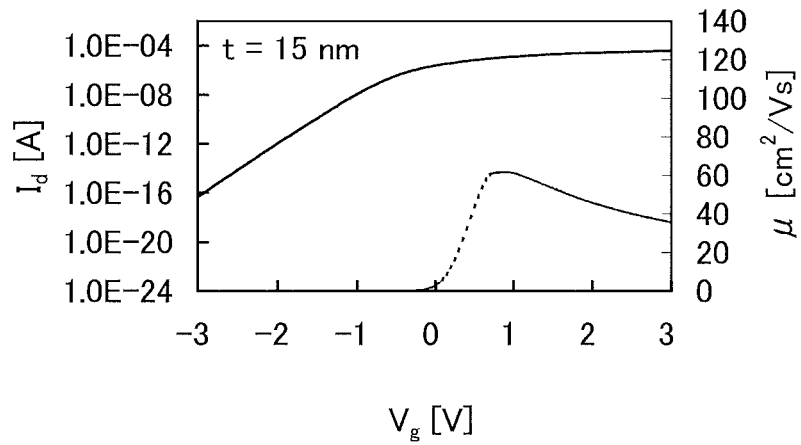
FIGS. 22A to 22C are graphs each showing dependence of drain current and mobility on gate voltage obtained by calculation.
Figure 22B:
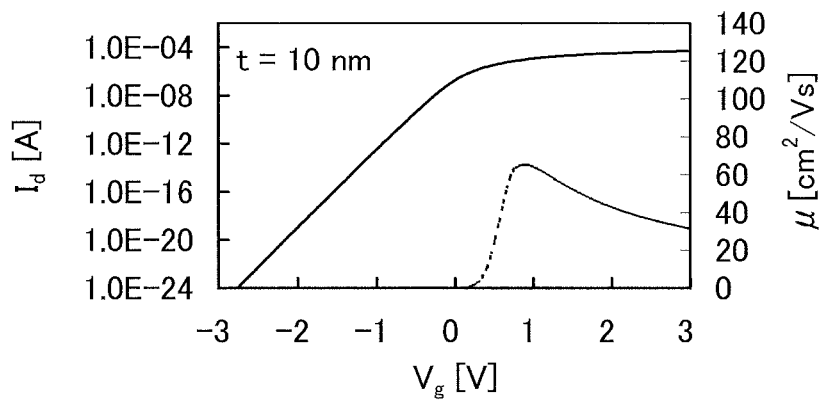
Figure 22C:
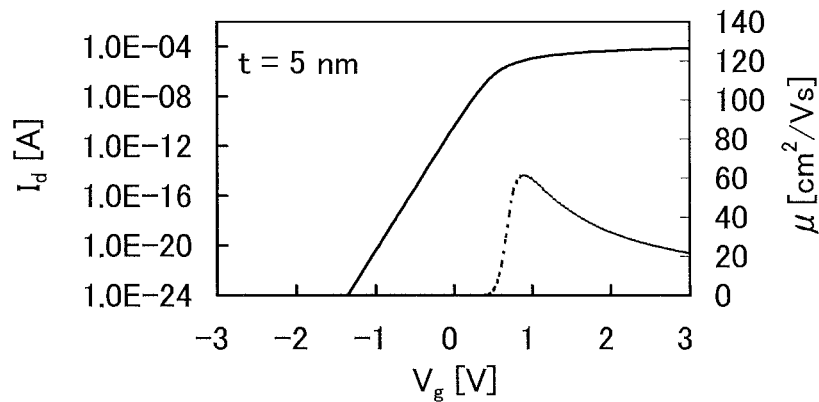

FIGS. 22A to 22C show the gate voltage $V_g$ dependence of the drain current $I_d$ (a solid line) and the mobility μ(a dotted line) of the transistor having the structure illustrated in FIG. 24B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 22A shows the gate voltage dependence of the transistor in the case where the thickness of the gate insulating layer is 15 nm, FIG. 22B shows that of the transistor in the case where the thickness of the gate insulating layer is 10 nm, and FIG. 22C shows that of the transistor in the case where the thickness of the gate insulating layer is 5 nm.

Figure 23A:
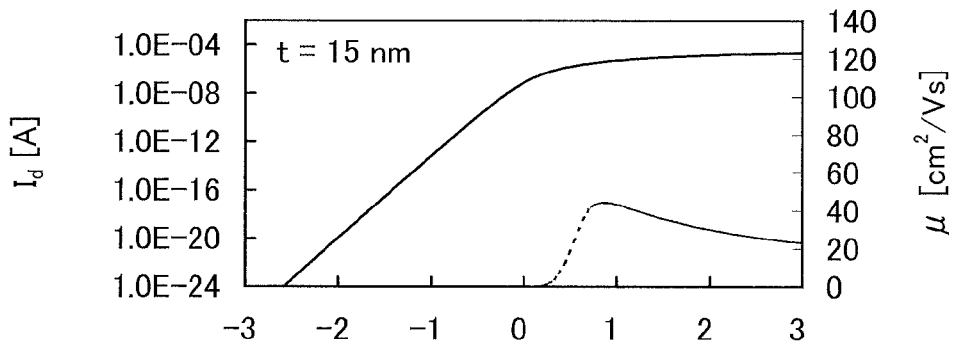
FIGS. 23A to 23C are graphs each showing dependence of drain current and mobility on gate voltage obtained by calculation.
Figure 23B:
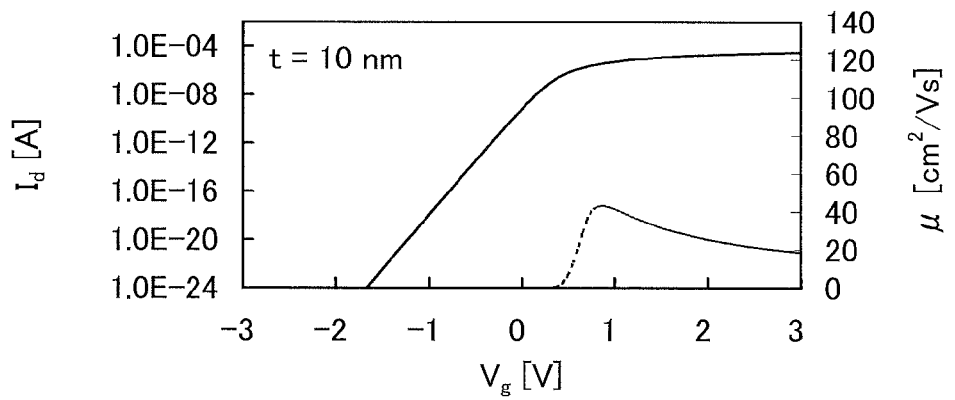
Figure 23C:
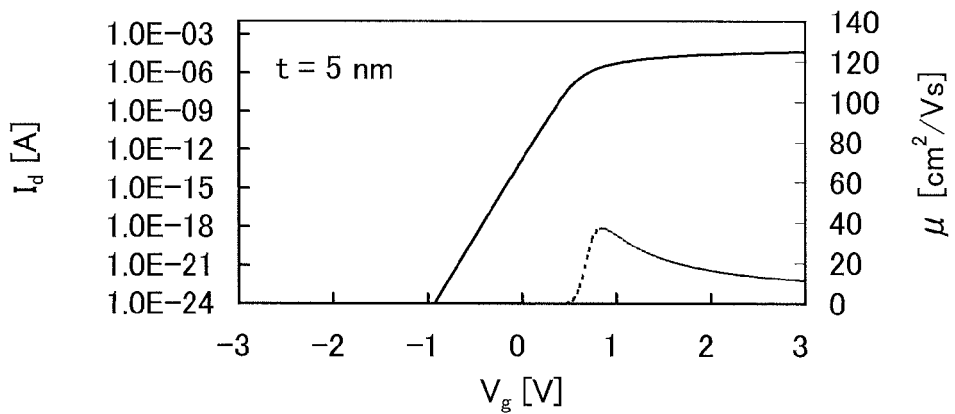
Figure 24A:
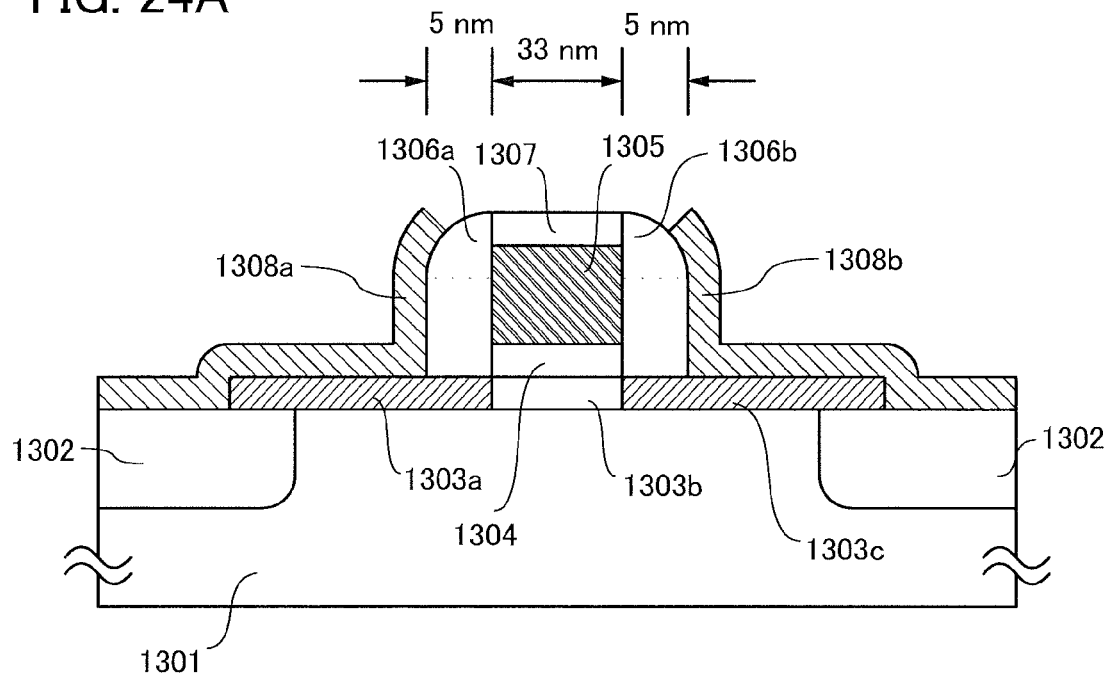
FIGS. 24A and 24B are diagrams each illustrating a cross-sectional structure of a transistor used for calculation.
Figure 24B:
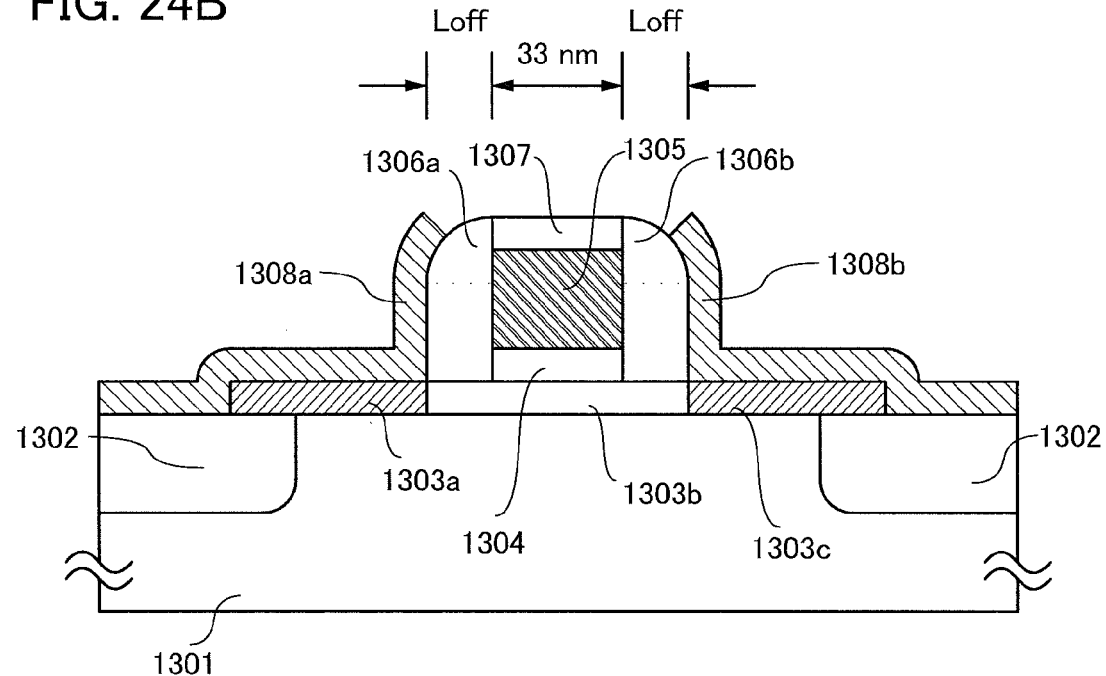

Further, FIGS. 23A to 23C show the gate voltage dependence of the drain current $I_d$ (a solid line) and the mobility μ (a dotted line) of the transistor having the structure illustrated in FIG. 24B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 23A shows the gate voltage dependence of the transistor in the case where the thickness of the gate insulating layer is 15 nm, FIG. 23B shows that of the transistor in the case where the thickness of the gate insulating layer is 10 nm, and FIG. 23C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 cm²/Vs in FIGS. 21A to 21C, approximately 60 cm²/Vs in FIGS. 22A to 22C, and approximately 40 cm²/Vs in FIGS. 23A to 23C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Embodiment 6

In this embodiment, a transistor in which an oxide semiconductor film including In, Sn, and Zn as main components (an example of an In—Sn—Zn-based oxide semiconductor film) is used for a channel formation region will be described.

The transistor in which the oxide semiconductor film including In, Sn, and Zn as main components film is used as the channel formation region can obtain favorable characteristics by forming the oxide semiconductor film while heating the substrate or performing heat treatment after the oxide semiconductor film is formed. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 25A:
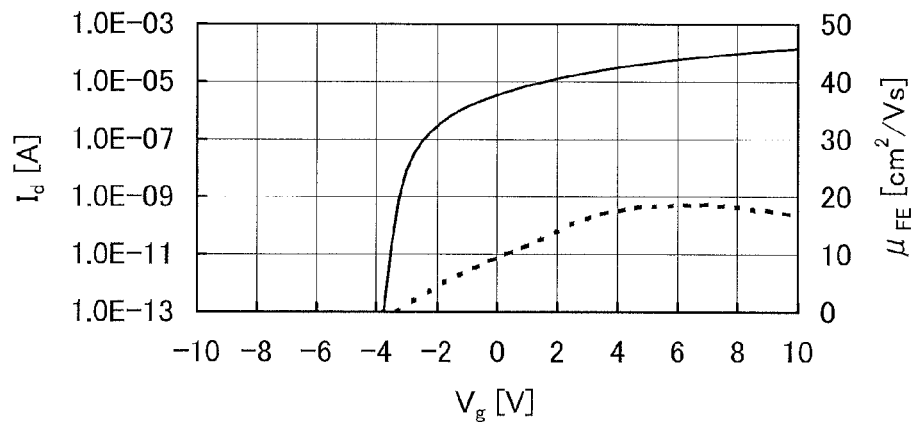
FIGS. 25A to 25C are graphs each showing electric characteristics of a transistor including an oxide semiconductor film.
Figure 25B:
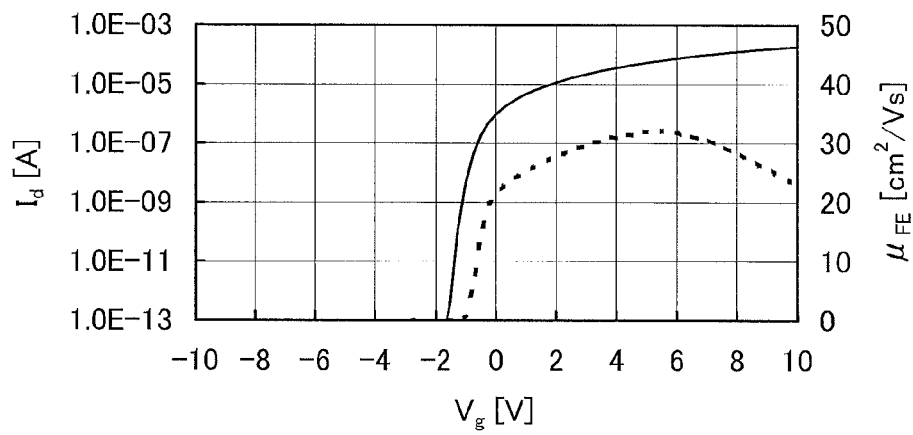
Figure 25C:
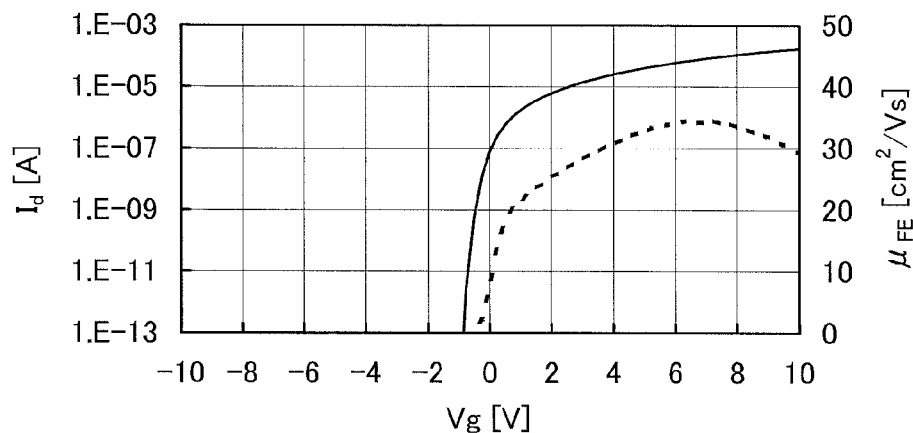

As an example, FIGS. 25A to 25C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 25A shows characteristics of a transistor whose oxide semiconductor film including In, Sn, and Zn as main components was formed by a sputtering method without heating a substrate intentionally. The field-effect mobility of the transistor is 18.8 cm²/Vsec. On the other hand, when the oxide semiconductor film including In, Sn, and Zn as main components is formed while heating the substrate intentionally, the field-effect mobility can be improved. FIG. 25B shows characteristics of a transistor whose oxide semiconductor film including In, Sn, and Zn as main components was formed while heating a substrate at 200° C. The field-effect mobility of the transistor is 32.2 cm²/Vsec.

The field-effect mobility can be further improved by performing heat treatment after formation of the oxide semiconductor film including In, Sn, and Zn as main components. FIG. 25C shows characteristics of a transistor whose oxide semiconductor film including In, Sn, and Zn as main components was formed by sputtering at 200° C. and then subjected to heat treatment at 650° C. The field-effect mobility of the transistor is 34.5 cm²/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 m²/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 25A and 25B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Note that $V_d$ refers to a drain voltage (a potential difference between a drain and a source). Then, the substrate temperature was set to 150° C. and $V_d$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set at 150° C. and $V_d$ was set to 0.1 V. After that, −20 V of $V_g$ was applied so that the intensity of an electric field applied to the gate insulating layers was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 26A:
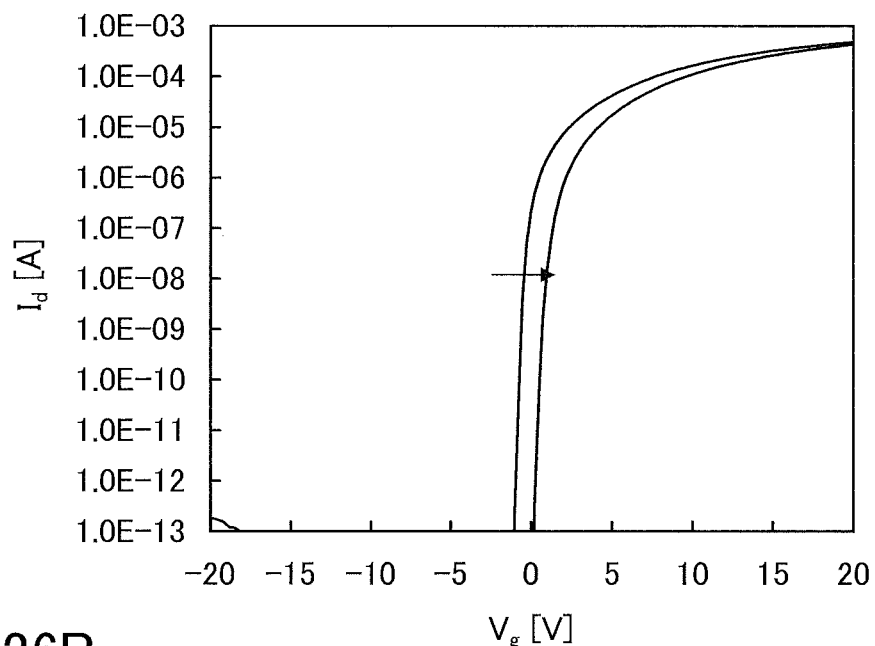
FIGS. 26A and 26B are graphs each showing $V_g$-$I_d$ characteristics of a transistor of Sample 1 which is subjected to a BT test.
Figure 26B:
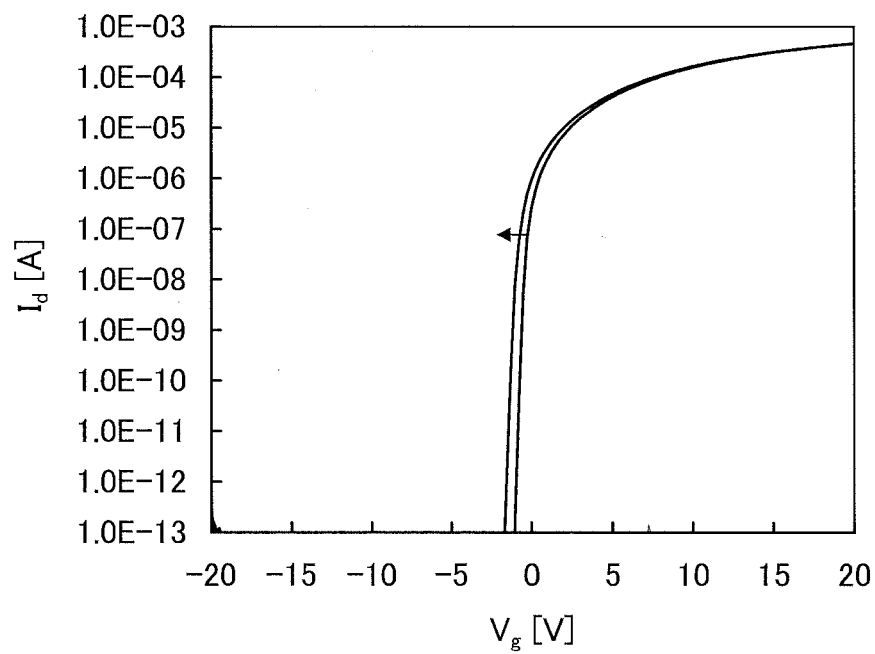
Figure 27A:
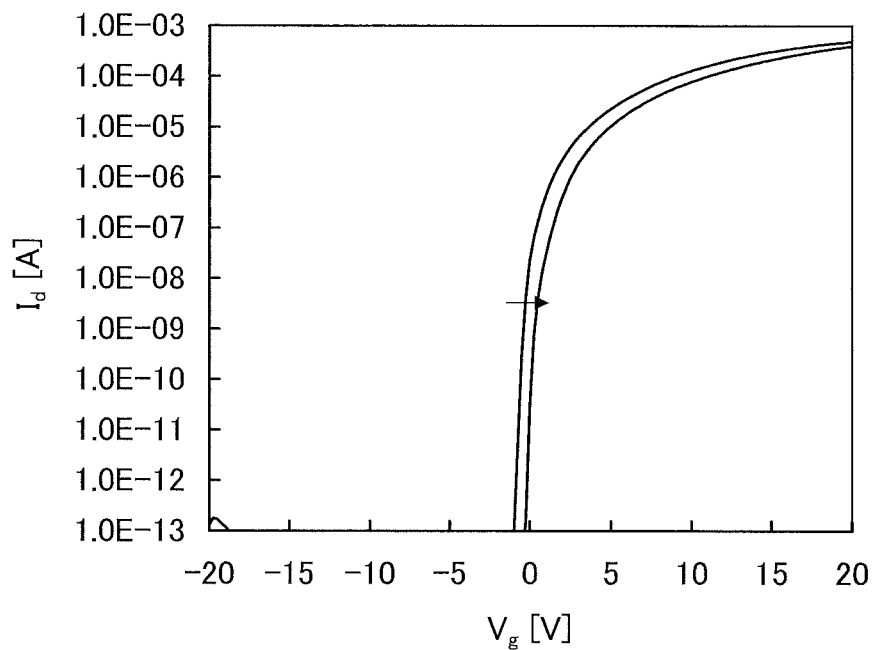
FIGS. 27A and 27B are graphs each showing $V_g$-$I_d$ characteristics of a transistor of Sample 2 which is subjected to a BT test.
Figure 27B:
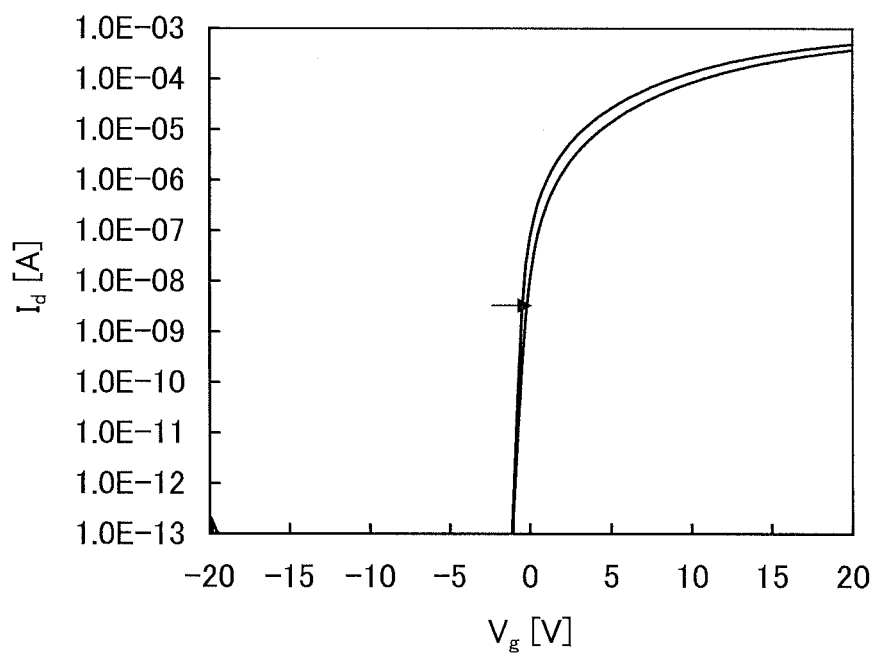

FIGS. 26A and 26B show a result of the positive BT test of Sample 1 and a result of the negative BT test of Sample 1, respectively. FIGS. 27A and 27B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1 \times 10^{16}$/cm$^3$ and lower than or equal to $2 \times 10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 28:
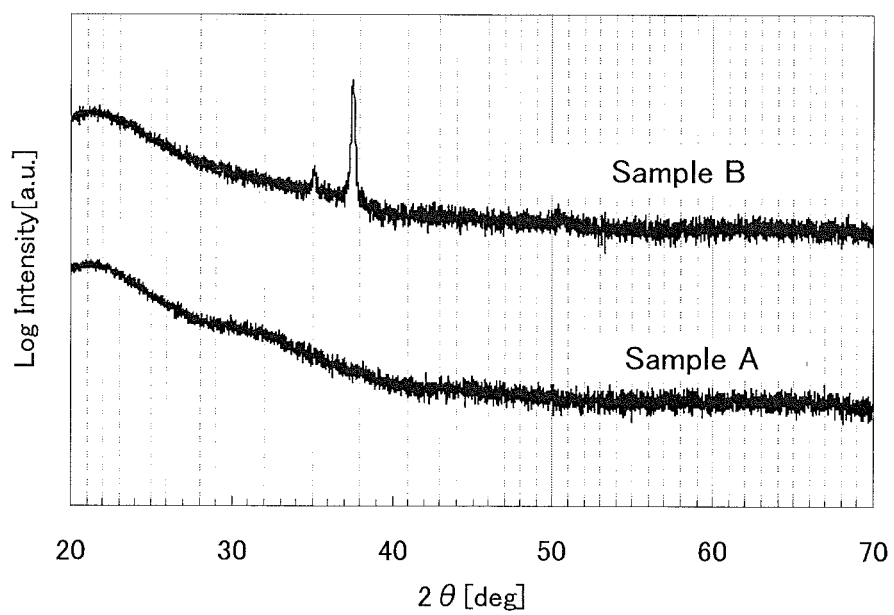
FIG. 28 is a graph showing XRD spectra of Sample A and Sample B.

FIG. 28 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current is used to indicate current per micrometer of a channel width.

Figure 29:
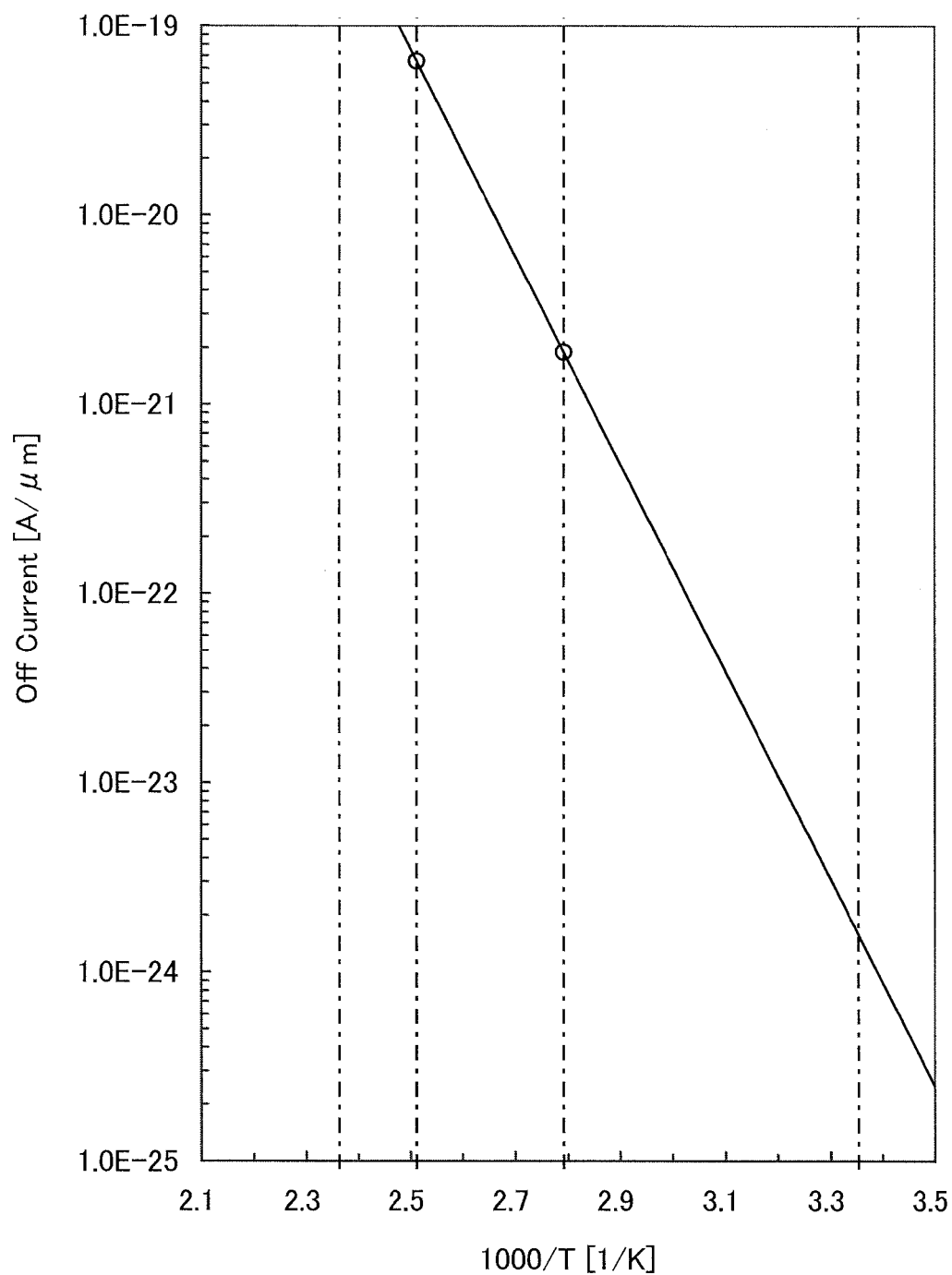
FIG. 29 is a graph showing a relation between the off-state current of a transistor and the substrate temperature in measurement.

FIG. 29 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000. Specifically, as shown in FIG. 29, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/m ($1 \times 10^{-20}$ A/μm) or lower, and 0.1 zA/μm ($1 \times 10^{-22}$ A/μm) or lower at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 30:
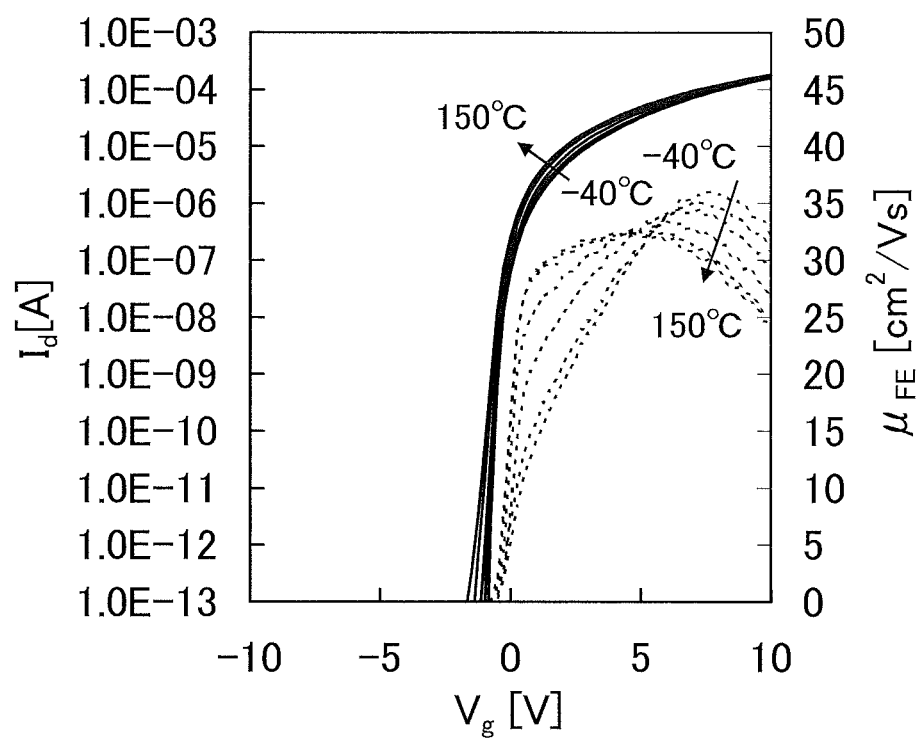
FIG. 30 is a graph showing dependence of $I_d$ and field-effect mobility on $V_g$.
Figure 31A:
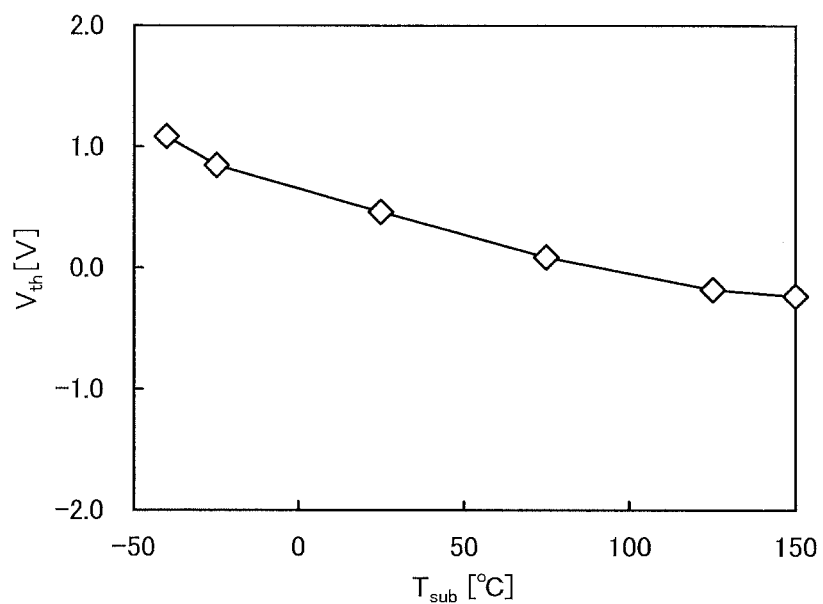
FIG. 31A is a graph showing a relation between the substrate temperature and the threshold voltage and FIG. 31B is a graph showing a relation between the substrate temperature and the field-effect mobility.

FIG. 30 shows the $V_g$ dependence of $I_d$ (a solid line) and field-effect mobility (a dotted line). FIG. 31A shows a relation between the substrate temperature and the threshold voltage, and FIG. 31B shows a relation between the substrate temperature and the field-effect mobility.

From FIG. 31A, it is found that the threshold voltage gets lower as the substrate temperature increases. Note that the threshold voltage is decreased from 1.09 V to −0.23 V in the range from −40° C. to 150° C.

Figure 31B:
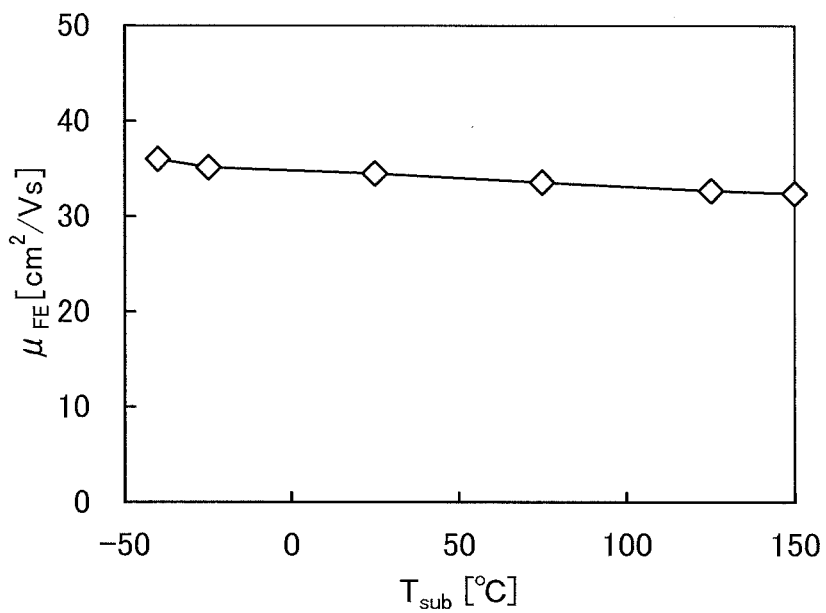

From FIG. 31B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

The structures, methods, and the like described in this embodiment can be combined as appropriate with any of the structures, methods, and the like described in the other embodiments.

Embodiment 7

In this embodiment, an example of a structure of a transistor in which an oxide semiconductor film is used for a channel formation region will be shown. An oxide semiconductor included in the oxide semiconductor film may be formed using an oxide semiconductor including In, Sn, and Zn (In—Sn—Zn-based oxide semiconductor) or another oxide semiconductor described in any of the other embodiments.

Figure 32A:
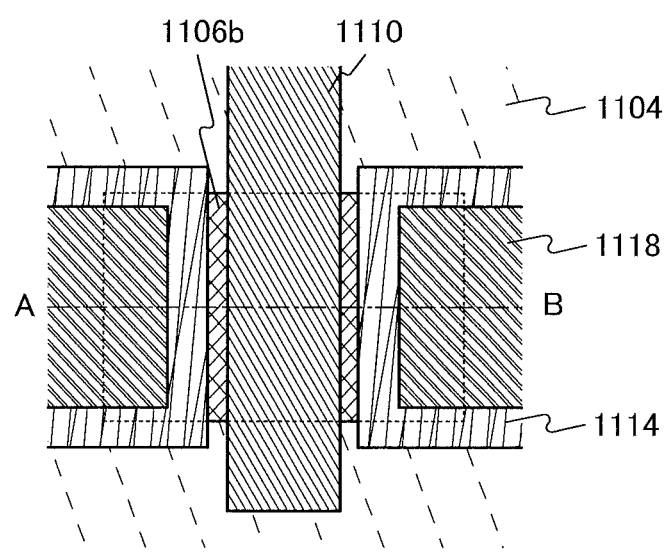
FIGS. 32A and 32B illustrate an example of a structure of a transistor.
Figure 32B:
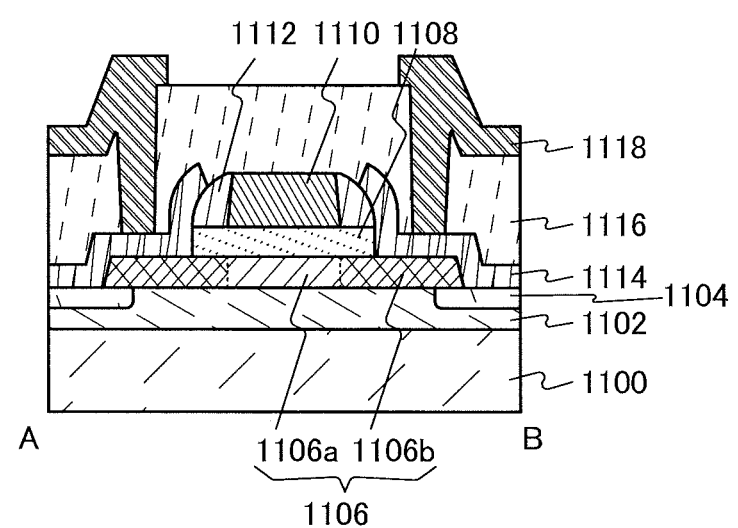

FIGS. 32A and 32B are a top view and a cross-sectional view of a coplanar transistor having a top-gate top-contact structure. FIG. 32A is the top view of the transistor. FIG. 32B illustrates cross section A—B along dashed-dotted line A—B in FIG. 32A.

The transistor illustrated in FIG. 32B includes a substrate 1100; a base insulating film 1102 provided over the substrate 1100; a protective insulating film 1104 provided in the periphery of the base insulating film 1102; an oxide semiconductor film 1106 provided over the base insulating film 1102 and the protective insulating film 1104 and including a high-resistance region 1106a and low-resistance regions 1106b; a gate insulating layer 1108 provided over the oxide semiconductor film 1106; a gate electrode 1110 provided to overlap with the oxide semiconductor film 1106 with the gate insulating layer 1108 positioned therebetween; a sidewall insulating film 1112 provided in contact with a side surface of the gate electrode 1110; a pair of electrodes 1114 provided in contact with at least the low-resistance regions 1106b; an interlayer insulating film 1116 provided to cover at least the oxide semiconductor film 1106, the gate electrode 1110, and the pair of electrodes 1114; and a wiring 1118 provided to be connected to at least one of the pair of electrodes 1114 through an opening formed in the interlayer insulating film 1116.

Although not illustrated, a protective film may be provided to cover the interlayer insulating film 1116 and the wiring 1118. With the protective film, a minute amount of leakage current generated by surface conduction of the interlayer insulating film 1116 can be reduced and thus the off-state current of the transistor can be reduced.

The structures and the like described in this embodiment can be combined as appropriate with any of the structures and the like described in the other embodiments.

Embodiment 8

In this embodiment, an example of a transistor different from that having the structure in which the oxide semiconductor film is used for the channel formation region, which is described in Embodiment 7, will be described. Note that in this embodiment, the case where an oxide semiconductor including In, Sn, and Zn (In—Sn—Zn-based oxide semiconductor) is used as an oxide semiconductor included in an oxide semiconductor film is described; however, the oxide semiconductor described in any of the other embodiments may be used.

Figure 33A:
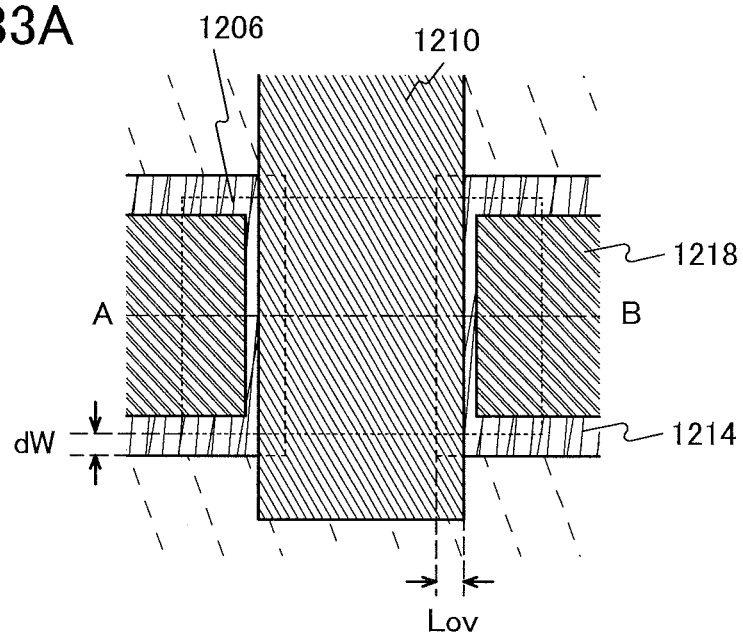
FIGS. 33A and 33B illustrate an example of a structure of a transistor.
Figure 33B:
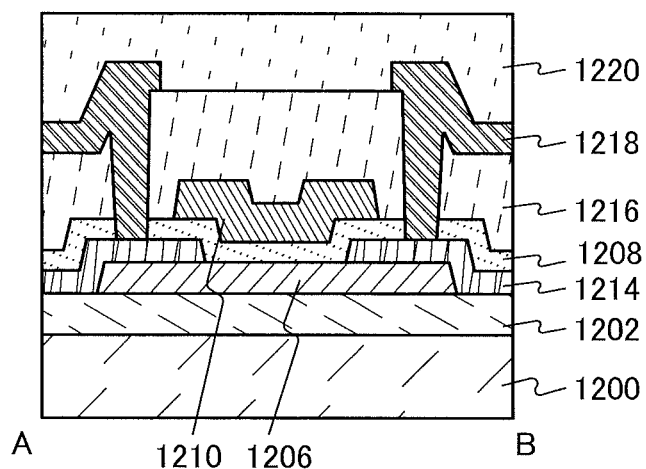

FIGS. 33A and 33B are a top view and a cross-sectional view which illustrate a structure of a transistor. FIG. 33A is the top view of the transistor. FIG. 33B is a cross-sectional view along dashed-dotted line A—B in FIG. 33A.

The transistor illustrated in FIG. 33B includes a substrate 1200; a base insulating film 1202 provided over the substrate 1200; an oxide semiconductor film 1206 provided over the base insulating film 1202; a pair of electrodes 1214 in contact with the oxide semiconductor film 1206; a gate insulating layer 1208 provided over the oxide semiconductor film 1206 and the pair of electrodes 1214; a gate electrode 1210 provided to overlap with the oxide semiconductor film 1206 with the gate insulating layer 1208 positioned therebetween; an interlayer insulating film 1216 provided to cover the gate insulating layer 1208 and the gate electrode 1210; wirings 1218 connected to the pair of electrodes 1214 through openings formed in the interlayer insulating film 1216; and a protective film 1220 provided to cover the interlayer insulating film 1216 and the wirings 1218.

As the substrate 1200, a glass substrate can be used. As the base insulating film 1202, a silicon oxide film can be used. As the oxide semiconductor film 1206, an In—Sn—Zn—O film can be used. As the pair of electrodes 1214, a tungsten film can be used. As the gate insulating layer 1208, a silicon oxide film can be used. The gate electrode 1210 can have a stacked structure of a tantalum nitride film and a tungsten film. The interlayer insulating film 1216 can have a stacked structure of a silicon oxynitride film and a polyimide film. The wirings 1218 can each have a stacked structure in which a titanium film, an aluminum film, and a titanium film are formed in this order. As the protective film 1220, a polyimide film can be used.

Note that in the transistor having the structure illustrated in FIG. 33A, the width of a portion where the gate electrode 1210 overlaps with one of the pair of electrodes 1214 is referred to as Lov. Similarly, the width of a portion of the pair of electrodes 1214, which does not overlap with the oxide semiconductor film 1206, is referred to as dW.

The structures and the like described in this embodiment can be combined as appropriate with any of the structures and the like described in the other embodiments.

Embodiment 9

In this embodiment, the case where the semiconductor device described in the above embodiments is applied to electronic devices will be described with reference to FIGS. 16A to 16F. In this embodiment, examples of the electronic device to which the above semiconductor device is applied include a computer, a mobile phone (also referred to as a mobile telephone or a mobile phone device), a personal digital assistant (including a portable game machine, an audio reproducing device, and the like), a camera such as a digital camera or a digital video camera, an electronic paper, and a television device (also referred to as a television or a television receiver).

Figure 16A:
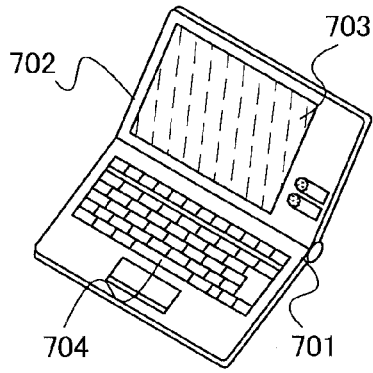
FIGS. 16A to 16F are diagrams illustrating electronic devices each including a semiconductor device.

FIG. 16A illustrates a laptop personal computer, which includes a housing 701, a housing 702, a display portion 703, a keyboard 704, and the like. The semiconductor device described in any of the above embodiments is provided in at least one of the housing 701 and the housing 702. Therefore, a laptop personal computer with sufficiently low power consumption in which writing and reading of data can be performed at high speed can be realized.

Figure 16B:
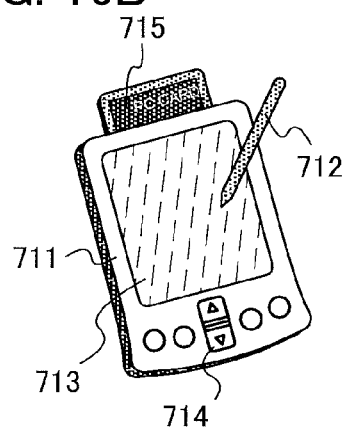

FIG. 16B illustrates a portable information terminal (PDA). A main body 711 is provided with a display portion 713, an external interface 715, operation buttons 714, and the like. Further, a stylus 712 and the like for operation of the portable information terminal are provided. In the main body 711, the semiconductor device described in any of the above embodiments is provided. Therefore, a portable information terminal with sufficiently low power consumption in which writing and reading of data can be performed at high speed can be realized.

Figure 16C:
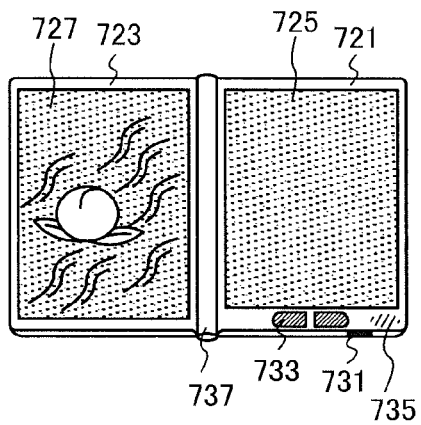

FIG. 16C illustrates an e-book reader incorporating electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. Thus, an e-book reader with sufficiently low power consumption in which writing and reading of data can be performed at high speed can be realized.

Figure 16D:
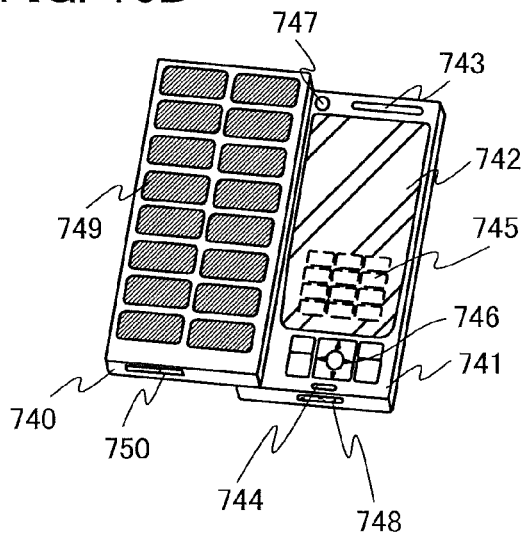

FIG. 16D illustrates a mobile phone set, which includes two housings, a housing 740 and a housing 741. Moreover, the housings 740 and 741 in a state where they are developed as illustrated in FIG. 16D can be slid so that one is lapped over the other. Therefore, the size of the mobile phone set can be reduced, which makes the mobile phone set suitable for being carried around. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone set, an external memory slot 750, and the like. In addition, an antenna is incorporated in the housing 741. At least one of the housings 740 and 741 is provided with the semiconductor device described in any of the above embodiments. Therefore, a mobile phone set in which writing and reading of data are performed at high speed and power consumption is sufficiently reduced can be realized.

Figure 16E:
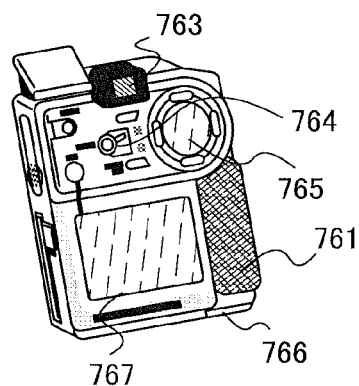

FIG. 16E illustrates a digital camera, which includes a main body 761, a display portion 767, an eyepiece 763, an operation switch 764, a display portion 765, a battery 766, and the like. In the main body 761, the semiconductor device described in any of the above embodiments is provided. Thus, a digital camera with sufficiently low power consumption in which writing and reading of data can be performed at high speed can be realized.

Figure 16F:
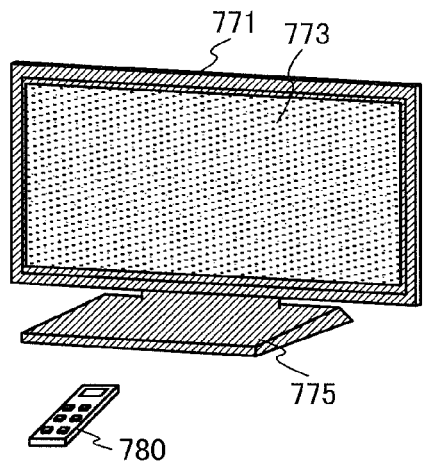

FIG. 16F is a television device including a housing 771, a display portion 773, a stand 775, and the like. Operation of the television set can be performed with a switch of the housing 771 or a remote controller 780. The semiconductor device described in any of the above embodiments is mounted in the housing 771 and the remote controller 780. Thus, it is possible to realize a television device in which data is written and read at high speed and power consumption is sufficiently low.

As described above, the electronic devices described in this embodiment each include the semiconductor device described in any of the above embodiments; thus, electronic devices with low power consumption can be realized.

This application is based on Japanese Patent Application serial no. 2010-177056 filed with Japan Patent Office on Aug. 6, 2010 and Japanese Patent Application serial no. 2011-108574 filed with Japan Patent Office on May 13, 2011, the entire contents of which are hereby incorporated by reference.

What is claimed is:

1. A semiconductor device comprising:
   a first transistor, wherein a gate of the first transistor is electrically connected to a first wiring;
   a second transistor, wherein a gate of the second transistor is electrically connected to a second wiring which is different from the first wiring; and
   a capacitor;
   wherein one of the first transistor and the second transistor comprises oxide semiconductor,
   wherein the first transistor, the second transistor, and the capacitor are electrically connected in series, and
   wherein the oxide semiconductor comprises indium and zinc.

2. The semiconductor device according to claim 1, wherein the one of the first transistor and the second transistor comprises a channel formation region in an oxide semiconductor layer.

3. The semiconductor device according to claim 2, the oxide semiconductor layer is provided over the gate of the second transistor.

4. The semiconductor device according to claim 2, wherein the gate of the second transistor is provided over the oxide semiconductor layer.

5. The semiconductor device according to claim 2, wherein a source and a drain of the second transistor are in contact with an upper surface of the oxide semiconductor layer.

6. The semiconductor device according to claim 2, wherein a source and a drain of the second transistor are in contact with a lower surface of the oxide semiconductor layer.

7. The semiconductor device according to claim 1, wherein the other of the first transistor and the second transistor comprises a channel formation region in a semiconductor substrate.

8. The semiconductor device according to claim 1, further comprising an insulating layer provided over the other of the first transistor and the second transistor, wherein the capacitor and the one of the first transistor and the second transistor are provided over the insulating layer.

9. The semiconductor device according to claim 1, wherein the other of the first transistor and the second transistor has higher switching speed than the one of the first transistor and the second transistor.

10. The semiconductor device according to claim 1, wherein one of a source and a drain of the first transistor is electrically connected one of a source and a drain of the second transistor.

11. An electronic device comprising the semiconductor device according to claim 1, wherein the electronic device is one selected from the group consisting of a computer, a mobile phone, a personal digital assistant, a camera, an electronic paper, and a television device.

12. A semiconductor device comprising:
a plurality of memory cells, each of the plurality of memory cells comprising:
a first transistor, wherein a gate of the first transistor is electrically connected to one of a plurality of first word lines;
a second transistor, wherein a gate of the second transistor is electrically connected to one of a plurality of second word lines which is different from the plurality of first word lines; and
a capacitor;
wherein one of the first transistor and the second transistor comprises oxide semiconductor,
wherein the first transistor and the second transistor are electrically connected in series between the capacitor and one of a plurality of bit lines, and
wherein the oxide semiconductor comprises indium and zinc.

13. The semiconductor device according to claim 12, wherein the one of the first transistor and the second transistor comprises a channel formation region in an oxide semiconductor layer.

14. The semiconductor device according to claim 13, the oxide semiconductor layer is provided over the gate of the second transistor.

15. The semiconductor device according to claim 13, wherein the gate of the second transistor is provided over the oxide semiconductor layer.

16. The semiconductor device according to claim 13, wherein a source and a drain of the second transistor are in contact with an upper surface of the oxide semiconductor layer.

17. The semiconductor device according to claim 13, wherein a source and a drain of the second transistor are in contact with a lower surface of the oxide semiconductor layer.

18. The semiconductor device according to claim 12, wherein the other of the first transistor and the second transistor comprises a channel formation region in a semiconductor substrate.

19. The semiconductor device according to claim 12, further comprising an insulating layer provided over the other of the first transistor and the second transistor, wherein the capacitor and the one of the first transistor and the second transistor are provided over the insulating layer.

20. The semiconductor device according to claim 12, wherein the other of the first transistor and the second transistor has higher switching speed than the one of the first transistor and the second transistor.

21. The semiconductor device according to claim 12, wherein one of a source and a drain of the first transistor is electrically connected one of a source and a drain of the second transistor.

22. An electronic device comprising the semiconductor device according to claim 12, wherein the electronic device is one selected from the group consisting of a computer, a mobile phone, a personal digital assistant, a camera, an electronic paper, and a television device.

23. A method for driving a semiconductor device, the semiconductor device comprising:
a first transistor, wherein a gate of the first transistor is electrically connected to a first wiring;
a second transistor, wherein a gate of the second transistor is electrically connected to a second wiring; and
a capacitor;
wherein one of the first transistor the second transistor comprises oxide semiconductor,
wherein the first transistor, the second transistor, and the capacitor are electrically connected in series, and
wherein the oxide semiconductor comprises indium and zinc,
the method comprising the steps of:
in a first mode, turning off the other of the first transistor and the second transistor to store a charge in the capacitor, and
in a second mode, turning off both of the first transistor and the second transistor to store a charge in the capacitor.

24. The method for driving a semiconductor device according to claim 23, wherein, in the first mode, the one of the first transistor and the second transistor is on when the other of the first transistor and the second transistor is off.

25. A method for driving a semiconductor device, the semiconductor device comprising:
a plurality of memory cells, each of the plurality of memory cells comprising:
a first transistor, wherein a gate of the first transistor is electrically connected to one of a plurality of first word lines;
a second transistor, wherein a gate of the second transistor is electrically connected to one of a plurality of second word lines which is different from the plurality of first word lines; and
a capacitor;
wherein one of the first transistor and the second transistor comprises oxide semiconductor,
wherein the first transistor and the second transistor are electrically connected in series between the capacitor and one of a plurality of bit lines, and
wherein the oxide semiconductor comprises indium and zinc,
the method comprising the steps of:
in a first mode, turning on the one of the first transistor and the second transistor in each of the plurality of memory cells and the other of the first transistor and the second transistor in one of the plurality of memory cells to accumulate a charge in or release a charge from the capacitor in one of the plurality of memory cells in which both of the first transistor and the second transistor are on; and in a second mode, turning on the first transistor and the second transistor in one of the plurality of memory cells to accumulate a charge in or release a charge from the capacitor in one of the plurality of memory cells in which both of the first transistor and the second transistor are on.

\* \* \* \* \*

UNITED STATES PATENT AND TRADEMARK OFFICE
CERTIFICATE OF CORRECTION

PATENT NO.       : 8,531,870 B2
APPLICATION NO.  : 13/192819
DATED            : September 10, 2013
INVENTOR(S)      : Jun Koyama It is certified that error appears in the above-identified patent and that said Letters Patent is hereby corrected as shown below:

In the Specification

Column 19, line 28, replace "foamed" with --formed--;

Column 24, line 19, replace "$(x_2, y_2)$" with --$(x_1, y_2)$--;

Column 28, line 39, after "or" delete ",";

Column 28, line 41, after "50" replace "mm" with --nm--;

Column 34, line 58, replace "Ruined" with --formed--;

Column 34, line 63, replace "foamed" with --formed--;

Column 37, line 39, before "atoms" replace "0" with --O--;

Column 47, line 41, replace "μm" with --aA/μm--.

Signed and Sealed this
Eleventh Day of March, 2014

Michelle K. Lee
*Deputy Director of the United States Patent and Trademark Office*